United States Patent
Bramanti et al.

(10) Patent No.: US 11,355,624 B2
(45) Date of Patent: Jun. 7, 2022

(54) ELECTRICALLY CONFINED BALLISTIC DEVICES AND METHODS

(71) Applicant: STMicroelectronics S.r.l., Agrate Brianza (IT)

(72) Inventors: Alessandro Paolo Bramanti, Maglie (IT); Alberto Pagani, Nova Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 370 days.

(21) Appl. No.: 16/376,482

(22) Filed: Apr. 5, 2019

(65) Prior Publication Data

US 2020/0321457 A1    Oct. 8, 2020

(51) Int. Cl.
*H01L 29/778*    (2006.01)
*H01L 29/417*    (2006.01)
*G01R 31/26*    (2020.01)

(52) U.S. Cl.
CPC ........ *H01L 29/778* (2013.01); *G01R 31/2621* (2013.01); *H01L 29/41725* (2013.01)

(58) Field of Classification Search
CPC ............. H01L 29/778; H01L 29/41725; H01L 29/7606; H01L 29/86; H01L 29/423; H01L 29/2003; H01L 29/205; H01L 29/861; G01R 31/2621
See application file for complete search history.

(56) References Cited

U.S. PATENT DOCUMENTS

| | | | |
|---|---|---|---|
| 5,485,018 A * | 1/1996 | Ogawa | B82Y 10/00 257/14 |
| 7,984,200 B1 * | 7/2011 | Bombet | G06F 3/0607 710/8 |
| 8,803,340 B2 | 8/2014 | Moddel | |
| 2008/0105902 A1 | 5/2008 | Twynam | |
| 2018/0143311 A1 * | 5/2018 | Melamed | G01B 15/04 |

(Continued)

FOREIGN PATENT DOCUMENTS

CN    103872145 A    6/2014

OTHER PUBLICATIONS

Fukai et al., "Reflection and refraction of ballistic electrons through different carrier concentration regions," *Appl. Phys. Lett.* 60(1):105-108, Jan. 1992.

(Continued)

*Primary Examiner* — Alvaro E Fortich
*Assistant Examiner* — Zannatul Ferdous
(74) *Attorney, Agent, or Firm* — Seed Intellectual Property Law Group LLP

(57) ABSTRACT

Embodiments are directed to electrically confined ballistic devices, circuits, and networks. One such device includes a heterostructure that has a first semiconductor layer, a second semiconductor layer, and a two-dimensional electrode gas (2DEG) layer between the first and second semiconductor layers. The device further includes an input electrode electrically coupled to the 2DEG layer and an output electrode electrically coupled to the 2DEG layer. A first confinement electrode is positioned on the heterostructure. The first confinement electrode, in use, generates first space charge regions which at least partially define a boundary of the ballistic device within the 2DEG layer between the input electrode and the output electrode in response to a first voltage.

21 Claims, 23 Drawing Sheets

(56) References Cited

U.S. PATENT DOCUMENTS

| | | | |
|---|---|---|---|
| 2019/0018268 A1* | 1/2019 | Lee | H01L 29/41733 |
| 2019/0312110 A1* | 10/2019 | Costa | H01L 24/17 |
| 2020/0220030 A1* | 7/2020 | Gossner | H01L 29/0649 |
| 2020/0321456 A1* | 10/2020 | Bramanti | H01L 29/2003 |
| 2021/0233740 A1* | 7/2021 | Shouji | H01J 37/16 |

OTHER PUBLICATIONS

Schäpers et al., "Reflection and Transmission of Ballistic Electrons at a Potential Barrier," *Superlattices and Microstructures* 14(1):57-63, 1993.

* cited by examiner

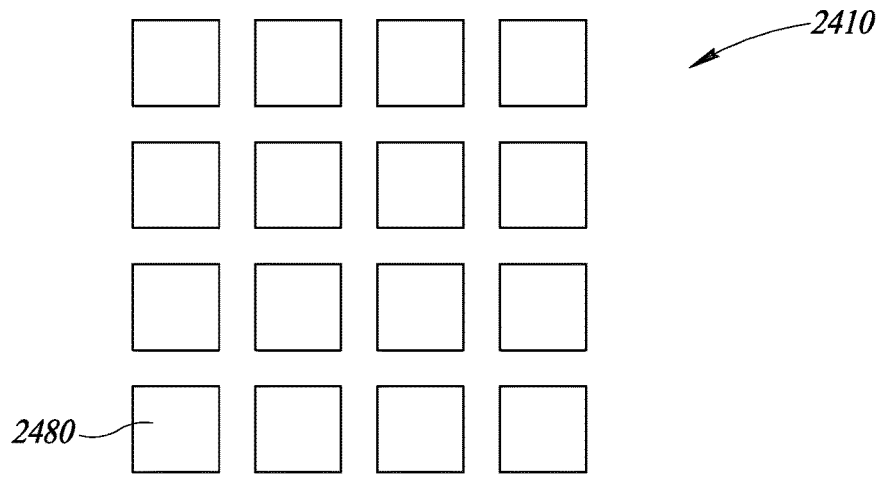
FIG. 24A
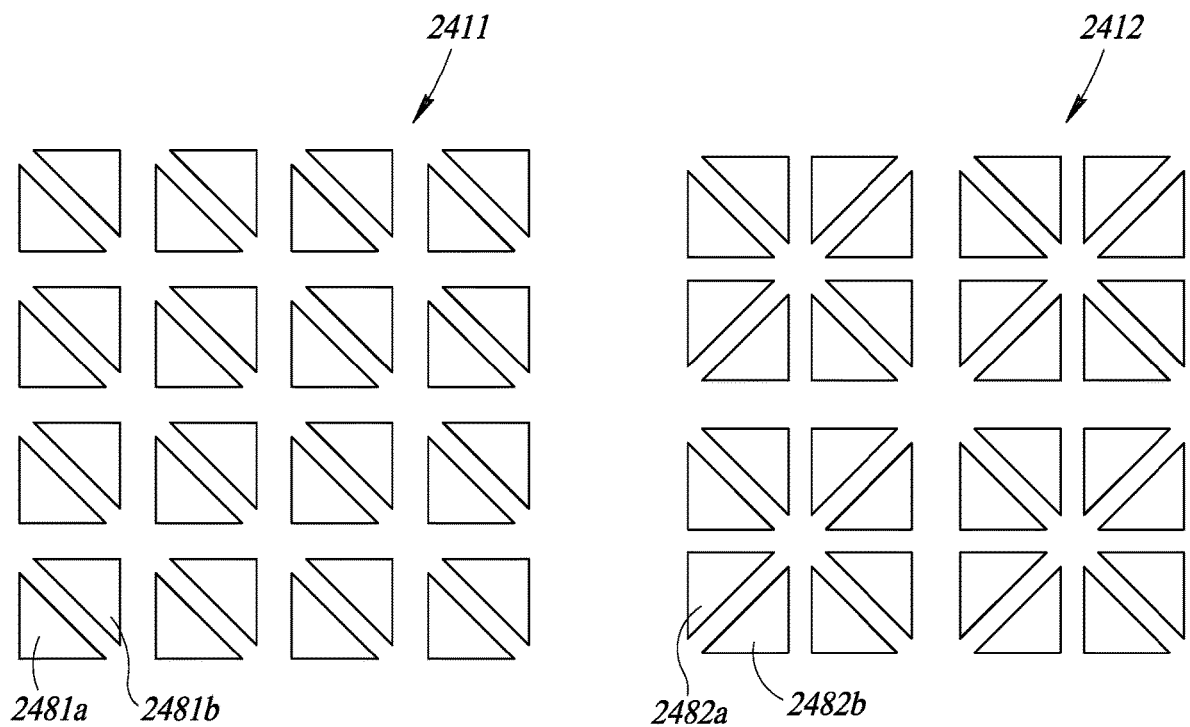
FIG. 24B
FIG. 24C

ELECTRICALLY CONFINED BALLISTIC DEVICES AND METHODS

BACKGROUND

Technical Field

The present disclosure generally relates to electronic ballistic devices, and more specifically to such ballistic devices to define a boundary within a two-dimensional electrode gas (2 DEG) layer.

Description of the Related Art

In non-ballistic conductors, such as a solid metal or a crystal, electrons typically travel through the conductor (e.g., due to an applied electric field) along paths that appear random. The electrons typically undergo a number of scattering events in non-ballistic conductors, which may be caused, for example, by collisions with impurities, defects and/or atoms within the conductor. Moreover, the electrons may have a small non-zero net movement when an electric field is present, in a direction that may be aligned with a direction of the electric field. Numerous scattering events occur even in good conductors, such as gold. Due to scattering events, rethermalization may occur, little momentum is gained by the electrons, and the electrons have a short mean free path. For example, in gold, the electrons generally have a mean free path of about 30 nm to 60 nm. The mean free path is an average distance traveled by an electron between subsequent scattering events or collisions. Electron transport in non-ballistic conductors is typically described by the Drude model of electrical conduction.

In contrast to non-ballistic conductors, ballistic conductors utilize ballistic conduction to transport charge carriers (e.g., electrons or holes) in a medium having negligible electrical resistivity due to scattering events. In ballistic conductors, the mean free path of the electrons is significantly longer than in non-ballistic conductors. For example, the mean free path of electrons in a ballistic conductor may be hundreds of nanometers at ambient temperature. Since the electrons undergo significantly reduced scattering events, the electrons behave as classical, or Newtonian particles. As such, the electrons in a ballistic conductor may be highly accelerated and typically travel along a given path unless and until they encounter a barrier, such as boundaries of the conductor.

BRIEF SUMMARY

The present disclosure is generally directed to electronic ballistic devices in which one or more confinement electrodes are used to define ballistic boundaries of the ballistic devices in an underlying two-dimensional electron gas (2 DEG) layer. In response to applying a voltage to the confinement electrodes, the confinement electrodes generate space charge regions which interrupt the underlying 2 DEG layer, thereby forming boundaries and defining a conduction channel for the device in the 2 DEG layer.

Electronic ballistic devices generally utilize ballistic conduction to transport charge carriers through a ballistic or quasi-ballistic conductor, such as a 2 DEG layer. For example, ballistic deflection transistors may utilize a 2 DEG layer as the ballistic conducting medium for a current between an input and an output, while a control or deflection electrode can generate an electric field (e.g., upon application of voltage to the deflection electrode) which causes a deflection of the electrons away from the output such that the current from input to output can be selectively controlled or turned on and off.

In some ballistic devices, the boundary of the conduction channel in the device is a physical boundary. The shape of the boundary is a key element of ballistic devices, as electrons tend to bounce off of the boundary at symmetric angles, which can be exploited to control or otherwise influence a desired current or signal through the device. However, forming such a physical boundary for a ballistic device utilizing a 2 DEG layer as the ballistic conduction channel involves several process steps to define the shape of the ballistic device. For example, the boundary may be formed by etching and eventually filling a trench to define the device boundary, or by doping the substrate to a depth that reaches or extends through the 2 DEG layer to form a PN junction thereby defining a boundary for the device.

In various embodiments, the present disclosure provides electrically ballistic devices which may have selectively defined boundaries within the 2 DEG layer. The boundaries may be defined electrically, by electrodes overlying the 2 DEG layer which may selectively generate space charge regions which interrupt the 2 DEG layer and confine electrons within defined boundaries of the conduction channel. Accordingly, the boundaries may be defined without digging trenches, doping, or otherwise forming physical boundaries of the 2 DEG layer.

Electrically confined ballistic devices provided in various embodiments of the present disclosure may be utilized in a variety of applications, including, for example, low-power circuits which have low thresholds, power circuits and power management applications (ballistic devices may be able to carry relatively high currents at low voltages), and high-frequency circuits featuring frequencies potentially up to (e.g., tens of) THz and which can be coupled to photonic circuits and/or systems.

In one or more embodiments, the present disclosure provides an electrically confined ballistic device that includes a heterostructure. The heterostructure includes a first semiconductor layer, a second semiconductor layer, and a two-dimensional electrode gas (2 DEG) layer between the first and second semiconductor layers. The device further includes an input electrode electrically coupled to the 2 DEG layer and an output electrode electrically coupled to the 2 DEG layer. A first confinement electrode is positioned on the heterostructure. The first confinement electrode, in use, generates first space charge regions which at least partially define a boundary of the ballistic device within the 2 DEG layer between the input electrode and the output electrode in response to a first voltage.

In one or more embodiments, the present disclosure provides a device that includes a heterostructure, a ballistic device on the heterostructure, and a confinement voltage supply circuit. The heterostructure includes a first semiconductor layer, a second semiconductor layer on the first semiconductor layer, and a two-dimensional electrode gas (2 DEG) layer between the first and second semiconductor layers. The ballistic device includes an input electrode electrically coupled to the 2 DEG layer, an output electrode electrically coupled to the 2 DEG layer, and a confinement electrode on the heterostructure. The confinement electrode, in use, generates space charge regions which at least partially define a boundary of the ballistic device within the 2 DEG layer between the input electrode and the output electrode in response to a confinement voltage. The confinement voltage supply circuit is electrically coupled to the confinement electrode, and the confinement voltage supply circuit, in use, generates the confinement voltage.

In one or more embodiments, the present disclosure provides an integrated circuit that includes a ballistic chip. The ballistic chip includes a heterostructure and an electrode layer on the heterostructure. The heterostructure has a first semiconductor layer, a second semiconductor layer on the first semiconductor layer, and a two-dimensional electrode gas (2 DEG) layer between the first and second semiconductor layers. The electrode layer includes a plurality of confinement electrodes configured to define ballistic boundaries within the 2 DEG layer for a plurality of ballistic devices in response to application of a confinement voltage.

In one or more embodiments, the present disclosure provides an electrically confined ballistic device that includes a heterostructure. The heterostructure includes a first semiconductor layer, a second semiconductor layer, and a two-dimensional electrode gas (2 DEG) layer between the first and second semiconductor layers. The device further includes an input electrode electrically coupled to the 2 DEG layer and an output electrode electrically coupled to the 2 DEG layer. The input and output electrodes are spaced apart from one another along a first direction. At least one confinement electrode is disposed on the heterostructure. The at least one confinement electrode, in use, generates first space charge regions which at least partially define a boundary of the ballistic device in a conduction channel within the 2 DEG layer between the input electrode and the output electrode in response to a first voltage. First and second control electrodes extend into the heterostructure from a surface of the heterostructure, and at least portions of the first and second control electrodes are inclined with respect to the surface of the heterostructure. The first and second control electrodes are spaced apart from one another along a second direction that is transverse to the first direction.

BRIEF DESCRIPTION OF THE SEVERAL VIEWS OF THE DRAWINGS

In the drawings, identical reference numbers identify similar elements or acts unless the context indicates otherwise. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

FIGS. 24A through 24C are top plan views illustrating various different arrays of confinement electrodes, in accordance with one or more embodiments of the present disclosure.

DETAILED DESCRIPTION

Figure 1A:
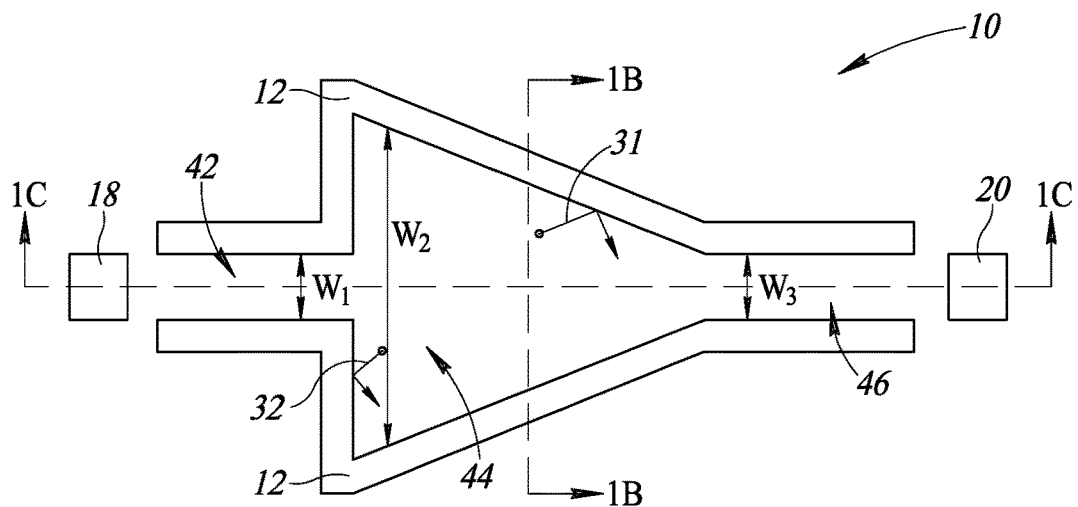
FIG. 1A is a top plan view illustrating an electrically confined ballistic device, in accordance with one or more embodiments of the present disclosure.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with electronic ballistic devices, heterostructures including 2 DEG layers, or the like, have not been shown or described in detail to avoid unnecessarily obscuring descriptions of the various embodiments provided herein.

Unless the context requires otherwise, throughout the specification and claims that follow, the word "comprise" and variations thereof, such as "comprises" and "comprising" are to be construed in an open, inclusive sense, that is, as "including, but not limited to." Further, the terms "first," "second," and similar indicators of sequence are to be construed as being interchangeable unless the context clearly dictates otherwise.

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments of the present disclosure.

As used in this specification and the appended claims, the singular forms "a," "an," and "the" include plural referents unless the content clearly dictates otherwise. It should also be noted that the term "or" is generally employed in its broadest sense, that is, as meaning "and/or" unless the content clearly dictates otherwise.

The headings and Abstract of the Disclosure provided herein are for convenience only and do not interpret the scope or meaning of the embodiments.

Throughout the specification, the term "layer" is used in its broadest sense to include a thin film, a cap, or the like. The term "compound semiconductor" generally includes any semiconductor compound that includes chemical elements of at least two different species, and has one or more materials outside column IV of the periodic table of the elements (e.g., else than carbon, silicon, germanium, etc.). The term "high-frequency" in the context of operating wireless communication devices, is meant in a relative sense, and is not limited to a designated frequency range (e.g., a particular "HF band" within the range of 3-30 MHz).

Reference throughout the specification to conventional deposition techniques for depositing metals, polysilicon, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electro-plating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film or layer in-situ.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask, which, in turn, can be used to pattern an underlying film.

Reference throughout the specification to conventional etching techniques known in the art of semiconductor fabrication for selective removal of polysilicon, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable.

Specific embodiments are described herein with reference to examples of electronic ballistic devices; however, the present disclosure and the reference to certain materials, dimensions, and the details and ordering of processing steps are exemplary and embodiments of the present disclosure are not limited to those shown.

Figure 1B:
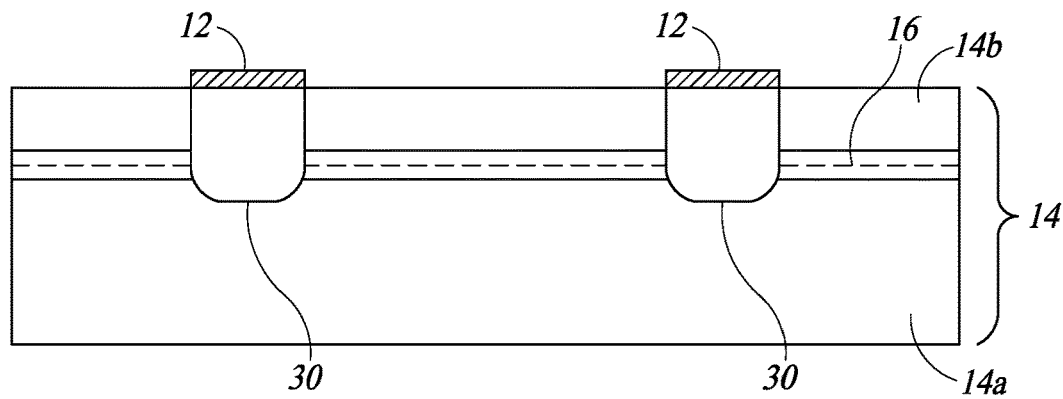
FIG. 1B is a cross-sectional view taken along a cut-line 1B-1B of the ballistic device shown in FIG. 1A, in accordance with one or more embodiments of the present disclosure.
Figure 1C:
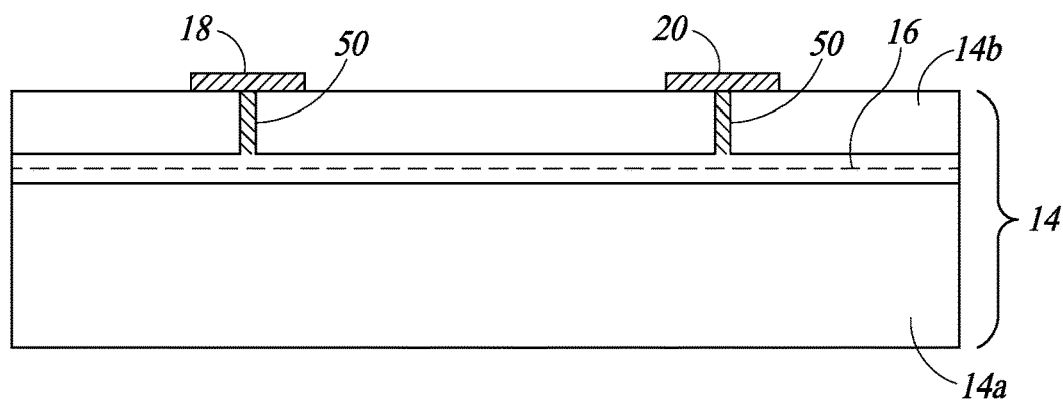
FIG. 1C is a cross-sectional view of the ballistic device along a cut-line 1C-1C of the ballistic device shown in FIG. 1A, in accordance with one or more embodiments of the present disclosure.

FIG. 1A is a top plan view illustrating an electrically confined ballistic device 10, FIG. 1B is a cross-sectional view of the ballistic device 10 along a cut-line 1B-1B, and FIG. 1C is a cross-sectional view of the ballistic device 10 along a cut-line 1C-1C, in accordance with one or more embodiments of the present disclosure.

The ballistic device 10 includes a heterostructure 14, confinement electrodes 12, an input electrode 18, and an output electrode 20.

The heterostructure 14 may be a stack of materials which forms a uniform two-dimensional electron gas (2 DEG) layer 16 therein. A two-layered heterostructure 14 including two different semiconductor materials, a first layer 14a and a second layer 14b, is shown and described herein; however, embodiments of the present disclosure are not limited thereto. In various embodiments, the ballistic devices provided herein may include heterostructures having more than two layers, including, for example, structures wherein each of the first layer 14a and the second layer 14b may include one or more semiconductors.

Formation of the 2 DEG layer 16 at the heterojunction between the first and second layers 14a, 14b is related to energy levels within the heterostructure 14. In some embodiments, the semiconductor material in the second layer 14b of the heterostructure 14 is a doped semiconductor material having a wide energy band gap. For example, the second layer 14b may be or include a layer of a negatively-doped semiconductor, e.g., aluminum gallium arsenide (AlGaAs) or aluminum gallium nitride (AlGaN).

The semiconductor material in the first layer 14a of the heterostructure 14 may be an un-doped or intrinsic semiconductor material having a narrow energy band gap. In some embodiments, the first layer 14a may be or include a layer of an intrinsic semiconductor, e.g., undoped gallium arsenide (GaAs) or gallium nitride (GaN).

The term "band gap" refers to the difference between the energy of conduction band electrons (free electrons) and the energy of valence band electrons (atomically bound electrons), i.e., the amount of energy needed to liberate valence electrons from atoms in the semiconductor crystal. Because the band gaps differ between the first and second layers 14a, 14b of the heterostructure 14, the conduction band energies of the materials do not coincide. Thus, when two such layers of semiconductor materials are placed in contact with one another, their energy levels are discontinuous at the boundary or heterojunction. Such a discontinuity gives rise to a deep and narrow potential well at the heterojunction which traps unbound donor electrons from the n-doped material (e.g., the second layer 14b) at the surface of the un-doped material (e.g., the first layer 14a), resulting in a peak electron concentration at the heterojunction. Such trapped donor electrons are sometimes referred to as a two-dimensional electron gas (2 DEG). The location of the 2 DEG layer 16 thus defines the conduction channel of the ballistic device 10.

The electrons that may be confined at the interface (e.g., within the two-dimensional electron gas) may thus exhibit lower interactions with the lattice of the semiconductor, which results in a decreased number of scattering events and longer mean free paths. The electrons in the 2 DEG layer 16 may therefore exhibit a Newtonian-like (i.e., ballistic) behavior.

In embodiments in which the heterostructure 14 includes GaAs and AlGaAs as the first and second layers 14a, 14b, respectively, a charge concentration ($N_S$) of the 2 DEG layer 16 may be about $8.6*10^{11}$ cm$^{-2}$, and an electron mobility ($\mu$) may be about 7950 cm$^2$/V*s. In embodiments in which the heterostructure 14 includes GaAs and AlGaAs as the first and second layers 14a, 14b, respectively, the charge concentration of the 2 DEG layer 16 may be about $10^{13}$ cm$^{-2}$, and the electron mobility may be about 900 cm$^2$/V*s.

In various embodiments, the heterostructure 14 may be formed on a substrate, which may be any semiconductor substrate, and may include, for example, silicon (Si), silicon carbide (SiC), aluminum oxide ($Al_2O_3$) or any other suitable substrate.

In operation, the 2 DEG layer 16 acts as the conduction channel for transporting a current or signal between the input electrode 18 and the output electrode 20. The confinement electrodes 12 are operable to selectively define a boundary of the conduction channel within the 2 DEG layer 16. More particularly, as shown in FIG. 1B, in response to an applied voltage, the confinement electrodes 12 generate space charge regions 30 which define the boundaries of the ballistic device 10 within the 2 DEG layer 16 between the input electrode 18 and the output electrode 20.

The space charge regions 30 are generated below the confinement electrodes 12 and may extend through the 2 DEG layer 16, thereby interrupting or pinching off the 2 DEG layer 16. The space charge regions 30 generally follow the layout or shape of the confinement electrodes 12, so that the boundary of the ballistic device 10 within the 2 DEG layer 16 has a shape that corresponds with that of the confinement electrodes 12 on the heterostructure 14. The ballistic device 10 may operate within the boundaries set by the confinement electrodes 12, e.g., with current flowing between the input and output electrodes 18, 20 through the electrical connections 50, which may be for example a via or a doped well or region.

The ballistic device 10 shown in FIGS. 1A to 1C operates to permit a flow of current in one direction, and to limit or prevent current flow in the opposite direction. That is, the ballistic device 10 may be or otherwise operate as a diode. The diode configuration of the ballistic device 10 is achieved through the geometry or shape of the confinement electrodes 12 on the heterostructure 14, and the corresponding geometry or shape of the space charge regions 30 formed in response to an applied voltage. For example, the confinement electrodes 12 may include electrodes which are symmetrical about an axis (e.g., the horizontal axis, as shown in FIG. 1A). The confinement electrodes 12 define an input region 42, an intermediate region 44, and an output region 46. The input region 42 extends between the input electrode 18 and the intermediate region 44, and the output region 46 extends between the intermediate region 44 and the output electrode 20.

The input region 42 may have a first width $W_1$ (e.g., between the two symmetrical electrodes 12) and the output region 46 may have a third width $W_3$. The confinement electrodes 12 extend laterally outward (e.g., at right angles) at the interface between the input region 42 and the intermediate region 44, so that the intermediate region 44 has a second width $W_2$ adjacent to the input region 42, and the second width $W_2$ of the intermediate region 44 is greater than the first width $W_1$ of the input region 42 and third width $W_3$ of the output region 46. The width of the intermediate region 44 may gradually decrease between the input region 42 and the output region 46.

During use, the ballistic device 10 permits a signal or current to pass through the 2 DEG layer from the input electrode 18 to the output electrode 20. In particular, the signal or current may flow through the input region 42, into the expanded area provided by the intermediate region 44, and the intermediate region 44 effectively funnels the flow of electrons into the output region 46 and to the output electrode 20. More particularly, when electrons encounter the boundary of the 2 DEG layer 16 formed by the space charge regions 30 underlying the confinement electrodes 12, the electrons reflect or bounce off of the boundary at symmetrical angles. Since the boundaries provided by the intermediate region are inclined or angled toward the outlet region 46, electrons which travel in a direction between the input and output electrodes 18, 20 (e.g., from left to right as shown in FIG. 1A) reflect off of the inclined boundary toward the outlet region 46, as shown at 31.

In contrast, the ballistic device 10 prevents or limits a flow of current in the reverse direction, i.e., from the output electrode 20 to the input electrode 18. This is due to the portions of the confinement electrodes 12 which extend laterally outward (e.g., at right angles) at the interface between the input region 42 and the intermediate region 44. For example, as shown at 32, electrons which encounter the boundary at the interface between the input region 42 and the intermediate region 44 are reflected in an opposite direction (e.g., generally toward the outlet region 46), thereby preventing or limiting a flow of current into the input region 42.

The ballistic diode described works then similarly to those already known, except that the boundaries are electrically defined through the electrodes 12. Thus, the flow of electrons between the input and output electrodes 18 and 20 is better rectified if a sufficient voltage is applied to the electrodes 12.

While the example ballistic device 10 shown and described with respect to FIGS. 1A to 1C has a diode configuration, embodiments provided herein are not limited thereto. The confinement electrodes 12 may have any geometries, shapes, sizes, or the like, and may therefore provide corresponding electrical confinement boundaries in the underlying 2 DEG layer 16 of any geometries, shapes, sizes, or the like to form a wide variety of ballistic devices.

FIG. 1C illustrates further details of the input electrode 18 and the output electrode 20, in accordance with one or more embodiments. The input and output electrodes 18, 20 are electrically coupled to the 2 DEG layer 16 such that a signal or current may be transported between the input and output electrodes 18, 20 through the 2 DEG layer 16. The input and output electrodes 18, 20 may be electrically coupled to the 2 DEG layer 16 by any suitable technique or structure. In the example shown in FIG. 1C, the input and output electrodes 18, 20 are electrically coupled to the 2 DEG layer 16 by electrical connections 50 which directly contact the 2 DEG layer 16. The electrical connections 50 may be formed like vias, for example, by etching through the second layer 14b of the heterostructure 14 and filling the resulting cavities with a conductive material, eventually laterally isolated, for example using a dielectric material like an oxide. In other embodiments, ohmic contacts may provide electrical coupling between the input and output electrodes 18, 20 and the 2 DEG layer 16. For example, ohmic contacts may be formed by heavily doping regions of the second semiconductor layer 14b between the input electrode 18 and the 2 DEG layer 16 and between the output electrode 20 and the 2 DEG layer 16. The various electrodes provided in various embodiments herein, including, for example, the confinement electrodes 12, the input and output electrodes 18, 20, as well as any other electrodes described herein, may be formed of any suitable conductive material such as a metal material.

The depth at which the space charge regions 30 extend beneath the confinement electrodes 12 may depend on a magnitude of the voltage that is applied to the confinement electrodes 12. The voltage applied to the confinement electrodes 12 should therefore be sufficient to generate the space charge regions 30 with a depth which extends completely through the 2 DEG layer 16.

Moreover, the voltage applied to the confinement electrodes 12 should be suitable to ensure that electrons are reflected off of the boundary provided the generated space charge regions 30. The voltage level which generates a boundary that totally reflects incident electrons depends on a variety of factors, and may be determined or estimated depending on the various factors which may be dependent upon the particular design of a ballistic device (e.g., the semiconductor materials used, thicknesses of layers, etc.). As an example, the following calculations are provided for estimating a voltage to be applied to the confinement electrodes 12 in order to ensure ballistic reflection of electrons off of the space charges regions 30 extending through the 2 DEG layer 16.

When an electron having energy (E) encounters a potential barrier having energy ($eV_0$), the electron may cross the barrier and its kinetic energy is reduced to $E-eV_0$. By applying a voltage to the confinement electrodes 12 such that the subtracted energy ($eV_0$) is equal to the maximum kinetic energy of electrons (E) in the 2 DEG layer 16, then all electrons will ballistically reflect off of the barrier (i.e., the space charge regions 30). For example, for a heterostructure 14 having a AlGaAs/GaAs structure, the charge density in the 2 DEG layer 16 is about $8.6*10^{11}$ cm$^{-2}$. The maximum thermal kinetic energy of an electron is 0.31 meV. The drift kinetic energy (e.g., acquired under the field action) can be significantly larger. For instance, with a mean free path as long as $\lambda=400$ nm, acceleration in a uniform field as large as $E_0=1$ MV/m (as in a 1 μm-long device under a 1 V lateral voltage) can be such that the final velocity is $v=\sqrt{(2*a*l)}$, yielding kinetic energy E around 0.4 eV (note: the acceleration is $a=q*E_0/m$, with $m=0.067\ m_0$ effective mass of the electron in a typical 2 DEG).

Through simulations, the inventors have discovered that a voltage having a magnitude as large as 3 V (e.g., applied to the confinement electrodes 12) is enough to produce a 2.2 eV barrier (e.g., a barrier of the space charge regions 30). However, the barrier can be as low as 0.4 eV (i.e., the maximum kinetic energy E) to cause ballistic reflection of the electrons in the 2 DEG layer 16, which may be produced by applying a voltage having a magnitude of about 0.6 V to the confinement electrodes 12.

In some embodiments, the voltage applied to the confinement electrodes may be within a range of 0.5 V to 3 V, inclusive, which may be suitable to guarantee ballistic reflection of electrons in the 2 DEG layer 16. The applied voltage may be a positive or a negative voltage, depending, for example, on a particular design of the ballistic devices. Moreover, it should be noted that at the calculated voltage, the confinement electrodes 12 may be extremely narrow (e.g., nearly 1 dimensional) and may result in total ballistic reflection of electrons in the 2 DEG layer 16 upon encountering the underlying space charge regions 30. However, by increasing the width of the confinement electrodes 12, total ballistic reflection may be achieved by applying lower magnitude voltages, since the wider confinement electrodes 12 will generate a wider barrier (e.g., the space charge regions 30), which is more difficult to cross by tunneling of electrons. In embodiments where the confinement electrodes 12 have a relatively large width, thereby producing a wider barrier or space charge region, total reflection may occur at different points within the barrier depending on the initial kinetic energy of the electrons. Such a barrier may be geometrically "gray" or "fuzzy" as it does not behave as a barrier having a straight line. Such properties may be exploited in various embodiments provided herein.

It will be readily appreciated that in various embodiments, the ballistic device 10 may have various different sizes, dimensions, or geometries. For example, the thickness of the heterostructure 14, including thicknesses of the first and second layers 14a, 14b, as well as a thickness of the 2 DEG layer 16, may vary depending, for example, on a particular design or application of the ballistic device 10. Accordingly, the magnitude of the voltage applied to the confinement electrodes 12 which is sufficient to interrupt the 2 DEG layer 16 and to cause total ballistic reflection of electrons upon encountering the space charge regions 30 may vary in various embodiments.

In various embodiments, the voltage applied to the confinement electrodes 12 may be provided by a voltage source which has a first input coupled to the confinement electrodes 12, and a second input coupled to a reference electrode. This will be described in further detail with respect to FIGS. 2 and 3.

In other embodiments, not shown here, doped regions may be created below confinement electrodes 12, as well known by a technician skilled in the art. These doped regions will not modify the characteristics of the 2 DEG layer 16 but they may reduce the magnitude of the voltage applied to the confinement electrodes 12 to interrupt the 2 DEG layer 16.

Figure 2A:
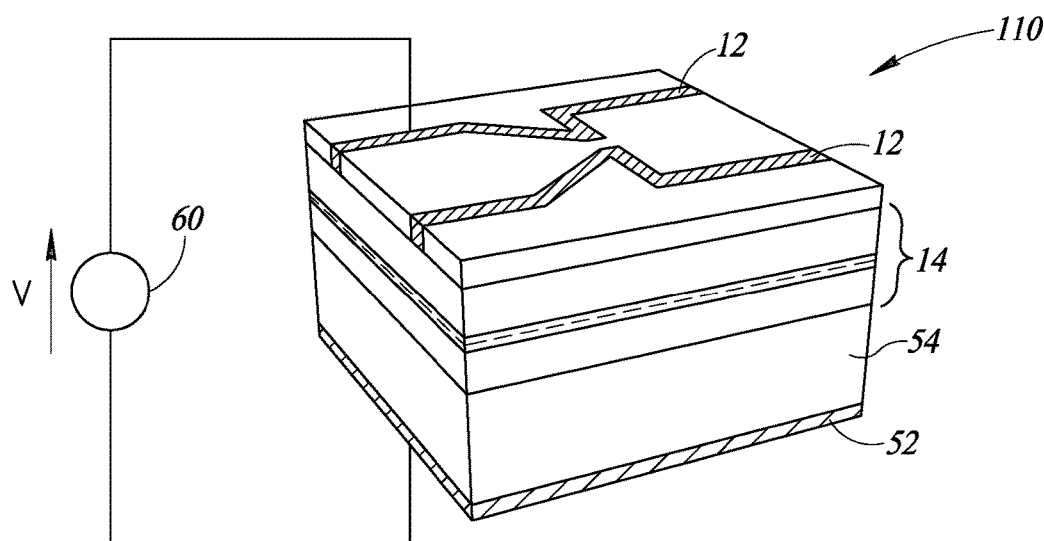
FIG. 2A is a perspective view illustrating a ballistic device, in accordance with one or more embodiments of the present disclosure.
Figure 2B:
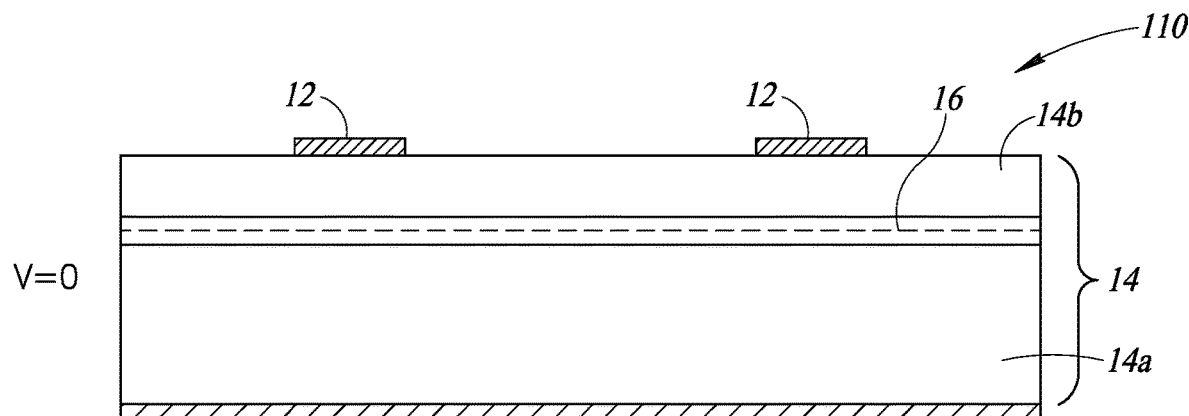
FIG. 2B is a cross-sectional view showing operation of the ballistic device shown in FIG. 2A when an applied voltage V is 0V.

FIG. 2A is a perspective view illustrating a ballistic device 110, in accordance with one or more embodiments of the present disclosure. FIG. 2B is a cross-sectional view showing operation of the ballistic device 110 when an applied voltage V is 0V, and FIG. 2C is a cross-sectional view showing operation of the ballistic device 110 when the applied voltage V is not equal to 0V, such as greater than 0V.

Figure 2C:
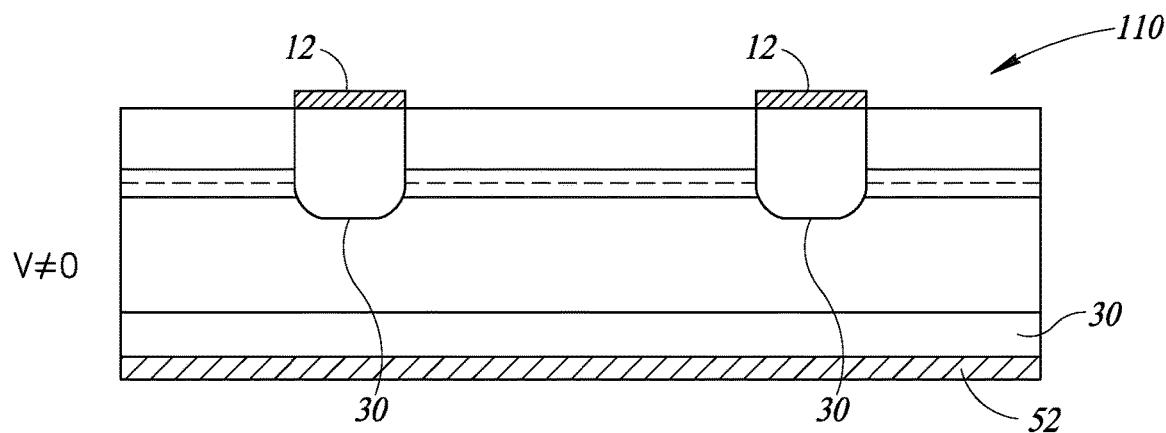
FIG. 2C is a cross-sectional view showing operation of the ballistic device shown in FIG. 2A when the applied voltage V is greater than 0V.

The ballistic device 110 shown in FIGS. 2A to 2C is similar to the ballistic device 10 shown and described above with respect to FIGS. 1A to 1C. Many of the same features of the ballistic device 110 may be the same as described above with respect to the ballistic device 10, including, for example, the heterostructure 14, the first layer 14a, second layer 14b, 2 DEG layer 16, and confinement electrodes 12.

The heterostructure 14 of the ballistic device 110 may be formed on a substrate 54 which may be any semiconductor substrate, and may include, for example, silicon (Si), silicon carbide (SiC), aluminum oxide ($Al_2O_3$) or any other suitable substrate. The ballistic device 110 further includes a reference electrode 52. The reference electrode 52 may be provided on a side of the heterostructure 14 that is opposite to a side of the heterostructure 14 where the confinement electrodes 12 are provided. For example, the reference electrode 52 may be provided on a backside of the substrate 54, or on a backside of the heterostructure 14.

A voltage source 60 may generate a confinement voltage which is applied to the confinement electrodes 12. The voltage source 60 may be electrically coupled between the reference electrode 52 and the confinement electrodes 12 of the ballistic device 110, as shown. More particularly, the voltage source 60 may have a first terminal electrically coupled to the confinement electrodes 12, and a second terminal electrically coupled to the reference electrode 52. Accordingly, the reference electrode 52 may act as a reference, and the voltage of the confinement electrodes 12 may be held by the voltage source 60 at a static voltage with respect to the reference electrode 52. The voltage source 60 may generate the confinement voltage at a level which ensure that the underlying 2 DEG layer 16 is completely interrupted beneath the confinement electrodes 12.

As shown in FIG. 2B, when the voltage V applied to the confinement electrodes 12 by the voltage source 60 is 0 V, the underlying 2 DEG layer 16 is continuous and is not interrupted beneath the confinement electrodes 12. In this state, the ballistic device 110 does not have defined boundaries or a defined conduction channel in the 2 DEG layer 16 underlying the confinement electrodes 12.

As shown in FIG. 2C, when the voltage V applied to the confinement electrodes 12 by the voltage source 60 is at some level different from 0 V, space charge regions 30 are generated by the confinement electrodes 12. The space charge regions 30 may extend completely through the 2 DEG layer 16, thereby forming boundaries within the 2 DEG layer 16 and defining a conduction channel for the ballistic device 110. The space charge regions 30 may be generated to have sufficient energy to cause total ballistic reflection of electrons in the 2 DEG layer 16 upon encountering the space charge regions 30. Moreover, a space charge region 30 is generated which extends between the reference electrode 52 and the 2 DEG layer 16, as shown.

Although the voltage source 60 is shown as being connected to only one of the two confinement electrodes 12 of the ballistic device 110, it will be readily appreciated that the voltage source 60 may be electrically coupled to both of the confinement electrodes 12, such that they receive a same confinement voltage.

The ballistic device 110 shown in FIGS. 2A to 2C may operate as a ballistic diode in substantially the same way as described above with respect to the ballistic device 10. That is, when a confinement voltage is applied to the confinement electrodes 12 (e.g., by the voltage source 60), the confinement electrodes 12 define boundaries of a conduction channel for the device 110 in the underlying 2 DEG layer 16. A signal or current may then pass, for example, from an input electrode to an output electrode, in only one direction (e.g., electrons flowing from the left to the right, as shown in FIG. 1A).

Figure 3A:
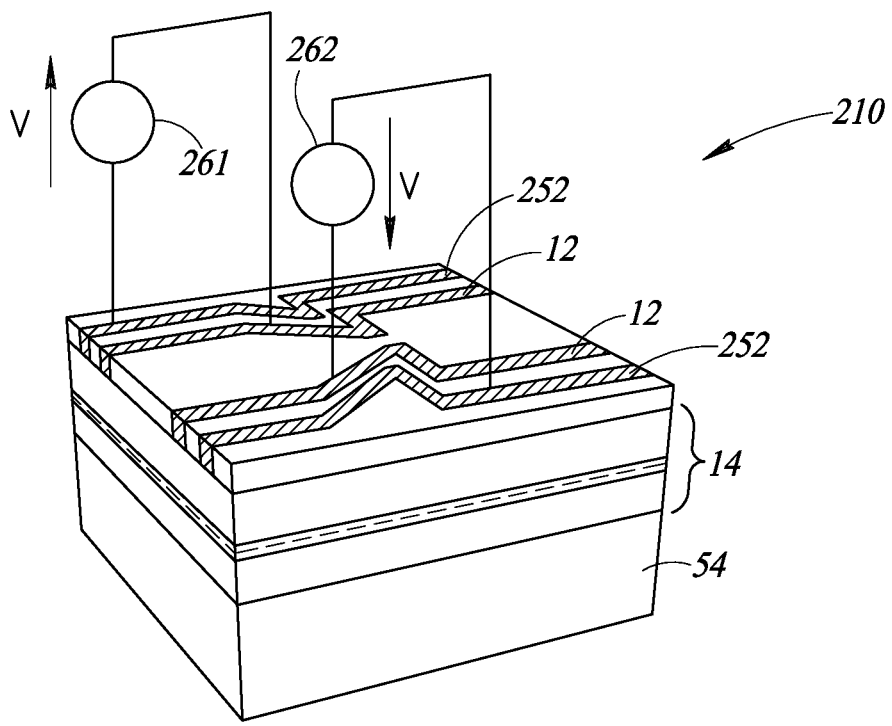
FIG. 3A is a perspective view illustrating a ballistic device having in-plane reference electrodes, in accordance with one or more embodiments of the present disclosure.

FIG. 3A is a perspective view illustrating a ballistic device 210, in accordance with one or more embodiments of the present disclosure. The ballistic device 210 shown in FIG. 3A is substantially similar in many ways to the ballistic device 110 shown and described with respect to FIG. 2A. However, there are certain differences which will be discussed below.

In particular, the ballistic device 210 includes in-plane reference electrodes 252, instead of a backside reference electrode. The reference electrodes 252 may be formed in-plane with respect to the confinement electrodes 12. That is, the reference electrodes 252 may be formed on a same layer as the confinement electrodes 12, such as on a same surface of the second layer 14b of the heterostructure 14.

Each of the reference electrodes 252 may have a same shape or geometry as an adjacent one of the confinement electrodes 12. For example, as shown in FIG. 3A, the ballistic device 110 may include two confinement electrodes 12 which are spaced apart from one another and which are symmetrical with respect to one another. Each of the reference electrodes 252 is positioned adjacent to a corresponding one of the confinement electrodes 12, and may have a shape that substantially corresponds to the shape of the adjacent confinement electrode 12, as shown. Moreover, the reference electrodes 252 may be spaced apart from the corresponding adjacent confinement electrodes by a substantially uniform distance.

A first voltage source 261 may be electrically coupled between a first one of the reference electrodes 252 and a corresponding one of the confinement electrodes. A second voltage source 262 may be electrically coupled between a second one of the reference electrodes 252 and a corresponding one of the confinement electrodes 12. Since the spacing is substantially uniform between each reference electrode 252 and its corresponding adjacent confinement electrode 12, the voltages supplied by the first and second voltage sources 261, 262 will produce relatively uniform space charge regions 30 beneath the confinement electrodes 12.

Figure 3B:
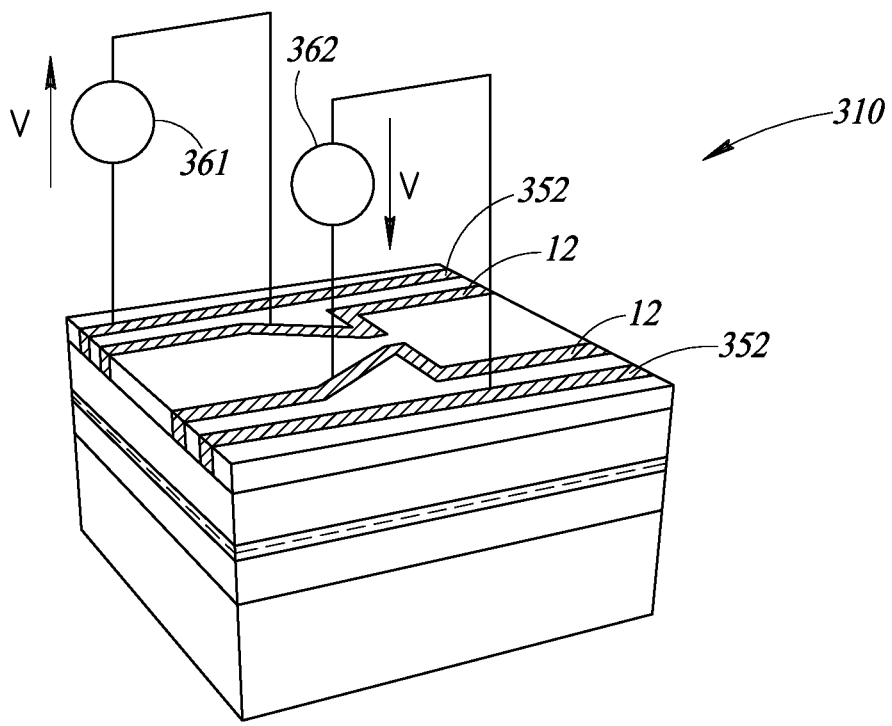
FIG. 3B is a perspective view illustrating another ballistic device having in-plane reference electrodes, in accordance with one or more embodiments of the present disclosure.

FIG. 3B is a perspective view illustrating a ballistic device 310, in accordance with one or more embodiments of the present disclosure. The ballistic device 310 shown in FIG. 3B is substantially similar in many ways to the ballistic device 210 shown and described with respect to FIG. 3A, except that the reference electrodes 352 of the ballistic device 310 are not uniformly spaced apart from the corresponding confinement electrodes 12. For example, the reference electrodes 352 may be generally straight or linear in shape, which may result in certain regions where the reference electrodes 352 are spaced farther apart from the corresponding confinement electrodes 12.

A first voltage source 361 may be electrically coupled between a first one of the reference electrodes 352 and a corresponding one of the confinement electrodes. A second voltage source 362 may be electrically coupled between a second one of the reference electrodes 352 and a corresponding one of the confinement electrodes 12. Since the spacing is non-uniform between each reference electrode 352 and its corresponding adjacent confinement electrode 12, the voltages supplied by the first and second voltage sources 361, 362 may produce non-uniform space charge regions 30 beneath the confinement electrodes 12. Accordingly, the voltages supplied by the first and second voltage sources 361, 362 should be suitable to ensure that the space charge regions 30 extend completely through the 2 DEG layer 16 and have sufficient energy to cause total ballistic reflection in regions where the spacing between the reference electrodes 362 and corresponding confinement electrodes 12 is at a maximum.

Figure 4:
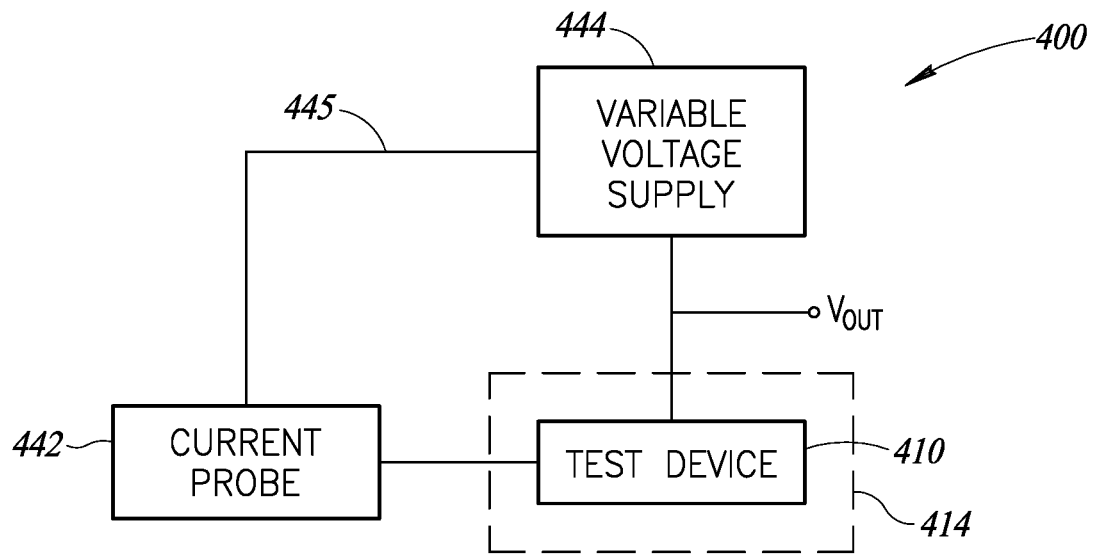
FIG. 4 is a block diagram illustrating a confinement voltage supply circuit, in accordance with one or more embodiments of the present disclosure.

FIG. 4 is a block diagram illustrating a confinement voltage supply circuit 400, in accordance with one or more embodiments of the present disclosure. The confinement voltage supply circuit 400 may be utilized to generate a confinement voltage at a level which ensures that space charge regions generated by confinement electrodes 12 of one or more ballistic devices, in response to receiving the confinement voltage, will adequately pinch off or interrupt the underlying 2 DEG layer 16 and cause ballistic reflection at the boundaries formed in the 2 DEG layer 16 by the confinement electrodes 12.

The confinement voltage supply circuit 400 includes a test device 410, a current probe 442, ad a variable voltage supply 444. The test device 410 is formed on a same substrate 414 as a plurality of ballistic devices which are to be supplied with the confinement voltage $V_{OUT}$ that is generated by the confinement voltage supply circuit 400. For example, the test device 410 may be formed on a substrate 414, which may include a heterostructure 14, 2 DEG layer 16 and the like.

Figure 5:
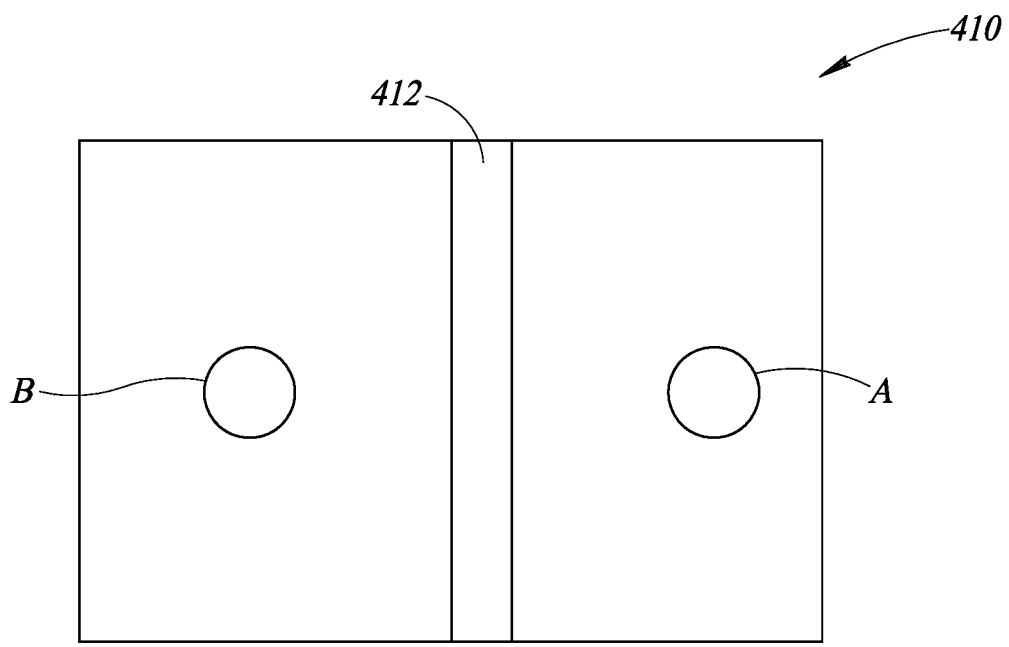
FIG. 5 is a top plan view illustrating further details of a test device which may be included in a confinement voltage supply circuit, in accordance with one or more embodiments of the present disclosure.

FIG. 5 is a top plan view illustrating further details of the test device 410. The test device 410 is a ballistic device that includes a first electrode A, a second electrode B, and an in-plane confinement electrode 412 between the first and second electrodes A, B. The first and second electrodes A, B are electrically coupled to the underlying 2 DEG layer 16. For example, the first and second electrodes A, B may be electrically connected to the underlying 2 DEG layer 16 by conductive vias. The confinement electrode 412 may be positioned overlying and spaced apart from the 2 DEG layer 16. For example, the confinement electrode 412 may be disposed on the second layer 14b of the heterostructure 14.

In use, a current may flow between the first and second electrodes A, B, for example, in response to an electric field generated between the first and second electrodes A, B. The confinement electrode 412 may block the flow of current between the first and second electrodes A, B, for example, by generating a space charge region 30 which extends into the underlying 2 DEG layer 16 in response to receiving an applied confinement voltage.

Referring again to the confinement voltage supply 40 shown in FIG. 4, the current probe 442 is used to sense the current through the test device 410. For example, a known or fixed voltage may be applied to the first electrode A of the test device 410, and the current probe 442 may be electrically coupled to the second electrode B so that it may receive or otherwise sense the current that flows from the first electrode A to the second electrode B. The current sensed by the current probe 442 may be used as a feedback signal 445 which is supplied to the variable voltage supply 444. The variable voltage supply 444 may thus adjust the generated confinement voltage $V_{OUT}$ based on the feedback signal 445, until the confinement voltage $V_{OUT}$ (which is applied to the confinement electrode 412 of the test device 410) is at a level which sufficiently interrupts or pinches off the underlying 2 DEG layer such that current no longer flows through the test device 410. When the confinement voltage $V_{OUT}$ reaches this level, it may be clamped at this level, and may then be applied to confinement electrodes 12 of a plurality of ballistic devices to generate boundaries for respective conduction channels of the ballistic devices within the 2 DEG layer 16.

In some embodiments, the confinement voltage supply circuit 400 may include a plurality of test devices 410, with currents through each of the test devices 410 being sensed and used to provide feedback to the variable voltage supply 444 which is used to adjust the output confinement voltage $V_{OUT}$. Each of the test devices 410 may be positioned in different locations or regions of a semiconductor device or chip. This may be useful to account for potential non-uniformities or differences in characteristics of the heterostructure 14 at different regions of the semiconductor device.

In some embodiments, a plurality of confinement voltage supply circuits 400 may be included in a semiconductor device, with each such confinement voltage supply circuit 400 being operable to generate a respective confinement voltage $V_{OUT}$. The confinement voltage supply circuits 400 may each include a respective test device 410, which may be positioned in different locations or regions of a semiconductor device. Accordingly, a particular confinement voltage $V_{OUT}$ may be generated for ballistic devices in each of a variety of regions or locations of the semiconductor device.

One or more components or circuitry of the confinement voltage supply circuit 400 may be formed on a separate substrate or a separate semiconductor device or chip as the test device 410 and the ballistic devices which receive the output confinement voltage $V_{OUT}$.

Figure 6:
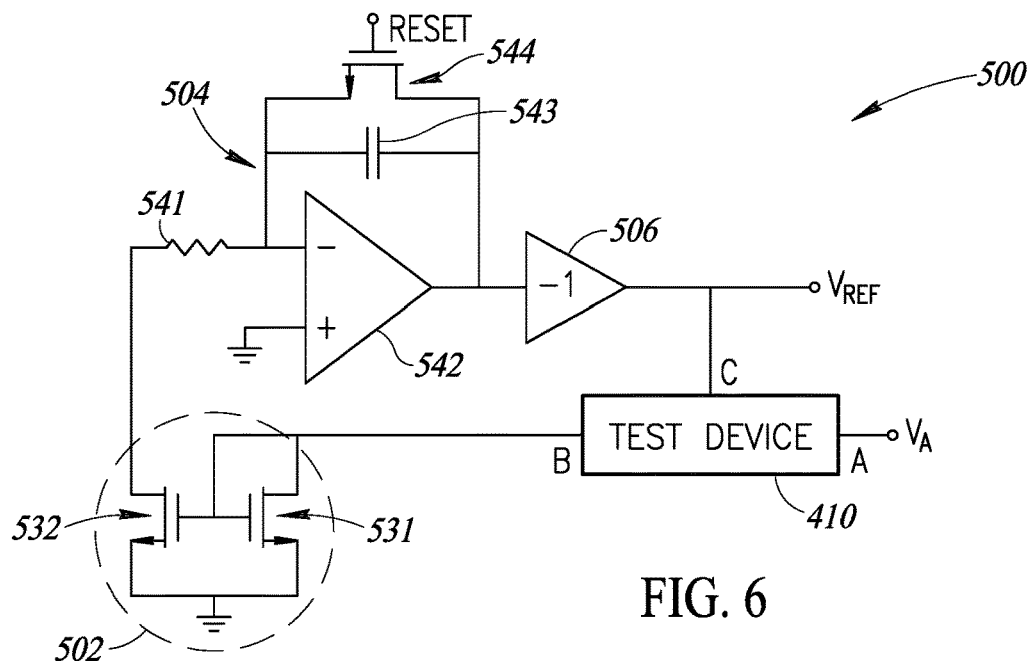
FIG. 6 is a schematic circuit diagram illustrating a confinement voltage supply circuit, in accordance with one or more embodiments of the present disclosure.

FIG. 6 is a schematic circuit diagram illustrating a confinement voltage supply circuit 500, in accordance with one or more embodiments of the present disclosure. The confinement voltage supply circuit 500 may be one implementation of the confinement voltage supply circuit 400 shown and described with respect to FIG. 4.

The confinement voltage supply circuit 500 may generate a confinement voltage $V_{REF}$ (which may correspond to the confinement voltage $V_{OUT}$ of the circuit 400) which may be applied to the confinement electrode 412 of the test device 410. The confinement voltage $V_{REF}$, once it has been set by the circuit 500 at a level appropriate to pinch off or interrupt the 2 DEG layer 16, may be applied to the confinement electrodes 12 of a plurality of ballistic devices of a semiconductor device or chip.

As shown in FIG. 5, the confinement voltage supply circuit 500 may include a current mirror 502, an integrator 504, a gain stage 506 and the test device 410. The confinement voltage supply circuit 500 may generate the supply voltage $V_{REF}$ based on a current through the test device 410, in a similar way as described above with respect to the confinement voltage supply circuit 400.

The confinement electrode 412 (shown as C in FIG. 6) of the test device 410 is electrically connected to the output confinement voltage $V_{REF}$ of the circuit 500. The second electrode B of the test device 410 is electrically coupled to an input of the current mirror 502, which receives as input a current through the test device 410 (e.g., a current from the first electrode A to the second electrode B). The current mirror 502 includes a current sensor 531 and a current generator 532. The current sensor 531 and the current generator 532 may each include a respective transistor, which may be any transistor, including for example a MOSFET transistor as shown in FIG. 6. The gate terminals of the current sensor 531 and the current generator 532 may be electrically coupled to one another, and the source terminals of the current sensor 531 and the current generator 532 may be electrically coupled to one another and to an electrical ground. The drain and gate terminals of the current sensor 531 may be coupled to each other and may receive the current that flows between the first and second electrodes A, B of the test device 410.

The current generator 532 is electrically coupled to the integrator 504. The current generator 532 generates a mirrored current based on the current through the test device 410 input to the current sensor 531, and the current generated by the current generator 532 is provided as input to the integrator 504.

The integrator 504 may be, for example, a current integrator which integrates the input current over time. The integrator 504 may include an input resistor 541 coupled between the current generator 532 and an inverting input of an operational amplifier 542. The integrator 504 further includes a capacitor 543 coupled between an output of the op amp 542 and the inverting input. The non-inverting input of the op amp 542 may be coupled to ground. A reset switch 544, which may be any transistor, such as a MOSFET, is coupled in parallel with the capacitor 543 between the inverting input and the output of the op amp 542.

The gain stage 506 may be a −1 gain stage. That is, the output of the gain stage 506 may be inverted with respect to the input, which may result in a positive voltage being output from the gain stage 506. The output of the gain stage 506 is the confinement voltage $V_{REF}$ which is applied to the confinement electrode 412 of the test device 410, and which is further applied to confinement electrodes 12 of any of a plurality of ballistic devices which may be driven by the confinement voltage supply circuit 500. The confinement voltage $V_{REF}$ is a voltage sufficient to pinch off or otherwise interrupt the 2 DEG layer underlying the confinement electrode 412 of the test device 410 so that current no longer flows between the first and second electrodes A, B.

In operation, a voltage $V_A$ is applied to the first electrode A of the test device 410, which causes a current from the first electrode A to the second electrode B (e.g., through the 2 DEG layer) of the test device. The voltage $V_A$ may be a fixed voltage that is applied to the first electrode A of the test device 410, for example, to generate a particular current through the test device 410.

The current sensor 531 senses the current and the current generator 532 generates a mirrored current which charges the integrator 504. The output of the integrator 504, and thus the output confinement voltage $V_{REF}$, gradually increases in magnitude until the confinement voltage $V_{REF}$ becomes large enough to inhibit conduction between the first and second electrodes A, B of the test device 410. In this condition, the current sensor 531 prevents the integrator 504 from further charging through the current mirror 502, since the current through the test device 410 is effectively zero. The capacitor 543 of the integrator 504 holds the pinch-off voltage for the confinement electrode 412 (i.e., the voltage at which the confinement electrode 412 fully interrupts the underlying 2 DEG layer so that the current through the test device 410 is zero or very close to zero).

The confinement electrode 412 of the test device 410 may receive the confinement voltage $V_{REF}$ for any period of time, thereby maintaining the interruption of the underlying 2 DEG layer. Moreover, once the confinement voltage $V_{REF}$ has been set at the level sufficient to interrupt the underlying 2 DEG layer in the test device 410, the confinement voltage $V_{REF}$ may be output to the confinement electrodes 12 of any number of ballistic devices which may be driven by the circuit 500, thereby defining respective boundaries of conduction channels of the ballistic devices.

In some embodiments, the confinement electrode 412 may receive the confinement voltage $V_{REF}$ until the confinement voltage is reset via the reset switch 544. In some embodiments, the control terminal (e.g., the gate) of the reset switch 544 may be electrically coupled to processing circuitry, such as a microcontroller or the like, which may selectively control resetting of the confinement voltage supply circuit 500, and may thus selectively control application of the supply voltage $V_{REF}$ to the confinement electrode 412 of the test device as well as to the confinement electrodes 12 of the plurality of ballistic devices that are driven by the circuit 500.

Since the confinement voltage supply circuit 500 generates the confinement voltage $V_{REF}$ based on the current through the test device 410 upon application of a particular, known voltage $V_A$, the degree of isolation or interruption of the underlying 2 DEG layer (e.g., a depth of the space charge region generated beneath the confinement electrode 412) may be set as desired, which may be set at different levels in various embodiments. Moreover, the confinement voltage supply circuit 500 may be tuned to generate the confinement voltage $V_{REF}$ at a level that is sufficient to interrupt the 2 DEG layer in various ballistic devices having various different sizes, dimensions, or geometries, including, for example, ballistic devices having various different thickness of the heterostructure and 2 DEG layer.

Figure 7A:
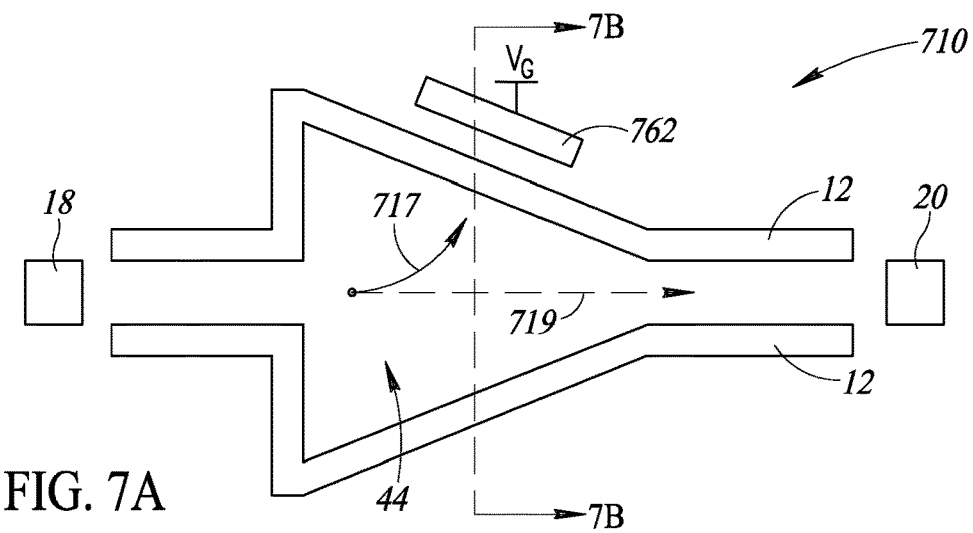
FIG. 7A is a top plan view illustrating a ballistic device, in accordance with one or more embodiments of the present disclosure.
Figure 7B:
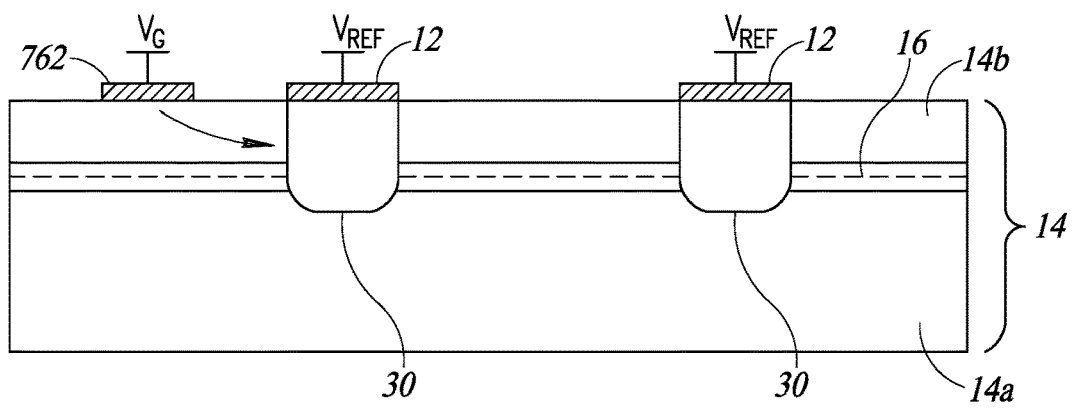
FIG. 7B is a cross-sectional view of the ballistic device taken along a cut-line 7B-7B shown in FIG. 7A, in accordance with one or more embodiments of the present disclosure.

FIG. 7A is a top plan view illustrating a ballistic device 710, and FIG. 7B is a cross-sectional view of the ballistic device 710 along a cut-line 7B-7B, in accordance with one or more embodiments of the present disclosure.

The ballistic device 710 may be substantially similar to the ballistic device 10 shown in FIGS. 1A to 1C, except that the ballistic device 710 is a three-terminal device. That is, in addition to the input electrode 18 and output electrode 20, the ballistic device 710 further includes a deflection or control electrode 762. The ballistic device 710 may be or otherwise operate as a ballistic transistor, as will be described in further detail below.

The confinement electrodes 12 of the ballistic device 710 may have a substantially same shape or layout as in the ballistic device 10 shown in FIGS. 1A to 1C. During operation, the confinement electrodes 12 may be applied with a confinement voltage (e.g., a confinement voltage $V_{REF}$ output by the confinement voltage supply circuit 500) and thus generate space charge regions which define boundaries of a conduction channel for the ballistic device 710 in the underlying 2 DEG layer 16. A separate control voltage $V_G$ may be selectively applied to the control electrode 762 to operate the ballistic device 710 as an electronic switch or transistor, e.g., by selectively allowing or preventing a signal or current from passing from the input electrode 18 to the output electrode 20.

For example, when the control electrode 762 is not applied with the control voltage $V_G$, a current may flow from the input electrode 18 to the output electrode 20 (e.g., along a first pathway 719), and the ballistic device 710 may be in an on, conductive state. The current between the input electrode 18 and output electrode 20 may be caused to flow, for example, by an electric field that may be generated between the input and output electrodes 18, 20.

However, when the control voltage $V_G$ is applied to the control electrode 762 of the ballistic device 710, the control electrode 762 generates an electric field that laterally couples with the space charge region 30 beneath the adjacent confinement electrode 12, which causes modulation of the space charge region 30, which in turn modifies the boundary formed by the space charge region 30 and modifies the charge transport through the conduction channel in the 2 DEG layer 16. The electrons within the conduction channel of the ballistic device 710 may thus be deflected away from the first pathway 719 and instead travel along a second pathway 717 toward the boundary of the conduction channel that is adjacent to the control electrode 762. That is, the electrons in the conduction channel move toward the control electrode 762.

Since the control electrode 762 may be positioned adjacent to an angled or included portion of the confinement electrode 12, the electrons may be generally be collected at or near the boundary within the intermediate region 44 of the ballistic device 710. Accordingly, the electrons may fail to reach the output electrode 20 and the ballistic device 710 may be in an off, non-conductive state.

The ballistic device 710 may thus be or otherwise act as a normally on ballistic transistor, as conduction is permitted between the input and output electrodes 18, 20 when a control voltage $V_G$ is not applied to the control electrode 762, and the current is blocked when the control voltage $V_G$ is applied to the control electrode 762.

In some embodiments, the level of the control voltage $V_G$ may be varied to control an amount of current that flows between the input and output electrodes 18, 20. For example, the control voltage $V_G$ applied to the control electrode 762 may have an intermediate value, such that the ballistic device 710 is operated between the on state and the off state, and the electron flow may be partially blocked and may partially reach the output electrode 20 of the ballistic device 710.

Figure 8A:
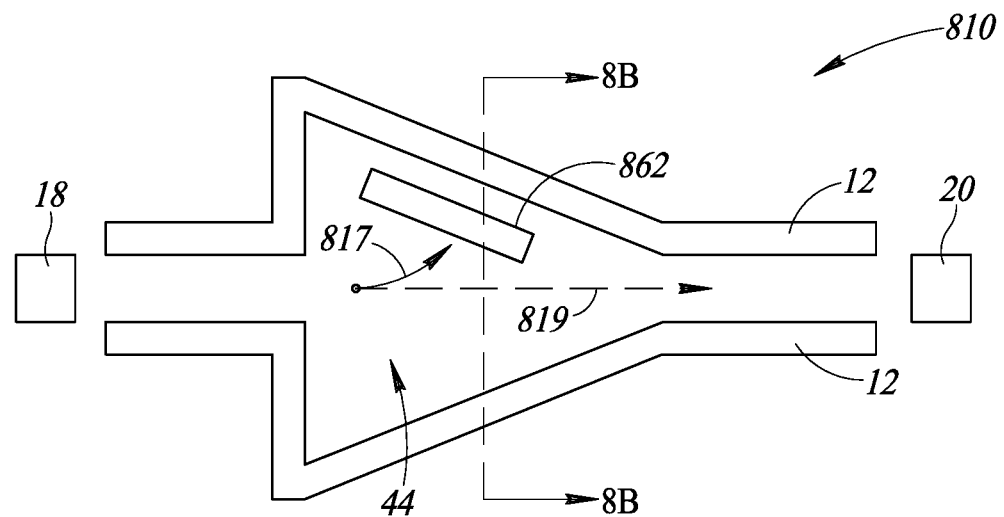
FIG. 8A is a top plan view illustrating a ballistic device, in accordance with one or more embodiments of the present disclosure.
Figure 8B:
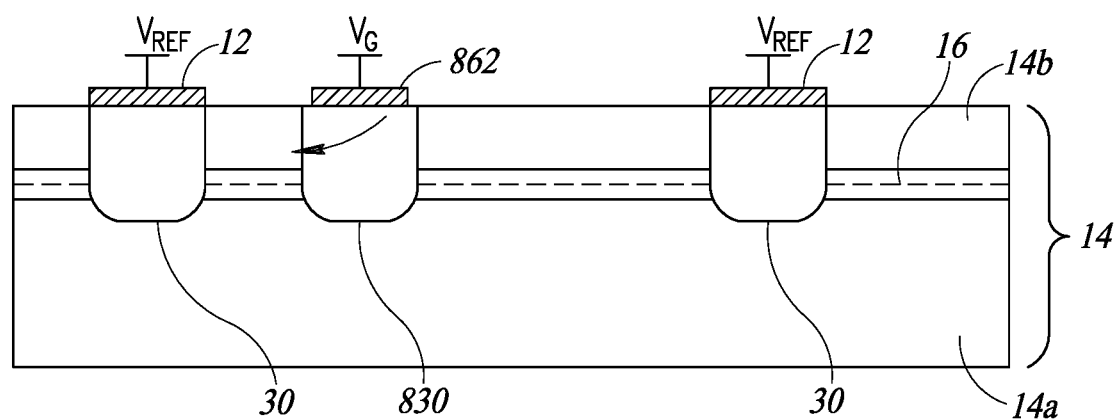
FIG. 8B is a cross-sectional view of the ballistic device taken along a cut-line 8B-8B shown in FIG. 8A, in accordance with one or more embodiments of the present disclosure.

FIG. 8A is a top plan view illustrating a ballistic device 810, and FIG. 8B is a cross-sectional view of the ballistic device 810 along a cut-line 8B-8B, in accordance with one or more embodiments of the present disclosure.

The ballistic device 810 may be substantially similar to the ballistic device 710 shown in FIGS. 7A and 7B, except that the ballistic device 810 includes a control electrode 862 that is positioned between the two symmetrical confinement electrodes 12. The control electrode 862 is positioned adjacent to or near one of the two confinement electrodes 12, as shown.

The control voltage $V_G$ may be selectively applied to the control electrode 862 to operate the ballistic device 810 as an electronic switch or transistor in a substantially same way as described above with respect to the ballistic device 710, e.g., by selectively allowing or preventing a signal or current from passing from the input electrode 18 to the output electrode 20.

When the control electrode 862 is not applied with the control voltage $V_G$, a current may flow from the input electrode 18 to the output electrode 20 (e.g., along a first pathway 819), and the ballistic device 810 may be in an on, conductive state.

However, when the control voltage $V_G$ is applied to the control electrode 862 of the ballistic device 810, the control electrode 862 applies an electrical field (e.g., in the vertical direction as shown in FIG. 7B) which depletes the underlying regions of the 2 DEG layer 16 and creates its own space charge region 830 beneath the control electrode 862, and modifies the charge transport through the conduction channel in the 2 DEG layer 16 and pulls electrons away from the pathway 819. The electrons within the conduction channel of the ballistic device 810 may thus be deflected away from the first pathway 819 and instead flow along a second pathway 817 toward the boundary of the conduction channel that is adjacent to the control electrode 862. That is, the electrons in the conduction channel move toward the control electrode 862.

Figure 9A:
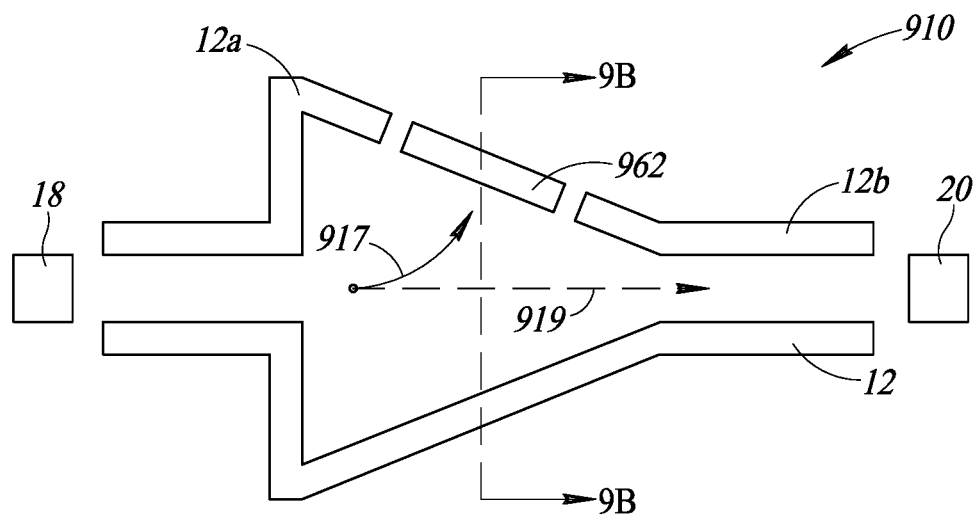
FIG. 9A is a top plan view illustrating a ballistic device, in accordance with one or more embodiments of the present disclosure.
Figure 9B:
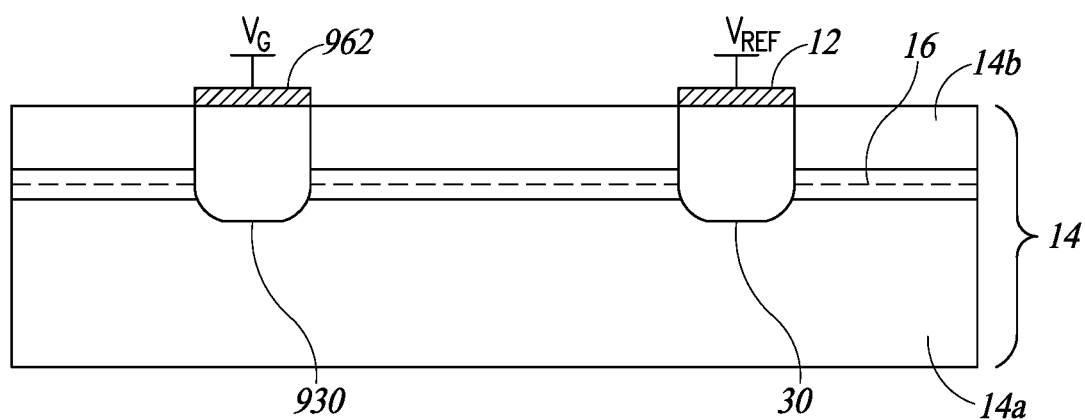
FIG. 9B is a cross-sectional view of the ballistic device taken along a cut-line 9B-9B shown in FIG. 9A, in accordance with one or more embodiments of the present disclosure.

FIG. 9A is a top plan view illustrating a ballistic device 910, and FIG. 9B is a cross-sectional view of the ballistic device 910 along a cut-line 9B-9B, in accordance with one or more embodiments of the present disclosure.

The ballistic device 910 may be substantially similar to the ballistic devices 710 and 810, except that the ballistic device 910 includes a control electrode 962 that is aligned between a first confinement electrode 12a and a second confinement electrode 12b along one side (e.g., along the angled or inclined portion) of the ballistic device 910.

The control electrode 962 may thus operably form a portion of the boundary of the conduction channel of the ballistic device 910, and further may be operable to modify the transport of electrons within the conduction channel. For example, when the confinement electrodes 12a, 12b, 12 are applied with a confinement voltage, these confinement electrodes generate space charge regions 30 which form respective parts of a boundary for the conduction channel in the underlying 2 DEG layer 16. The control electrode 962 may be applied with a separate control voltage $V_G$. The ballistic device 910 may thus be operated in various modes or configurations depending on a magnitude of the control voltage $V_G$. For example, the control voltage $V_G$ may be applied at various levels to adjust the characteristics of the space charge region 930 that is generated by the control electrode 962. In some embodiments, the control electrode 962 may be controlled to generate a space charge region 930 that is substantially the same in characteristics as the space charge regions 30 generated beneath the confinement electrodes 12a, 12b, 12, and thus the ballistic device may operate in an on, conducting state and a current may flow along a first pathway 919 from the input electrode 18 to the output electrode 20. However, by modifying the level of the control voltage $V_G$ applied to the control electrode 962 (e.g., by increasing the magnitude of the voltage), the control electrode 962 may modify the charge transport in the conduction channel and may pull electrons toward the control electrode 962 and away from the output electrode 20 along a pathway like 917, so that the ballistic device 910 may be in an off, non-conducting state.

FIGS. 10 through 15 illustrate examples of various ballistic devices which may have electrically-variable geometries or characteristics, in which the shape and/or existence of one or more boundaries of the ballistic devices may be modified and controlled as may be desired, in accordance with embodiments of the present disclosure. Each of the ballistic devices illustrated in FIGS. 10 through 15 may include any of the features of any of the various ballistic devices described herein, including, for example, the heterostructure 14, first layer 14a, second layer 14b, 2 DEG layer 16, and the like. In the interests of clarity and brevity, a detailed description of such features may be omitted in the discussion of the ballistic devices below.

Figure 10:
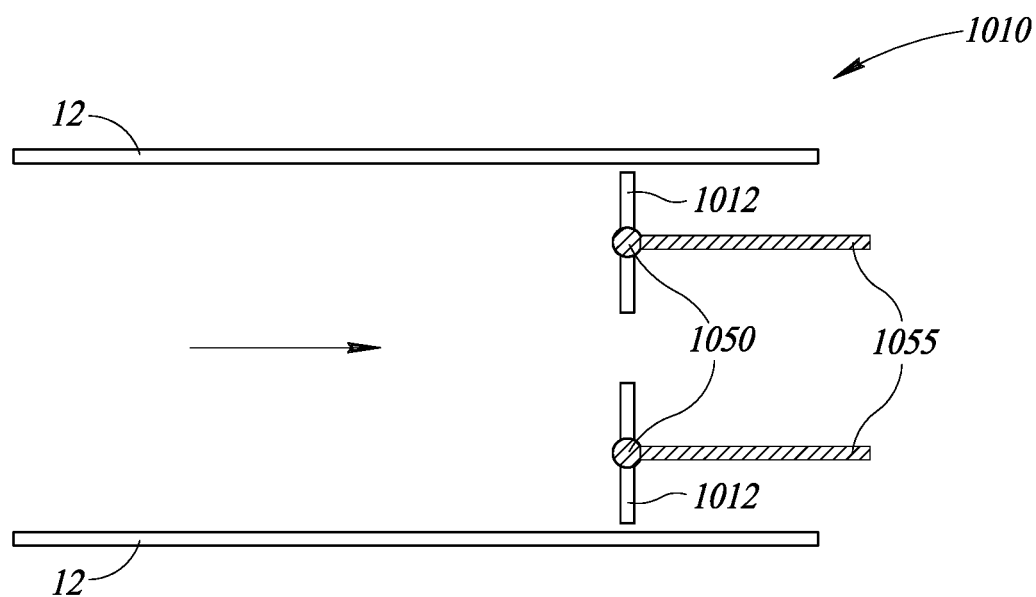
FIG. 10 is a top plan view illustrating a ballistic device which may be selectively operated as a ballistic resistor, in accordance with one or more embodiments of the present disclosure.

FIG. 10 is a top plan view illustrating a ballistic device 1010, in accordance with one or more embodiments of the present disclosure. The ballistic device 1010 may be selectively operated as a ballistic resistor, or as a variable characteristic resistor, as will be described in further detail below.

The ballistic device 1010 includes two first confinement electrodes 12 which are spaced apart from one another and may be generally parallel to one another, as shown. One or more second confinement electrodes 1012 may be positioned between the first confinement electrodes 12. For example, as shown in FIG. 10, the second confinement electrodes 1012 may extend in a direction transverse to, or in some embodiments perpendicular to, a direction of the first confinement electrodes 12.

The first confinement electrodes 12 may be electrically coupled to a confinement voltage (e.g., $V_{REF}$), and when the confinement voltage is applied to the first confinement electrodes 12, the first confinement electrodes 12 generate space charge regions which form boundaries for a conduction channel in the underlying 2 DEG layer 16. If no voltage is applied to the second confinement electrodes 1012, a current may thus travel through the 2 DEG layer 16 in the ballistic device 1010 (e.g., as shown by the arrow). The current is contained within the boundaries formed by the confinement electrodes 12, but is otherwise unimpeded in the 2 DEG layer. Thus, the ballistic device 1010 may be operated as a conductor having little or no resistance.

The ballistic device 1010 may also be operated as a resistor, for example, by applying a suitable voltage to the second confinement electrodes 1012. The second confinement electrodes 1012 may be connected to respective voltage supply lines 1055 through respective vias 1050. The voltage supply lines 1055 may be formed on a separate layer as the first and second confinement electrodes 12, 1012. More particularly, the voltage supply lines 1055 may be spaced farther apart from the 2 DEG layer 16 than are the first and second confinement electrodes 12, 1012, so that the voltage supply lines 1055 do not have any direct effect on the 2 DEG layer 16. For example, the voltage supply lines 1055 may be formed in an upper metal layer of a semiconductor device or chip that includes the ballistic device 1010.

The voltage supply lines 1055 may be electrically coupled to respective voltage supplies. In some embodiments, the voltage supply lines 1055 are coupled to different voltage supply lines, and in other embodiments, the voltage supply lines 1055 are coupled to a same voltage supply. A control voltage, which may have a same or different magnitude as the confinement voltage that is applied to the confinement electrodes 12, may be selectively applied to one or both of the second confinement electrodes 1012.

In a first example, a control voltage may be applied to just one of the second confinement electrodes 1012. This causes a space charge region 30 to be generated beneath the second confinement electrode 1012, and the space charge region 30 may thus form a boundary in the underlying 2 DEG layer 16 which is transverse to the boundaries already formed by the first confinement electrodes 12. Thus, when electrons of a current flowing through the conduction channel encounter the transverse boundary created by the second confinement electrode 1012, the electrons are reflected off of the boundary and the current flow is thus impeded. The ballistic device 1010 may thus exhibit a resistive behavior which impedes the flow of current through the ballistic device 1010.

In a second example, a control voltage may be applied to both of the second confinement electrodes 1012. In such a case, space charge regions 30 are generated beneath both of the second confinement electrodes 1012, which together form a longer boundary in the underlying 2 DEG layer 16 in a direction transverse to the first confinement electrodes 12. Current flow through the conduction channel of the ballistic device 1010 is therefore impeded to a greater degree than in the example where only one of the second confinement electrodes 1012 is active. Accordingly, the resistance exhibited by the ballistic device 1010 may be increased in the second example, e.g., by applying a control voltage to both of the second confinement electrodes 1012.

Control of the behavior of the ballistic device 1010, and more particularly, control of the two second confinement electrodes 1012 may be provided, for example, through processing circuitry, a microprocessor, or the like. For example, a microprocessor may output control signals which control one or more switches to selectively apply the control voltages to one, both, or neither of the second confinement electrodes 1012.

As described above, the ballistic device 1010 may be operated as a variable resistor, which may have a resistance that varies based on control voltages being applied to the second confinement electrodes 1012. While two second confinement electrodes 1012 are shown in the example of FIG. 10, fewer or more than two second confinement electrodes 1012 may be included in various embodiments of ballistic devices of the present disclosure. Moreover, in various embodiments, the ballistic device may have first and/or second confinement electrodes 12, 1012 having various different layouts, shapes, positioning, and the like.

Figure 11:
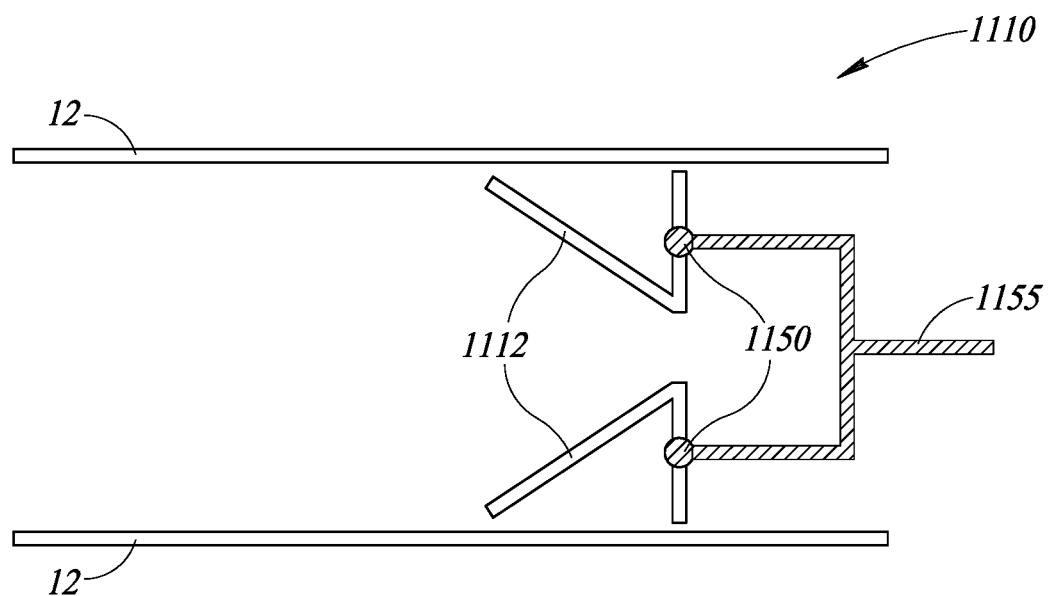
FIG. 11 is a top plan view illustrating a ballistic device which may be selectively operated as a ballistic diode, in accordance with one or more embodiments of the present disclosure.

FIG. 11 is a top plan view illustrating a ballistic device 1110, in accordance with one or more embodiments of the present disclosure. The ballistic device 1110 may be selectively operated as a ballistic diode, as will be described in further detail below.

The ballistic device 1110 includes two first confinement electrodes 12 which are spaced apart from one another and may be generally parallel to one another, as shown. The ballistic device 1110 further includes second confinement electrodes 1112, which may be positioned between the first confinement electrodes 12. The second confinement electrodes 1112 may be generally symmetrical with respect to one another, and each of the second confinement electrodes may have a generally triangular shape as shown.

The first confinement electrodes 12 may be electrically coupled to a confinement voltage (e.g., $V_{REF}$), and when the confinement voltage is applied to the first confinement electrodes 12, the first confinement electrodes 12 generate space charge regions which form boundaries for a conduction channel in the underlying 2 DEG layer 16. When the second confinement electrodes 1112 are activated, for example, by application of a control voltage, the ballistic device 1110 may be or otherwise operate as a ballistic diode in a similar manner as described above with respect to FIGS. 1A to 1C, for example. More particularly, the second confinement electrodes 1112 may form boundaries within the underlying 2 DEG layer 16 such that current may flow in one direction (e.g., from left to right as shown in FIG. 11) but is impeded or otherwise blocked from flowing in the opposite direction (e.g., from right to left).

The second confinement electrodes 1112 may be commonly connected to a voltage supply line 1155, for example, through vias 1150. The voltage supply line 1155 may be formed, for example, in an upper metal layer of a semiconductor device or chip that includes the ballistic device 1110.

When the control voltage is not applied to the second confinement electrodes 1112, and the confinement voltage is applied to the confinement electrodes 12, the ballistic device 1110 may be operated as a conductor having little resistance.

Figure 12:
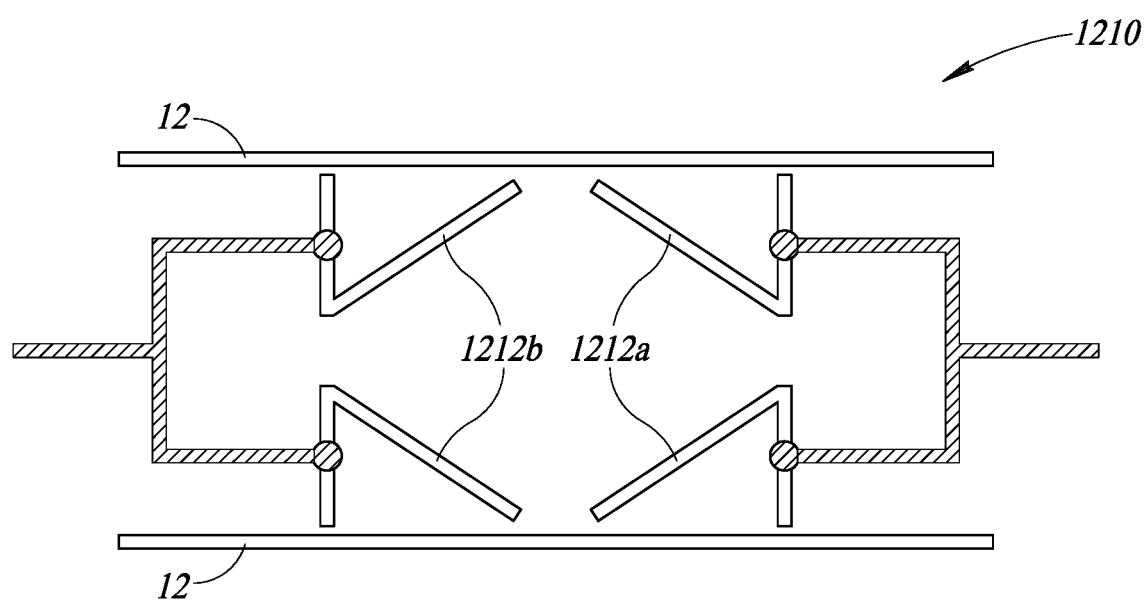
FIG. 12 is a top plan view illustrating a ballistic device which may be selectively operated as a reversible ballistic diode, in accordance with one or more embodiments of the present disclosure.

FIG. 12 is a top plan view illustrating a ballistic device 1210, in accordance with one or more embodiments of the present disclosure. The ballistic device 1210 may be selectively operated as a reversible ballistic diode, as will be described in further detail below.

The ballistic device 1210 includes a pair of first confinement electrodes 12 which are spaced apart from one another and may be generally parallel to one another, as shown. The ballistic device 1210 further includes a first set of second confinement electrodes 1212a and a second set of second confinement electrodes 1212b. Each of the first and second sets of second confinement electrodes 1212a, 1212b may be positioned between the first confinement electrodes 12.

When activated, for example, by a control voltage, the first set of second confinement electrodes 1212a may form a first diode which permits current to flow in a first direction (e.g., from left to right, as shown in FIG. 12) and blocks or impedes current flow in an opposite second direction (e.g., from right to left, as shown).

The second set of second confinement electrodes 1212b are oriented in an opposite manner as the first set of second confinement electrodes 1212a. That is, when activated by a control voltage, the second set of second confinement electrodes 1212b may form a second diode that is oriented in an opposite direction as the first diode formed by the first set of second confinement electrodes 1212a. Accordingly, the second diode formed by the second set of second confinement electrodes 1212b permits current to flow in the second direction (e.g., from right to left) and blocks or impedes current flow in the first direction (e.g., from left to right).

The ballistic device 1210 thus may be or otherwise operate as a reversible diode. That is, by selectively applying a control voltage to one of the first or second diodes that are respectively formed by the first set of second confinement electrodes 1212a and the second set of second confinement electrodes 1212b, the ballistic device 1210 can selectively permit current flow in either direction and further can selectively block current flow in either direction.

The first set of second confinement electrodes 1212a may be commonly connected to a same voltage supply line, and the second set of second confinement electrodes 1212b may similarly be commonly connected to a same voltage supply line.

Figure 13:
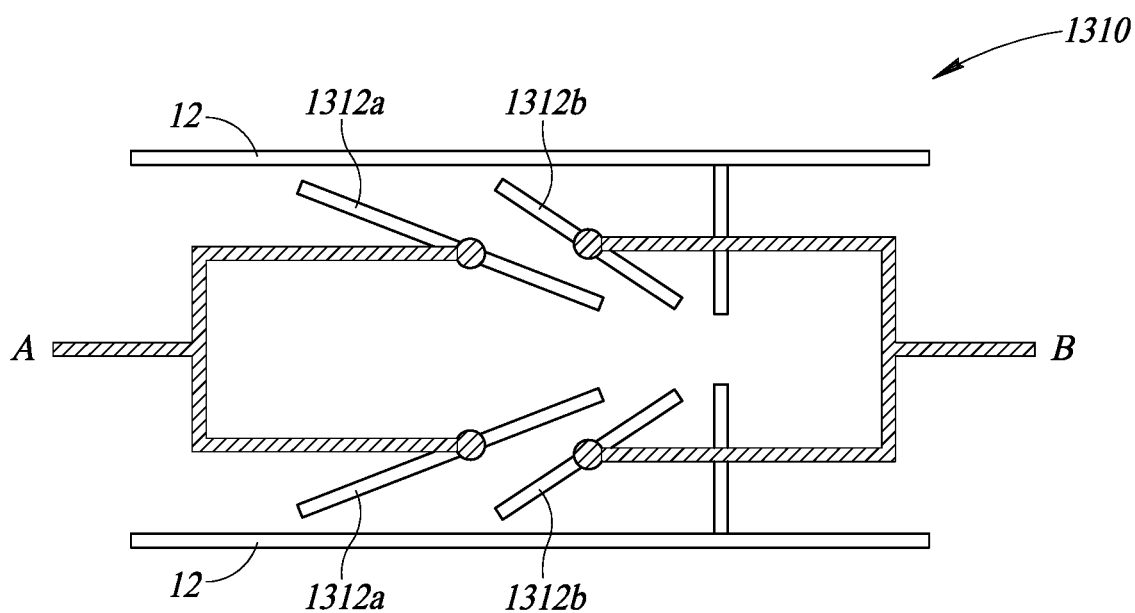
FIG. 13 is a top plan view illustrating a ballistic device which may be operated as a ballistic diode having variable and electrically controllable characteristics, in accordance with one or more embodiments of the present disclosure.

FIG. 13 is a top plan view illustrating a ballistic device 1310, in accordance with one or more embodiments of the present disclosure. The ballistic device 1310 may be operated as a ballistic diode having variable and electrically controllable characteristics, as will be described in further detail below.

The ballistic device 1310 includes a pair of first confinement electrodes 12 which are spaced apart from one another. Each of the first confinement electrodes 12 includes respective portions that are parallel to one another and spaced apart from one another, which may form outer boundaries of the ballistic device 1310. Additionally, each of the first confinement electrodes 12 includes portions which extend inward from the outer boundary toward each other, thereby forming a narrow outlet through which current can flow in the underlying 2 DEG layer 16.

The ballistic device 1310 further includes a first set of second confinement electrodes 1312a and a second set of second confinement electrodes 1312b, each of which are independently controllable, for example, by application of a control voltage. Each of the first and second sets of second confinement electrodes 1312a, 1312b may be positioned between the first confinement electrodes 12.

When activated, for example, by a control voltage applied to the first set of confinement electrodes 1312a at the terminal A, the first set of second confinement electrodes 1312a may form a first diode which permits current to flow in a first direction (e.g., from left to right, as shown in FIG. 13) and blocks or impedes current flow in an opposite second direction (e.g., from right to left, as shown).

Similarly, the second set of second confinement electrodes 1312b may be activated, for example, by application of a control voltage at the terminal B, to form a second diode which permits current flow in the first direction and blocks current flow in the opposite second direction. Thus, the first and second diodes, which are respectively formed by application of control voltages to the first set of confinement electrodes 1312a and the second set of confinement electrodes 1312b, are oriented in the same direction. However, the first and second diodes have different characteristics due to the differences in geometry or layout of the first and second sets of second confinement electrodes 1312a, 1312b, then creating a variable characteristic diode. Accordingly, the ballistic device 1310 may be operated as a ballistic diode having variable characteristics, for example, by selectively activating the first set of second confinement electrodes 1312a or the second set of second confinement electrodes 1312b.

Figure 14:
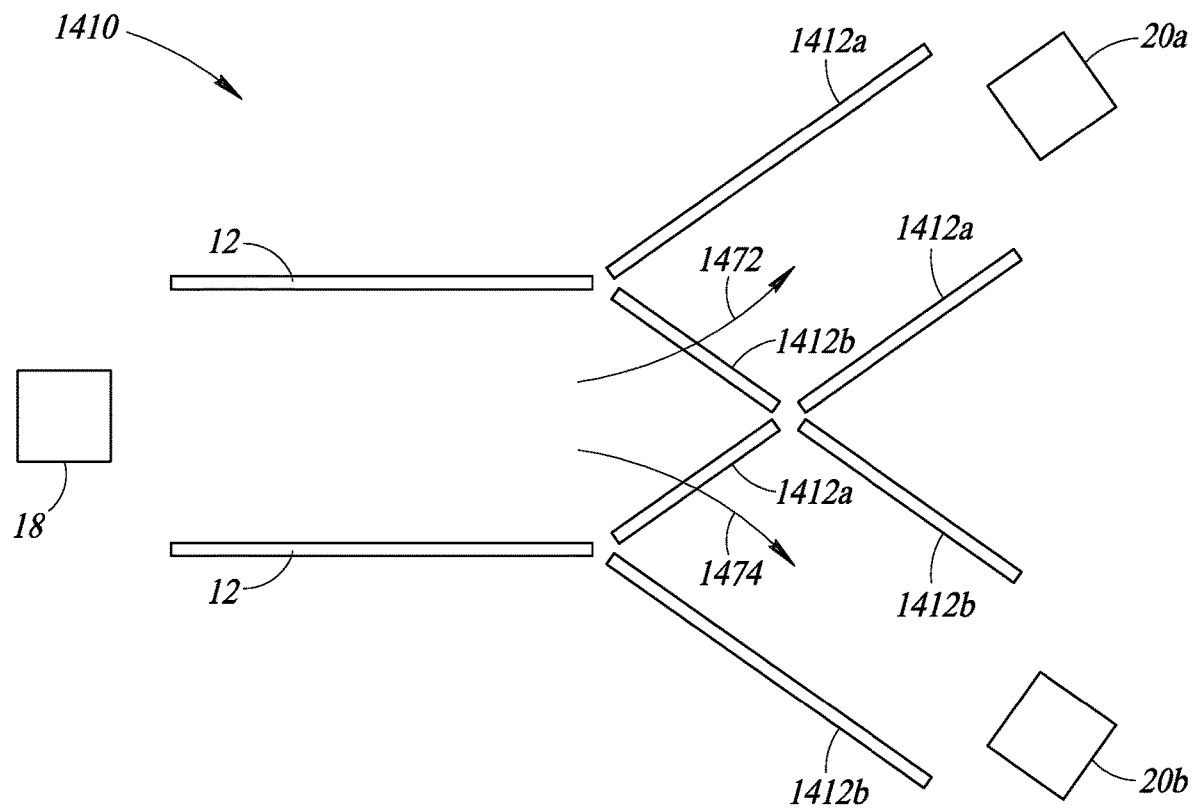
FIG. 14 is a top plan view illustrating a ballistic device which may be operated as a ballistic multiplexer/demultiplexer, in accordance with one or more embodiments of the present disclosure.

FIG. 14 is a top plan view illustrating a ballistic device 1410, in accordance with one or more embodiments of the present disclosure. The ballistic device 1310 may be or otherwise operate as a ballistic multiplexer/demultiplexer, or a ballistic deviator, or a ballistic switch, as will be described in further detail below.

The ballistic device 1410 includes first confinement electrodes 12 which are spaced apart from one another and which, when supplied with a confinement voltage, form outer boundaries of an input channel of the ballistic device 1410 (e.g., form outer boundaries of an input portion of a conduction channel in the underlying 2 DEG layer 16). An input electrode 18 may be electrically coupled to the input channel of the ballistic device 1410 and is electrically coupled to the underlying 2 DEG layer 16. For example, the input electrode 18 may be directly connected to the underlying 2 DEG layer 16 by a conductive via or the like. A first output electrode 20a is electrically coupled to a first output channel of the ballistic device 1410, and a second output electrode 20b is electrically coupled to a second output channel of the ballistic device 1410.

The ballistic device 1410 further includes a first set of second confinement electrodes 1412a and a second set of second confinement electrodes 1412b, each of which are independently controllable, for example, by application of a control voltage.

When a control voltage is applied to the first set of confinement electrodes 1412a, the first set of second confinement electrodes 1412a may form a first output channel (e.g., between the input channel formed by the first confinement electrodes 12 and the first output electrode 20a) due to the space charge regions which are generated beneath the first set of second confinement electrodes 1412a and which interrupt the underlying 2 DEG layer 16 and form boundaries of a first output path in the conduction channel. At the same time, the control voltage may not be applied to the second set of second confinement electrodes 1412b, so that the second set of second confinement electrodes 1412b do not interrupt the underlying 2 DEG layer 16 and the signal or current may flow freely beneath the second set of second confinement electrodes 1412b. Accordingly, a signal or current is permitted to flow from the input electrode 18 to the first output electrode 20a, e.g., along the path of the first output channel indicated at 1472. The signal or current may be blocked from flowing to the second output electrode 20b, as a space charge region generated beneath one of the first set of second confinement electrodes 1412a will block this path.

Similarly, the second set of second confinement electrodes 1412b may form a second output channel (e.g., between the input channel formed by the first confinement electrodes 12 and the second output electrode 20b) due to the space charge regions which are generated beneath the second set of second confinement electrodes 1412b and form boundaries of a second output path in the conduction channel. At the same time, the control voltage may not be applied to the first set of second confinement electrodes 1412a, so that the signal or current may flow freely beneath the first set of second confinement electrodes 1412a. Accordingly, the signal or current is permitted to flow from the input electrode 18 to the second output electrode 20b, e.g., along the path of the second output channel indicated at 1474. The signal or current may be blocked from flowing to the first output electrode 20a due to a space charge region generated beneath one of the second set of second confinement electrodes 1412b which blocks the path to the first output electrode 20a.

Accordingly, the ballistic device 1410 may be operated as a ballistic multiplexer/demultiplexer by selectively activating an output channel, e.g, by selectively applying a control voltage to one of the first or second sets of second confinement electrodes 1412a, 1412b.

While the ballistic device 1410 is described as having one input electrode 18 and two output electrodes 20a, 20b, it will be readily appreciated that in various embodiments, the input electrode 18 and output electrodes 20a, 20b may be reversed. For example, in an embodiment, the first and second output electrodes 20a, 20b of the ballistic device 1410 may be operated as input electrodes which receive first and second input signals. The input electrode 18 of the ballistic device 1410 may similarly be operated as an output electrode. In such a configuration, one of the first or second input signals may be selected to pass to the output electrode, for example, by selectively activating one of the first or the second sets of second confinement electrodes 1412a, 1412b.

Moreover, it will be readily appreciated that in various embodiments, the ballistic device 1410 may include any number of input and/or output channels. For example, any number of additional sets of second confinement electrodes may be included and may selectively route an input signal (or an output signal) to a selected output channel (or input channel). As in previous embodiments of ballistic devices described herein, control of the various confinement electrodes of the ballistic device 1410 may be provided by processing circuitry, such as a microprocessor or the like.

Figure 15:
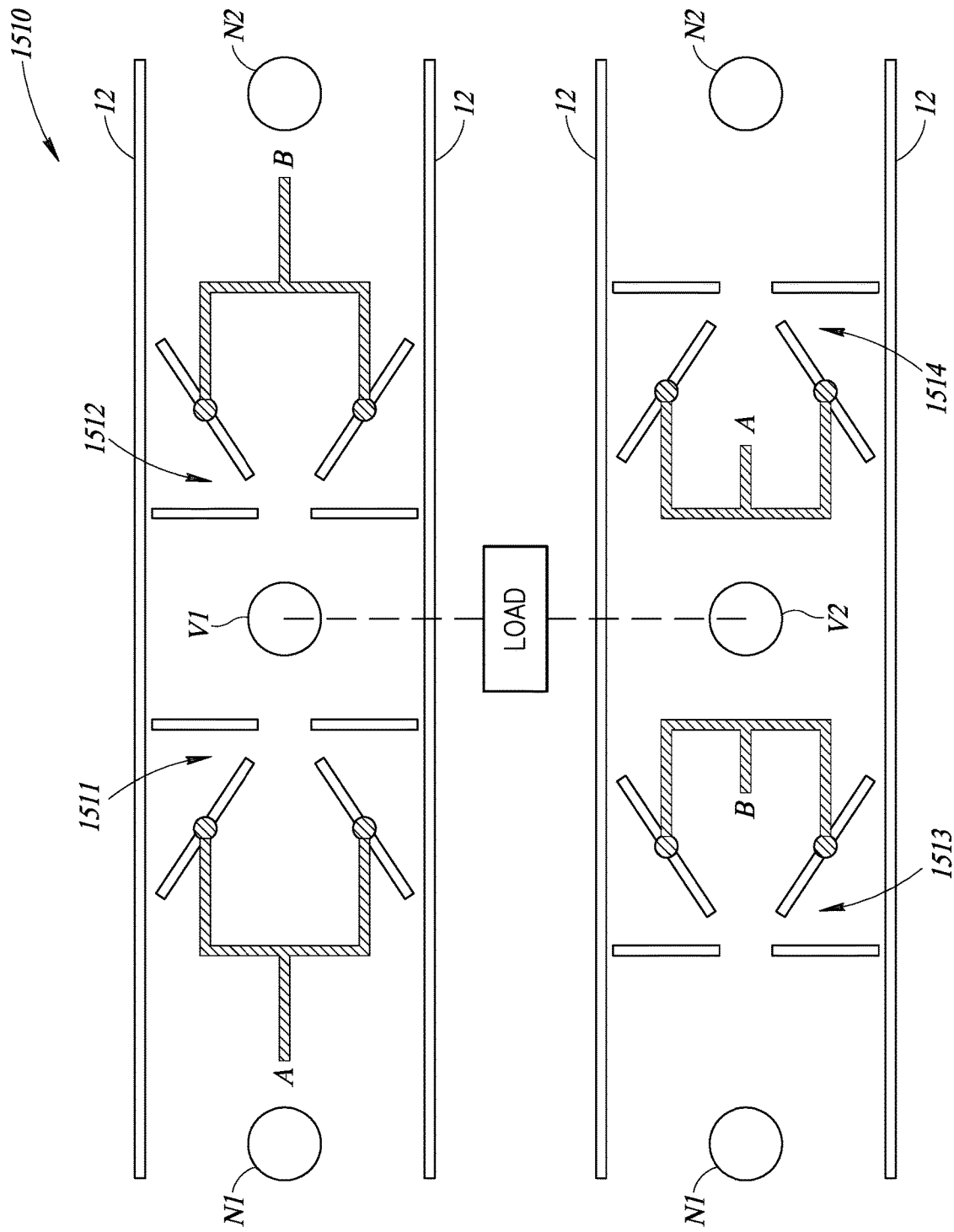
FIG. 15 is a top plan view illustrating a ballistic circuit which may be selectively operated as an electrically configurable ballistic half-wave or full-wave rectifier, in accordance with one or more embodiments of the present disclosure.

FIG. 15 is a top plan view illustrating a ballistic circuit 1510, in accordance with one or more embodiments of the present disclosure. The ballistic circuit 1510 may be or otherwise operate as an electrically configurable ballistic half-wave or full-wave rectifier, as will be described in further detail below.

The ballistic circuit 1510 may include a first ballistic diode 1511, a second ballistic diode 1512, a third ballistic diode 1513, and a fourth ballistic diode 1514, each of which may be substantially the same as ballistic diodes previously described herein. More particularly, each of the first through fourth ballistic diodes 1511 to 1514 may be selectively activated by a control voltage to permit current to flow in one direction in the underlying 2 DEG layer 16 and to block current flow in the opposite direction. The first through fourth ballistic diodes 1511 to 1514 is positioned between pairs of confinement electrodes 12. For example, the first and second ballistic diodes 1511, 1512 may be positioned between a first pair of confinement electrodes 12, and the third and fourth ballistic diodes 1513, 1514 may be positioned between a second pair of confinement electrodes 12 which may be spaced apart from the first pair of confinement electrodes 12.

The first ballistic diode 1511 is positioned between a terminal electrically coupled to a first input node N1 and a first output terminal V1. The second ballistic diode 1512 is positioned between a terminal electrically coupled to a second input node N2 and the first output terminal V1. The third ballistic diode 1513 is positioned between a terminal electrically coupled to the first input node N1 and a second output terminal V2. The fourth ballistic diode 1514 is positioned between a terminal electrically coupled to the second input node N2 and the second output terminal V2.

The terminals that are electrically coupled to the first input node N1 may be physically separate terminals which are electrically coupled to a same electrical node, i.e., the first input node N1. Thus, the terminal electrically coupled to the first input node N1 that is adjacent to the first ballistic diode 1511 may be a separate terminal, and may be geographically separated from the terminal that is electrically coupled to the first input node N1 and that is adjacent to the third ballistic diode 1513. Similarly, the terminals electrically coupled to the second input node N2 (e.g., the terminals coupled to the second input node N2 and positioned adjacent to the second and fourth ballistic diodes 1512, 1514) may be geographically separated from one another.

In use, a first output terminal of an AC voltage source may be electrically coupled to the first input node N1, and a second output terminal of the AC voltage source may be electrically coupled to the second input node N2. The first output terminal V1 may be electrically coupled to a first terminal of a load, and the second output terminal may be electrically coupled to a second terminal of the load.

The ballistic circuit 1510 may be operated in a first mode as a half-wave rectifier, for example, by applying a control voltage to the first and the fourth ballistic diodes 1511, 1514, for example, by applying the control voltage at the node A. Alternatively, the ballistic circuit 1510 may be operated as a half-wave rectifier by applying a control voltage to the second and third ballistic diodes 1512, 1513, for example, by applying the control voltage at the node B.

The ballistic circuit 1510 may be operated in a second mode as a full-wave rectifier, for example, by applying a control voltage at both nodes A and B, thereby activating each of the first through fourth diodes 1511, 1514.

While the ballistic circuit 1510 of the example shown in FIG. 15 is an electrically configurable ballistic half-wave or full-wave rectifier, embodiments of the present disclosure are not limited thereto. It should be readily appreciated that, in various embodiments, ballistic circuits may be implemented including any ballistic devices which have confinement electrodes that are operable to define one or more boundaries of an underlying 2 DEG layer, for example, by application of a suitable confinement or control voltage. Such ballistic circuits may have applied to any network of ballistic devices and may have any level of complexity.

Moreover, it will be readily appreciated that in various embodiments, the ballistic circuit 1510 may be controlled by processing circuitry, such as a microprocessor or the like.

FIGS. 16A through 16D are cross-sectional views illustrating a ballistic device 1610 with various confinement voltage levels being applied.

Figure 16A:
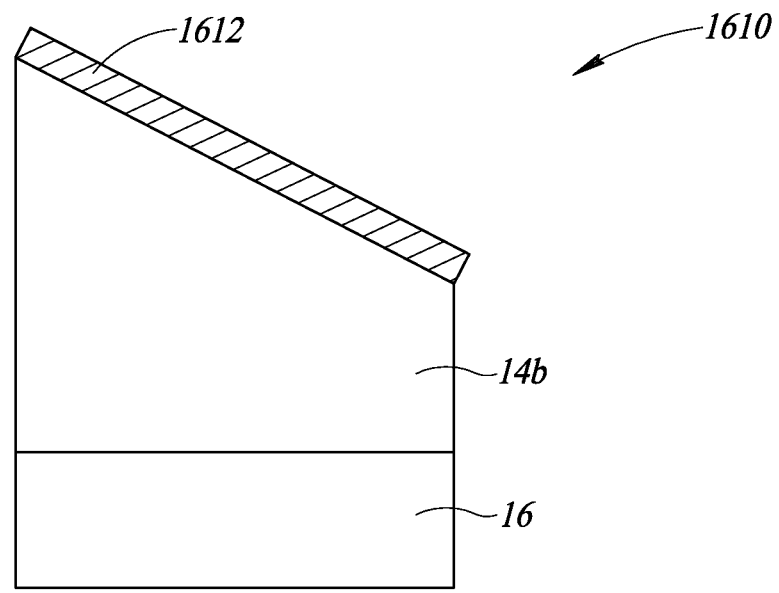
FIGS. 16A through 16D are cross-sectional views illustrating a ballistic device having an inclined confinement electrode, with various confinement voltage levels being applied, in accordance with one or more embodiments of the present disclosure.

As shown in FIG. 16A, the ballistic device 1610 may include a confinement electrode 1612 that is positioned on a non-planar or inclined surface, such as a non-planar or inclined surface of the second layer 14b of the heterostructure 14. Accordingly, the confinement electrode 1612 is spaced apart from the underlying 2 DEG layer 16 by a variable distance, e.g., with a distance between the confinement electrode 1612 and the 2 DEG layer 16 at the left side as shown in FIG. 16A being greatest, and a distance between the confinement electrode 1612 and the 2 DEG layer 16 at the right side as shown in FIG. 16A being least.

Figure 16B:
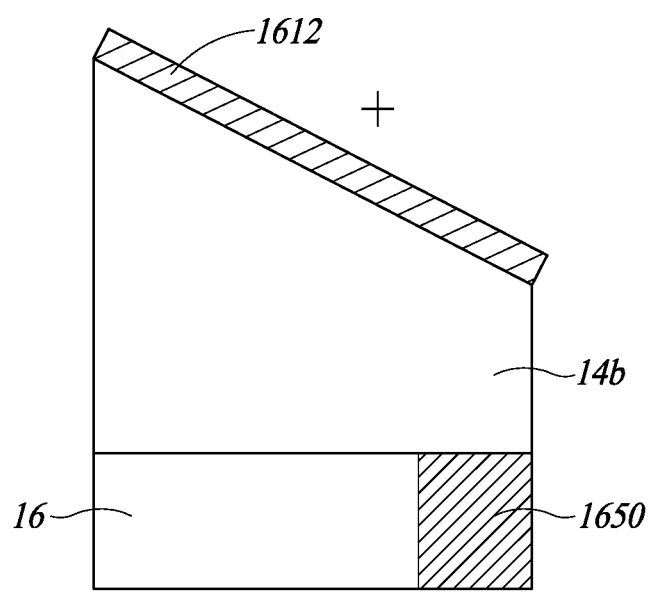

As shown in FIG. 16B, when a first confinement voltage (+) is applied to the confinement electrode 1612, only a portion 1650 of the underlying 2 DEG layer 16 is interrupted or pinched off by the space charge region generated by the confinement electrode 1612. In particular, the portion 1650 that is interrupted by the space charge region is the portion of the 2 DEG layer 16 that is spaced near enough to the confinement electrode 1612 such that the generated space charge region may extend completely through the 2 DEG layer 16.

Figure 16C:
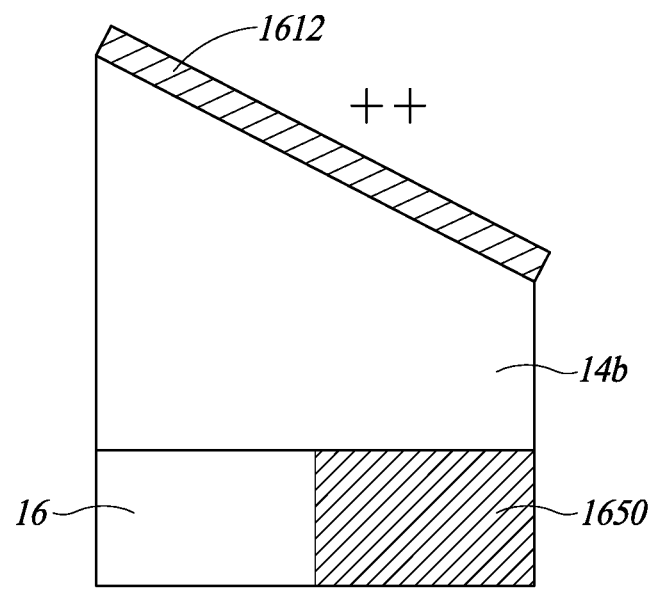

As shown in FIG. 16C, by applying a second confinement voltage (++) which is greater than the first confinement voltage (+), the portion 1650 of the underlying 2 DEG layer 16 that is interrupted or pinched off by the generated space charge region is increased in size. This is because the greater magnitude of the second confinement voltage (++) generates a space charge region which penetrates to a greater depth, so that the confinement electrode 1612 may interrupt or pinch off the underlying 2 DEG layer 16 over across a greater width.

Figure 16D:
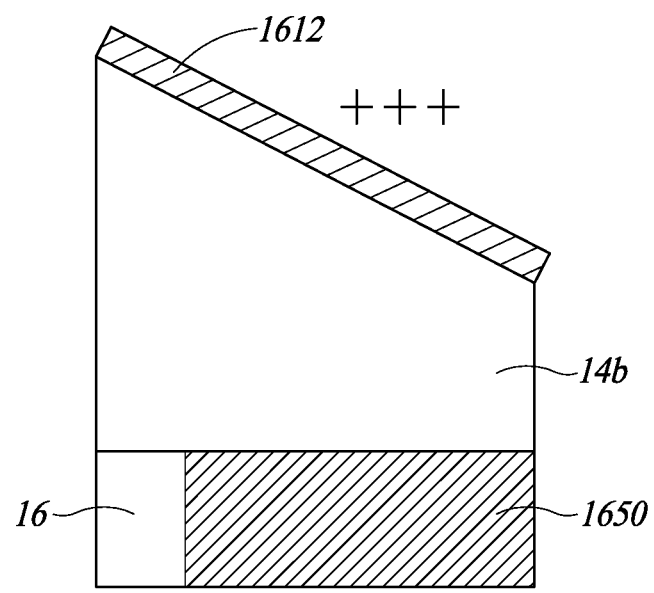

Similarly, as shown in FIG. 16D, by applying a third confinement voltage (+++) which is even greater than the second confinement voltage (++), the portion 1650 of the underlying 2 DEG layer 16 that is interrupted or pinched off by the generated space charge region is further increased in size. This is because the greater magnitude of the third confinement voltage (+++) generates a space charge region which penetrates to a greater depth, so that the confinement electrode 1612 may interrupt or pinch off the underlying 2 DEG layer 16 over across an even greater width.

Accordingly, the ballistic device 1610 may be utilized to define ballistic boundaries in the underlying 2 DEG layer 16 which are variable in size or width depending on the magnitude of the applied control voltage. While the ballistic device 1610 is shown as having a relatively continuous inclined confinement electrode 1612, the confinement electrode 1612 in various ballistic devices may be positioned on non-planar surfaces such that the confinement electrode 1612 may have a variety of different shapes and/or distances from the underlying 2 DEG layer 16.

The non-planar surface shape of the second layer 14b of the heterostructure 14 may be formed by any suitable technique, including for example by etching the second layer 14b to have an inclined surface and then forming the confinement electrode 1612 for example, by deposition or any suitable technique.

Figure 17A:
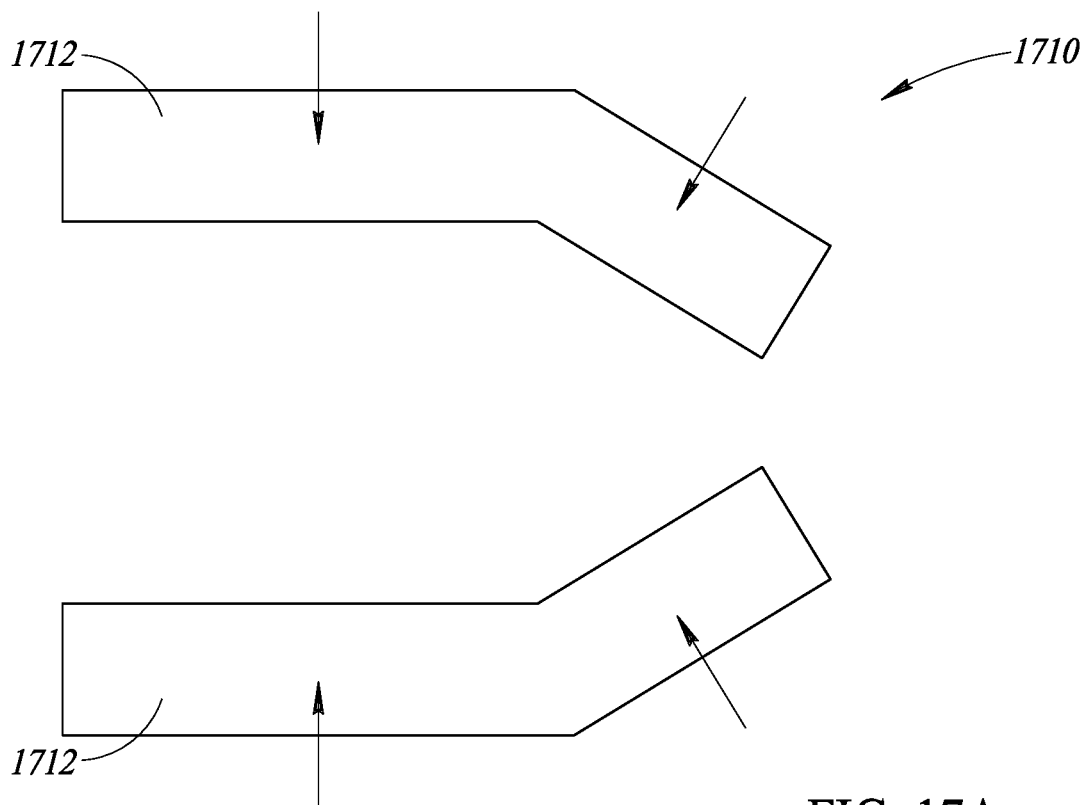
FIG. 17A is a top plan view illustrating a ballistic device which has inclined confinement electrodes, in accordance with one or more embodiments of the present disclosure.

FIG. 17A is a top plan view illustrating a ballistic device 1710 which has confinement electrodes 1712 that are substantially the same as the confinement electrode 1612 shown and described with respect to FIGS. 16A through 16D. That is, the confinement electrodes 1712 may be inclined electrodes. In particular, the thickness (e.g., the spacing between the confinement electrodes 1712 and the underlying 2 DEG layer 16) increases along the direction of the arrows shown in FIG. 17A. By applying confinement voltages of various magnitude to the confinement electrodes 1712, the ballistic device 1710 may be operated as a ballistic diode having various characteristics. For example, the ballistic device 1710 may be operated as a ballistic diode having an increasing or decreasing width, depending on the applied confinement voltage.

Figure 17B:
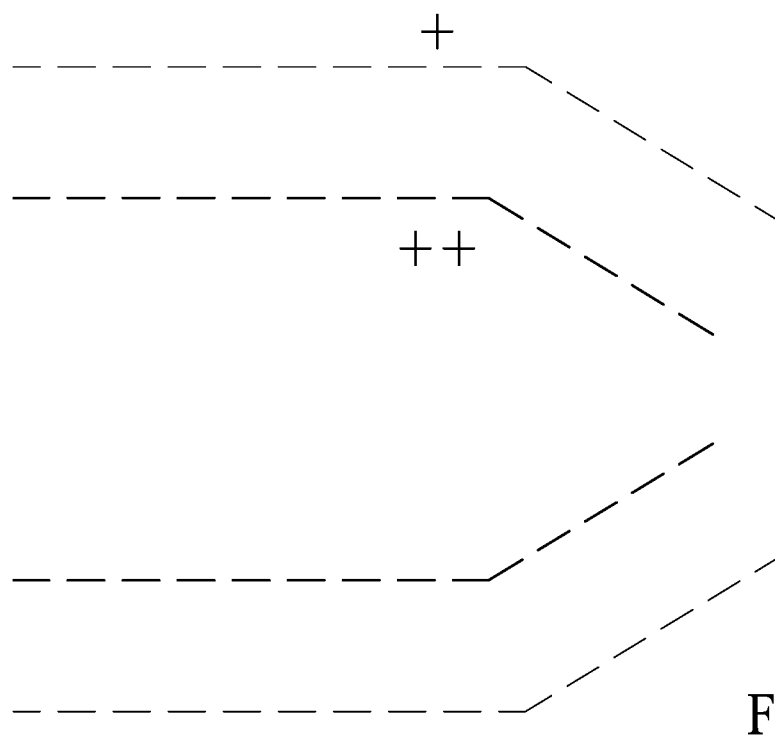
FIG. 17B schematically illustrates different operational profiles of the ballistic device shown in FIG. 17A, depending on the applied confinement voltage, in accordance with one or more embodiments of the present disclosure.

FIG. 17B schematically illustrates different operational profiles of the ballistic device 1710, depending on the applied confinement voltage. For example, by applying a first confinement voltage (+) the ballistic device 1710 may be operated as a ballistic diode having a relatively wide profile.

By applying a second confinement voltage (++) that is greater than the first confinement voltage (+), the portion of the underlying 2 DEG layer 16 that is interrupted or pinched off by the generated space charge region increased in width, thereby moving the boundaries which define the conduction channel of the 2 DEG layer 16 inward toward one another. Accordingly, the ballistic device 1710 may be operated as a ballistic diode having a thinner profile when the confinement voltage is increased.

Figure 18A:
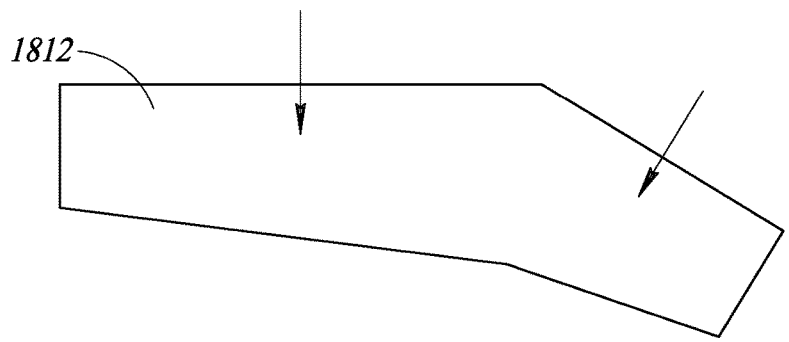
FIG. 18A is a top plan view illustrating an inclined confinement electrode that has a non-parallel profile, in accordance with one or more embodiments of the present disclosure.

FIG. 18A is a top plan view of a confinement electrode 1812 which is similar to the confinement electrodes 1612 and 1712 described above with respect to FIGS. 16 and 17. For example, the confinement electrode 1812 may be disposed on a non-planar surface such that it has a thickness (e.g., the spacing between the confinement electrode 1812 and the underlying 2 DEG layer 16) that increases along the direction of the arrows shown in FIG. 18A. However, the confinement electrode 1812 has also a non-parallel profile, for example, as viewed from the top plan view. Thus, by applying different confinement voltages to the confinement electrode 1812, the profile of the underlying boundary generated in the 2 DEG layer 16 may vary not only in terms of its relative position, but also may vary in shape.

Figure 18B:
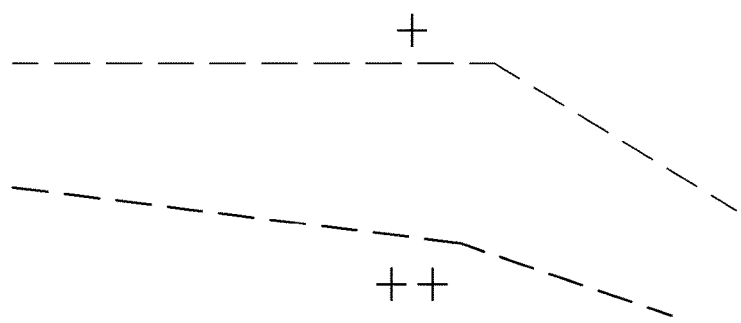
FIG. 18B schematically illustrates effects of applying different confinement voltages to the confinement electrode shown in FIG. 18A, in accordance with one or more embodiments of the present disclosure.

FIG. 18B schematically illustrates the effects of applying different confinement voltages to the confinement electrode 1812. By applying a first confinement voltage (+) to the confinement electrode 1812, the confinement electrode 1812 generates a ballistic boundary in the underlying 2 DEG layer 16 which has a first shape and position.

By applying a second confinement voltage (++) that is greater than the first confinement voltage (+), the portion of the underlying 2 DEG layer 16 that is interrupted or pinched off by the generated space charge region is increased in width, thereby moving position of the ballistic boundary. Moreover, application of the second confinement voltage (++) may produce a ballistic boundary that has a different shape or profile than the ballistic boundary that is produced by application of the first confinement voltage (+), as can be seen from FIG. 18B.

FIGS. 19 through 23 are diagrams schematically illustrating various integrated circuits which may include a plurality of electrically configurable ballistic devices, in accordance with various embodiments of the present disclosure.

Figure 19:
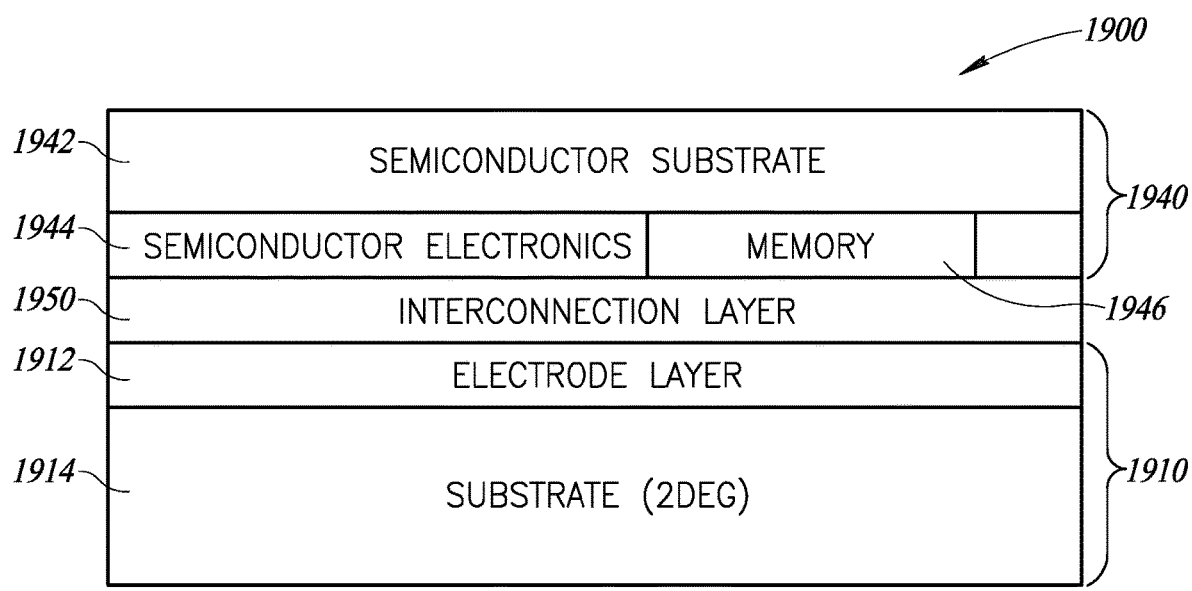
FIG. 19 is a diagram illustrating an integrated circuit (IC), in accordance with one or more embodiments of the present disclosure.

FIG. 19 is a diagram illustrating an integrated circuit (IC) 1900, in accordance with one or more embodiments of the present disclosure. The IC 1900 may include a ballistic chip 1910, a semiconductor chip 1940, and an interconnection layer 1950 between the ballistic chip 1910 and the semiconductor chip 1940.

The ballistic chip includes a first substrate 1914, which may be, for example, any substrate including a heterostructure, such as the heterostructure 14 described previously herein and which may include a first layer 14a, a second layer 14b, and a 2 DEG layer 16 between the first and second layers 14a, 14b. The electrode layer 1912 may be a layer which includes a plurality of confinement electrodes and/or control electrodes, such as any of the various confinement and/or control electrodes as previously described herein. Accordingly, a plurality of ballistic devices, of any type, shape, size, or the like may be defined, for example, by application of suitable voltages to the various confinement and/or control electrodes in the electrode layer 1912. In some embodiments, the electrode layer 1912 may include one or more arrays of confinement electrodes, each of which confinement electrodes may be selectively activated to produce ballistic devices having any shape and to form networks or circuits of ballistic devices of any type. This will be discussed later herein, for example, with respect to FIGS. 24 and 25.

The semiconductor chip 1940 may be any semiconductor chip or integrated circuit and may include, for example, a substrate 1942, which may be a semiconductor substrate such as a silicon substrate. Semiconductor electronics 1944 may be formed in or otherwise positioned on the substrate 1942. The semiconductor electrodes 1944 may include any semiconductor devices or circuitry, such as a plurality of transistors or other semiconductor devices, as well as processing circuitry, control circuitry, or the like. The semiconductor chip 1940 may further include memory 1946, for example a non-volatile memory, which may be formed in or otherwise positioned on the substrate 1942. The non-volatile memory 1946 may store any information and the stored information may be accessed by the semiconductor electronics 1944, for example, to control an operation of the semiconductor electronics 1944, the electrode layer 1912, the non-volatile memory 1946, and/or any other external devices which may be electrically or communicatively coupled with the IC 1900 using standard techniques, and it is not shown here to simplify description and drawings. In some embodiments, the non-volatile memory 1946 may store configuration parameters of a variety of ballistic devices which may be implemented in the ballistic chip 1910, for example, by the electrode layer 1912.

The interconnection layer 1950 may be positioned between the ballistic chip 1910 and the semiconductor chip 1940 and may include a plurality of wirings or interconnects which electrically and communicatively couple the ballistic chip 1910 and the semiconductor chip 1940. The interconnection layer 1950 may include any conventional interconnection structures, including for example, solder bumps, through semiconductor vias (TSVs), interposers, or the like.

As noted above, the non-volatile memory 1946 may store configuration parameters for a variety of ballistic devices which may be implemented in the ballistic chip 1910. The IC 1900 may thus provide functionality similar in some ways to a field programmable gate array (FPGA). For example, similar to a FPGA, the IC 1900 can be utilized to program or configure circuits to be implemented in particular devices. For example, any of a variety of circuits may be implemented by programming or configuring the various ballistic devices in the ballistic chip 1910, which may be controlled by the semiconductor electronics 1944 based on configuration parameters stored in the non-volatile memory 1946. However, the IC 1900 has significant advantages over traditional FPGAs. For example, the IC 1900 can reprogram and reverse any of the ballistic devices which may be formed in the ballistic chip 1910. This is because the ballistic devices are electrically configurable. That is, the boundaries of the ballistic devices (e.g., the ballistic boundaries formed in the 2 DEG layer 16) are not physical boundaries and in fact can be formed, modified, and even removed in response to application of various different confinement or control voltages. The boundaries of the ballistic devices of the ballistic chip 1910 are electrically and dynamically configurable and reconfigurable. Moreover, the ballistic devices of the ballistic chip 1910 can have various different characteristics, geometries, or the like which may be varied based on the applied confinement or control voltages. More in details, in a standard FPGA, it is not possible to modify any elementary component, like a transistor. On the contrary, the IC 1900 can modify any elementary component of the ballistic chip 1910 and any connection among them and with semiconductor chip 1940. For example, a digital circuit may become an analog circuit, or an RF circuit, or a power circuit, or a mixed signal circuit, or a neural network, or a fuzzy logic, or miscellanea also in agreement with the state of art.

Advantageously, IC 1900 may be configured or programmed to work as a digital circuit and then it will be tested for example at wafer level or package level or inside customer application, as a digital circuit, and after the IC 1900 may be configured to work as another circuit that may be for example full digital, partially digital or not. Then, a standard Automatic Test Pattern Generator (ATPG) may be used to generate test vectors to test IC 1900 using scan chains, as known by a technician skilled in the art.

In some embodiments, a defective area of the IC 1900 (such as a defective area including one or more defective ballistic devices or circuitry within the ballistic chip 1910) can identified by testing, and the defective area can be isolated, for example, by avoiding the defective area in the various circuit configurations that are implemented by programming the ballistic devices in the ballistic chip 1910. In some embodiments, the location of the defective area can be programmed into the IC 1900 and stored, for example, in the memory 1946. The portions of any of the variety of circuits that may be implemented by programming or configuring the various ballistic devices in the ballistic chip 1910, which would otherwise have been created in the defective area, can instead be created in another, non-defective area of the IC 1900, thereby increasing production yield in semiconductor manufacturing. In some embodiments, the IC 1900 may include an on line testing feature, which may be partially or fully included in the IC 1900. For example, the on line testing feature may include test instructions which may be stored in the memory 1946, and may utilize, for example, the semiconductor electronics 1944 to generate electrical test stimuli, for example test vectors, for testing the various ballistic devices in the ballistic chip 1910. The on line test feature may facilitate testing of the IC 1900, by the IC 1900 itself, at various stages of the lifetime of the IC 1900. For example, the on line testing may be performed on final application of the IC 1900, and also may be performed at various points during the lifetime of the IC 1900 (e.g., during the service life of the IC 1900). In the event that a portion of the IC 1900 (such as a portion of the ballistic chip 1910) fails sometime during the service life of the IC 1900, such as due to aging, the IC 1900 can be dynamically repaired. For example, the IC 1900 can be repaired by reconfiguring at least partially the IC 1900, remapping or reconfiguring or moving the fail circuit in another area of the IC 1900 (e.g., by implementing the intended circuit in one or more ballistic devices in a different area of the ballistic chip 1910). Then, the IC 1900 may be repaired during its life on final application, increasing its life and reliability. Then a complex circuit may be partitioned in simple or elementary circuits, allowing the remapping of at least one of them in another area of IC 1900 in case of failure of at least one component or structure of the simple circuit.

Figure 30:
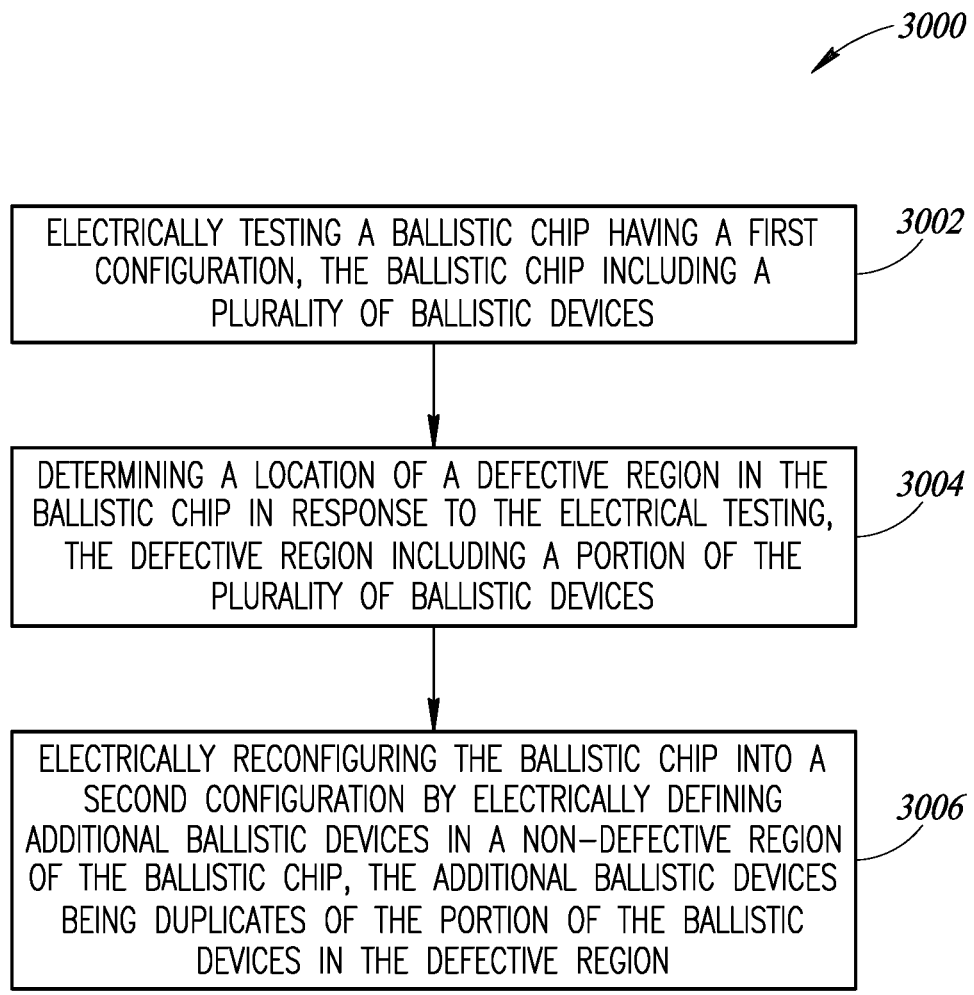
FIG. 30 is a flowchart illustrating a method of electrically testing and reconfiguring a ballistic chip, in accordance with one or more embodiments of the present disclosure.

FIG. 30 is a flowchart illustrating a method 3000 for electrically testing and reconfiguring a ballistic chip, such as the ballistic chip 1910. At block 3002, the method 3000 includes electrically testing a ballistic chip having a first configuration. The ballistic chip includes a plurality of ballistic devices. The ballistic chip may further include a two-dimensional electrode gas (2 DEG) layer 16, and the plurality of ballistic devices may have selectively definable ballistic boundaries within the 2 DEG layer.

The electrical testing at block 3002 may be performed at any point during the manufacture or during the service life of the ballistic chip 1910. For example, in some embodiments, the electrical testing may be performed at the wafer level or package level before an integrated circuit 1900 which includes the ballistic chip is incorporated into a particular consumer application. The electrical testing may be performed, for example, by an ATPG which generates electrical test vectors to test the ballistic chip. In some embodiments, the electrical testing at block 3002 may be performed by the integrated circuit itself 1900 itself at any time during the lifetime of the IC 1900. For example, the semiconductor electronics 1944 in the IC 1900 may generate electrical test stimuli, for example test vectors, for electrically testing the ballistic chip 1910.

At block 3004, the method 3000 includes determining a location of a defective region in the ballistic chip 1910 in response to the electrical testing. The defective region includes a portion of the plurality of ballistic devices of the first configuration. The defective region may be identified, for example, based on measured or monitored outputs of the ballistic devices in response to the application of the electrical stimuli. In some embodiments, the IC 1900 itself may measure or monitor the outputs of the ballistic devices during the electrical testing to identify the defective region. The defective region may be identified based on deviations from expected or normal outputs of the ballistic devices in response to the electrical testing.

At block 3006, the method 3000 includes electrically reconfiguring the ballistic chip 1910 into a second configuration by electrically defining additional ballistic devices in a non-defective region of the ballistic chip 1910. The additional ballistic devices may be duplicates of the portion of the ballistic devices in the defective region identified at block 3004. As such, the circuitry, such as logical functions or the like, which are intended to be implemented by the ballistic devices in the defective region may be instead provided in a non-defective region by dynamically reconfiguring the ballistic chip 1910 to form those same ballistic devices in a non-defective region of the ballistic chip 1910. In some embodiments, the ballistic devices included in the defective region may be electrically isolated from the other ballistic devices in the ballistic chip 1910, for example, by deactivating the ballistic devices in the defective region, such as by not applying confinement voltages to such ballistic devices. Moreover, in some embodiments, the location of the defective region, including the identification of any ballistic devices in the defective region, may be stored in the memory 1946 of the IC 1900, and the defective region may be avoided or otherwise bypassed in any of the various configurations which may be implemented by the IC 1900. The additional ballistic devices may be created by applying confinement voltages to confinement electrodes in the non-defective region of the ballistic chip 1910.

Figure 20:
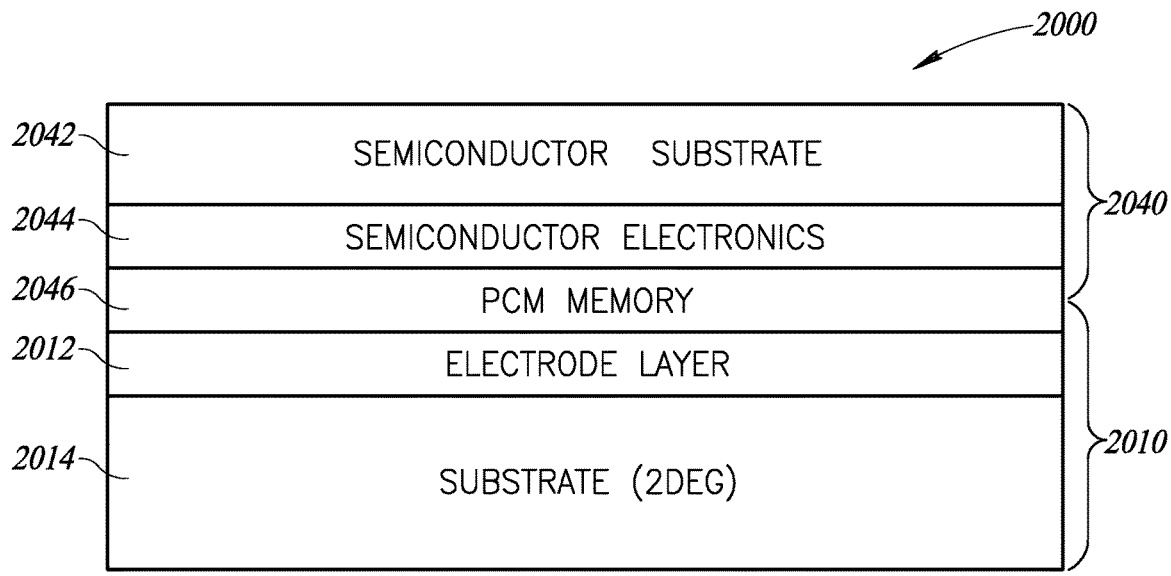
FIG. 20 is a diagram illustrating an integrated circuit (IC), in accordance with one or more embodiments of the present disclosure.

FIG. 20 is a diagram illustrating an integrated circuit (IC) 2000, in accordance with one or more embodiments of the present disclosure. The IC 2000 may include many of the same features and functionalities as described above with respect to the IC 1900, and description of such features and functionalities may be omitted with respect to the IC 2000 in the interests of clarity and brevity.

The IC 2000 may include a ballistic chip 2010 and a semiconductor chip 2040. The ballistic chip 2010 of the IC 2000 may be substantially the same as the ballistic chip 1910 of the IC 1900. For example, the ballistic chip 2010 may include a first substrate 2014, which may be substantially the same as the first substrate 1914 of the IC 1900, and the IC 2000 may further include an electrode layer 2012, which may be substantially the same as the electrode layer 1912 of the IC 1900.

The semiconductor chip 2040 may include a semiconductor substrate 2042, which may be substantially the same as the semiconductor substrate 1942 of the IC 1900. Additionally, the semiconductor chip 2040 may include semiconductor electronics 2044 which may be formed in or otherwise positioned on the substrate 2042.

One difference between the IC 2000 and the IC 1900 is that the IC 2000 includes a phase change memory (PCM) 2046. The PCM 2046 can be integrated into either the ballistic chip 2010 or the semiconductor chip 2040, and may physically, electrically, and/or communicatively connect the ballistic chip 2010 to the semiconductor chip 2040.

Operation of the IC 2000 may be substantially similar to that of the IC 1900 described above. For example, the PCM 2046 may store configuration parameters for a variety of ballistic devices which may be implemented in the ballistic chip 2010. Any of a variety of circuits may be implemented by programming or configuring the various ballistic devices in the ballistic chip 2010, which may be controlled by the semiconductor electronics 2044 based on configuration parameters stored in the PCM 2046.

Figure 21:
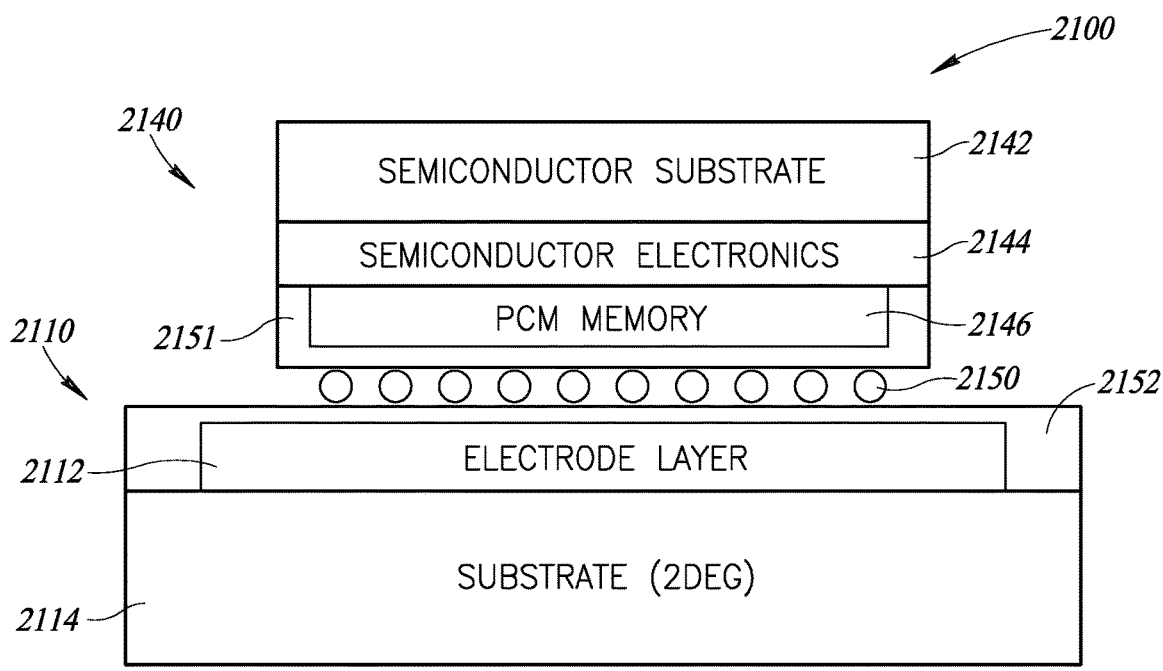
FIG. 21 is a diagram illustrating an integrated circuit (IC), in accordance with one or more embodiments of the present disclosure.

FIG. 21 is a diagram illustrating an integrated circuit (IC) 2100, in accordance with one or more embodiments of the present disclosure. The IC 2100 may include many of the same features and functionalities as described above with respect to the IC 1900 and/or the IC 2000, and description of such features and functionalities may be omitted with respect to the IC 2100 in the interests of clarity and brevity.

The IC 2100 may include a ballistic chip 2110 and a semiconductor chip 2140 that are coupled to one another in a face to face (F2F) configuration. The ballistic chip 2110 and the semiconductor chip 2140 may be physically, electrically, and/or communicatively coupled to each other, for example, by bumps 2150 which may be solder bumps.

The ballistic chip 2110 of the IC 2100 may include a first substrate 2114 and an electrode layer 2112 which may be substantially the same as previously described herein with respect to various embodiments of ICs. The ballistic chip 2110 may further include an interconnect layer 2152 which may be electrically or communicatively coupled to a corresponding interconnect layer 2151 on the semiconductor chip 2140.

The semiconductor chip 2140 may include a semiconductor substrate 2142, semiconductor electronics 2144, and PCM 2146, each of which may be substantially the same as previously described herein with respect to various embodiments of ICs.

Figure 22:
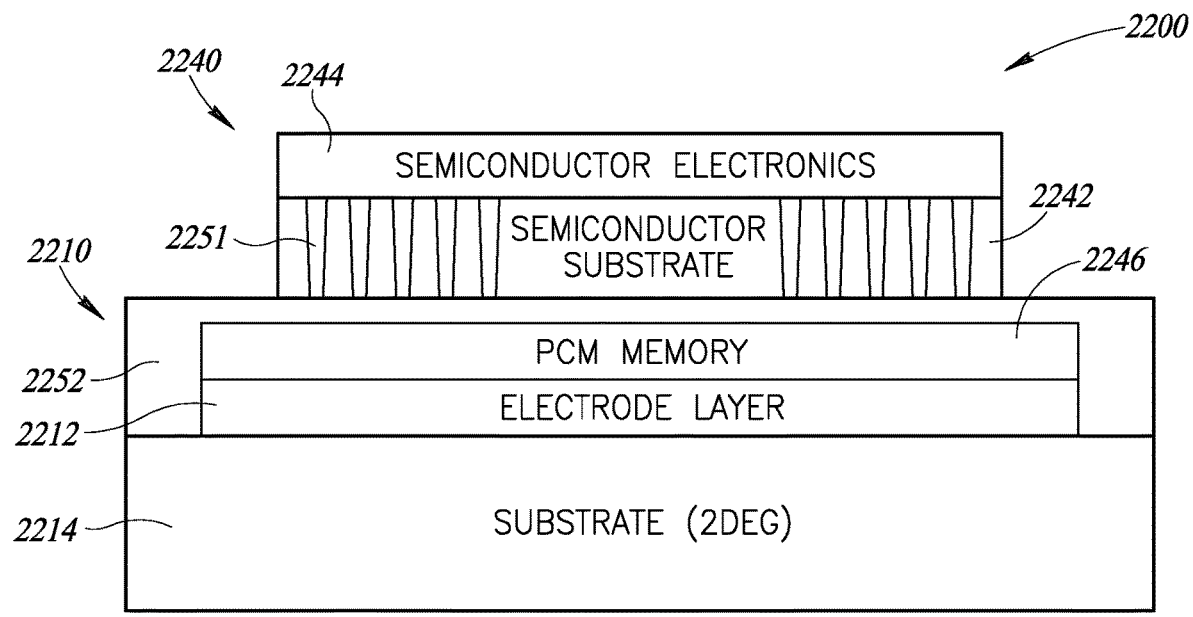
FIG. 22 is a diagram illustrating an integrated circuit (IC), in accordance with one or more embodiments of the present disclosure.

FIG. 22 is a diagram illustrating an integrated circuit (IC) 2200, in accordance with one or more embodiments of the present disclosure. The IC 2200 may include many of the same features and functionalities as described above with respect to various embodiments of ICs, and description of such features and functionalities may be omitted with respect to the IC 2200 in the interests of clarity and brevity.

The IC 2200 may include a ballistic chip 2210 and a semiconductor chip 2240 that are coupled to one another in a face to back (F2B) configuration. For example, a backside of the semiconductor chip 2240 may be physically coupled to a front side or face of the ballistic chip 2210. The ballistic chip 2210 may be electrically and/or communicatively coupled to the semiconductor electronics 2244 of the semiconductor chip 2240, for example, by Through-Semiconductor (or Through-Silicon) Vias (TSVs) 2251 which extend through the semiconductor substrate 2242 of the semiconductor chip 2240.

The ballistic chip 2210 of the IC 2200 may include a first substrate 2214, an electrode layer 2212, PCM 2246, and an interconnect layer 2252, each of which may be substantially the same as previously described herein with respect to various embodiments of ICs. The interconnect layer 2252 of the ballistic chip 2210 may be electrically or communicatively coupled to the semiconductor electronics 2244 of the semiconductor chip 2240, for example, through the TSVs 2251.

Figure 23:
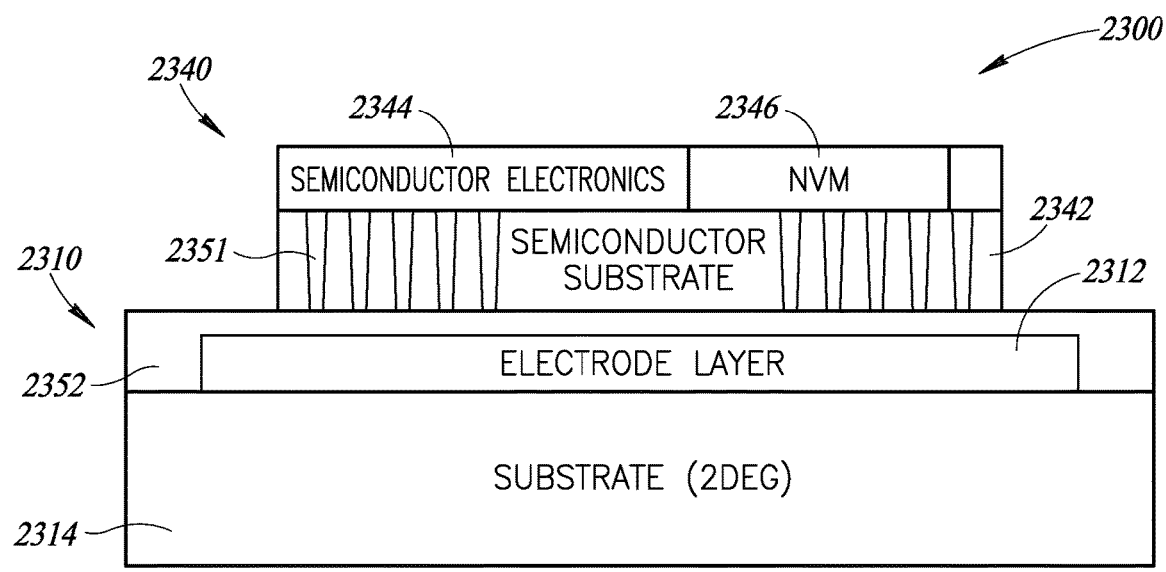
FIG. 23 is a diagram illustrating an integrated circuit (IC), in accordance with one or more embodiments of the present disclosure.

FIG. 23 is a diagram illustrating an integrated circuit (IC) 2300, in accordance with one or more embodiments of the present disclosure. The IC 2300 may include many of the same features and functionalities as described above with respect to various embodiments of ICs, and description of such features and functionalities may be omitted with respect to the IC 2300 in the interests of clarity and brevity.

The IC 2300 may include a ballistic chip 2310 and a semiconductor chip 2340 that are coupled to one another in a face to back (F2B) configuration. The ballistic chip 2310 may be electrically and/or communicatively coupled to the semiconductor electronics 2344 of the semiconductor chip 2340, for example, by TSVs 2351 which extend through the semiconductor substrate 2342 of the semiconductor chip 2340. Similarly, the ballistic chip 2310 may be electrically and/or communicatively coupled to the non-volatile memory 2346 of the semiconductor chip 2340 by the TSVs 2351.

The ballistic chip 2310 of the IC 2300 may include a first substrate 2314, an electrode layer 2312, and an interconnect layer 2352, each of which may be substantially the same as previously described herein with respect to various embodiments of ICs. The interconnect layer 2352 of the ballistic chip 2310 may be electrically or communicatively coupled to the semiconductor electronics 2344 and the non-volatile memory 2346 of the semiconductor chip 2340, for example, through the TSVs 2351.

FIGS. 24A through 24C are top plan views illustrating various different arrays of confinement electrodes, in various embodiments. Each of the various arrays of confinement electrodes may be implemented, for example, in the electrode layers of the various ICs described above. The arrays of confinement electrodes shown in FIGS. 24A through 24C provide only some examples of confinement electrode arrays which may be implemented in various embodiments of the disclosure.

As shown in FIG. 24A, an array 2410 of confinement electrodes 2480 may be arranged in a plurality of rows and columns. Each of the confinement electrodes 2480 may be substantially square shaped, as shown in the top plan view. The confinement electrodes 2480 may have any sizes or dimensions, and in some embodiments, the dimensions of the confinement electrodes 2480 (e.g., height, width, and/or length) may be within a range of a few nm to 1 mm or greater. The size of the confinement electrodes 2480 in various embodiments may be limited only by process constraints. That is, the confinement electrodes 2480 may have any size as may be produced by any processing techniques, such as any conventional processing techniques for forming electrodes on a structure such as a heterostructure 14.

FIG. 24B illustrates an example array 2411 of confinement electrodes which have a triangular shape. The confinement electrodes may include a plurality of first confinement electrodes 2481*a* which are respectively arranged adjacent to a corresponding one of a plurality of second confinement electrodes 2481*b*. The first and second confinement electrodes 2481*a*, 2481*b* may have a substantially same shape, but they are oriented such that a long side or hypotenuse of each of the triangular shaped first confinement electrodes 2481*a* faces a corresponding long side or hypotenuse of an adjacent second confinement electrode 2481*b*.

FIG. 24C illustrates an example array 2412 of confinement electrodes which have a triangular shape. The confinement electrodes may include a plurality of first confinement electrodes 2482a which are respectively arranged adjacent to a corresponding one of a plurality of second confinement electrodes 2482b. The first and second confinement electrodes 2482a, 2482b may have a substantially same shape, but they are oriented such that a long side or hypotenuse of each of the triangular shaped first confinement electrodes 2482a faces a corresponding long side or hypotenuse of an adjacent second confinement electrode 2482b. Moreover, the orientation of adjacent pairs of first and second confinement electrodes 2482a, 2482b may be alternately arranged (e.g., in the row and/or column direction), as shown.

The array configurations shown in FIGS. 24A through 24C are provided as just a few examples of array configurations which may be included in various embodiments of the present disclosure. It should be readily appreciated that embodiments of the present disclosure may include array configurations of confinement electrodes having any shapes, sizes, dimensions, and which may be ordered in any pattern or layout.

Figure 25A:
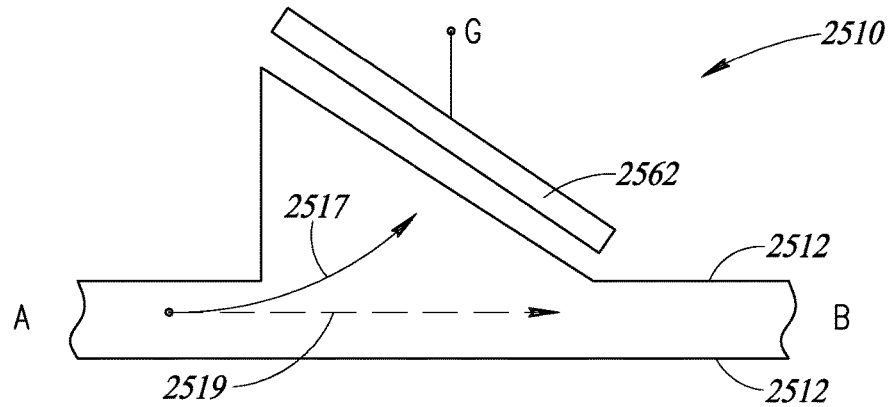
FIG. 25A is a diagram schematically illustrating a ballistic device, in accordance with one or more embodiments of the present disclosure.

Each of the confinement electrodes of an array of confinement electrodes may be individually programmed (e.g., may be individually applied with a confinement or control voltage) to produce ballistic devices having ballistic boundaries in an underlying 2 DEG layer 16 of any shape or geometry. As noted above, the arrays of confinement electrodes may be included, for example, in an electrode layer of an IC in accordance with various embodiments, and may be configured based on information stored in non-volatile or phase change memory which may be included in a ballistic chip and/or in a semiconductor chip. FIG. 25A is a diagram schematically illustrating a ballistic device 2510, in accordance with one or more embodiments. The ballistic device 2510 may be a three-terminal ballistic transistor, which may be substantially similar as three-terminal ballistic devices previously described herein. The ballistic device 2510 includes confinement electrodes 2512 which may be applied with a confinement voltage (e.g., $V_{REF}$) to set outer boundaries of a conduction channel within the 2 DEG layer 16. The ballistic device 2510 further includes a control electrode 2562 which may cause a current within the conduction channel to deflect away from a first path 2519 and toward the control electrode 2562 along a second path 2517.

Figure 25B:
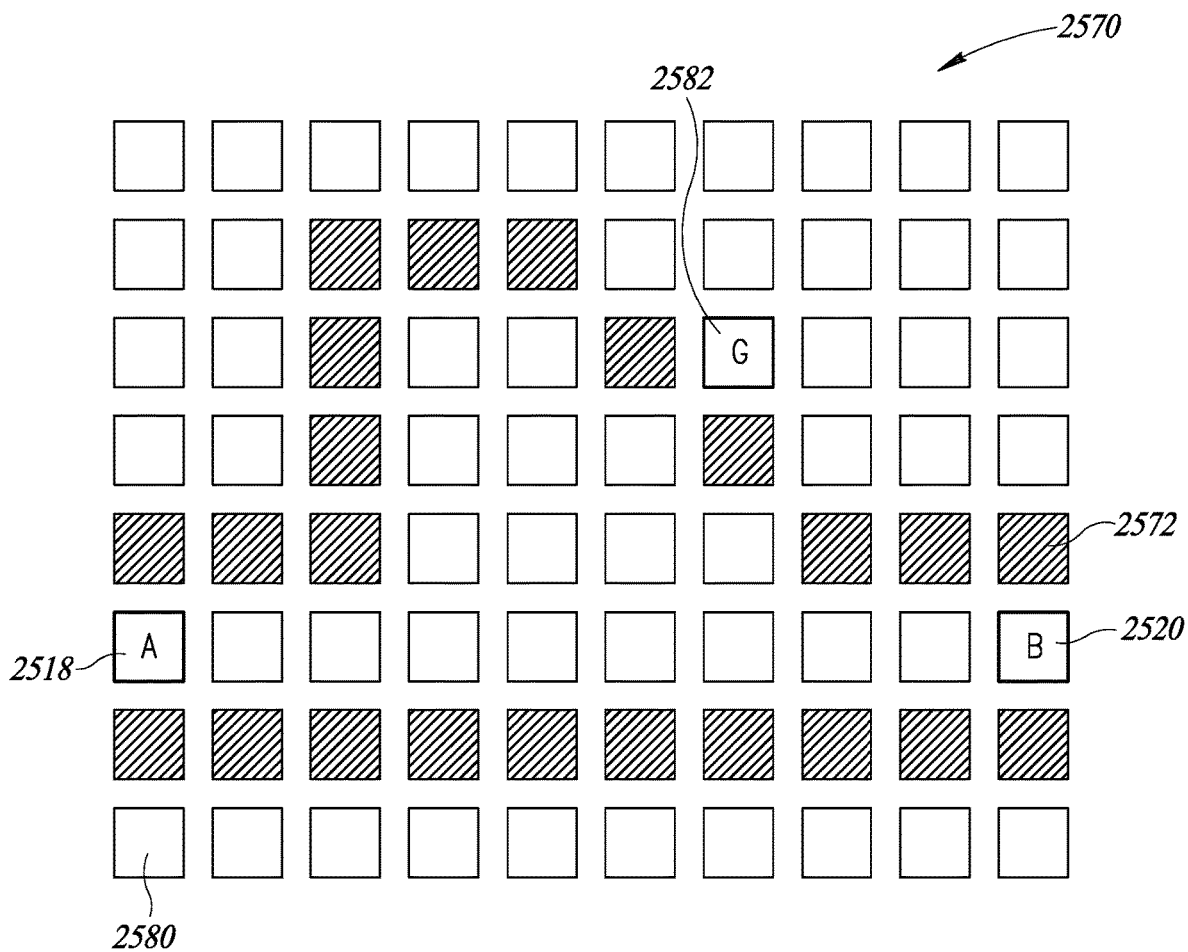
FIG. 25B is a top plan view illustrating implementation of the ballistic device shown in FIG. 25A in an array of confinement electrodes.

FIG. 25B is a top plan view illustrating implementation of the ballistic device 2510 shown in FIG. 25A in an array 2570 of confinement electrodes 2580. The array 2570 of confinement electrodes 2580 may include a plurality of confining electrodes which may be formed on the heterostructure 14 and which may be operable to generate space charge regions which interrupt the underlying 2 DEG layer 16, thereby forming ballistic boundaries for the device. The array 2570 may further include a plurality of signal electrodes, which may be electrodes that are electrically coupled to the underlying 2 DEG layer 16 and which may apply a signal or current which is transmitted through the 2 DEG layer 16 to another signal electrode. The signal electrodes may be directly electrically coupled to the 2 DEG layer 16, for example, by conductive vias or the like.

The confinement electrodes 2512 of the ballistic device 2510 may be implemented in the array 2570 by application of a confinement voltage to a plurality of confining electrodes 2572 to produce ballistic boundaries in the 2 DEG layer 16 of a desired shape. The control electrode 2562 of the ballistic device 2510 may be implemented in the array 2570 by application of a control voltage to at least one electrode 2582, which may be a confining electrode in the sense that it is formed on the heterostructure 14. The input and output electrodes of the ballistic device 2510 may be implemented as signal electrodes 2518, 2520, respectively, in the array 2570. Thus, a signal or current may be input through the input signal electrode 2518 (which may be directly electrically coupled to the underlying 2 DEG layer 16), and the signal or current may pass through the conduction channel that is defined by the ballistic boundaries formed beneath the confining electrodes 2572 which are applied with the confinement voltage. The input signal or current may pass to the output signal electrode 2520 when a control voltage is not applied to the control electrode 2582, and the input signal or current may be selectively blocked from passing to the output signal electrode 2520 by selective application of the control voltage to the control electrode 2582.

As discussed above, the arrays of confinement electrodes may be included, for example, in an electrode layer of an IC in accordance with various embodiments, and may be configured based on information stored in non-volatile or phase change memory which may be included in a ballistic chip and/or in a semiconductor chip. For example, the input signal electrode 2518, the output signal electrode 2520, and the control electrode 2582 may be electrically coupled through vias or the like to input/output contacts of a ballistic chip and may be controlled, for example, by semiconductor electronics in a semiconductor chip. The confining electrodes which make up the confinement boundaries of the ballistic devices may similarly be electrically coupled to semiconductor electronics or the like in a semiconductor chip. The various configurations of ballistic devices which may be formed or implemented in an array of confinement electrodes may be stored in memory of an IC, such as non-volatile or phase change memory which may be included in a ballistic chip and/or a semiconductor chip.

The ballistic device 2510 is provided as just one example of ballistic devices that may be implemented in an array of confinement electrodes. It will be readily appreciated that any ballistic devices, including any of the ballistic devices described herein, may be implemented in such an array of confinement electrodes. The ballistic devices may have any geometry, shape, characteristics, or the like.

The array 2570 of confinement electrodes 2580 can be tested as a digital circuit as explained with reference to FIG. 19 and a method to test the two possible states of an electrode 2580 (e.g., creating or not a space charge region), an IC, similar to one the various ICs described above, can be configured at least in two different circuits, for example at least two different digital circuits.

Figure 26:
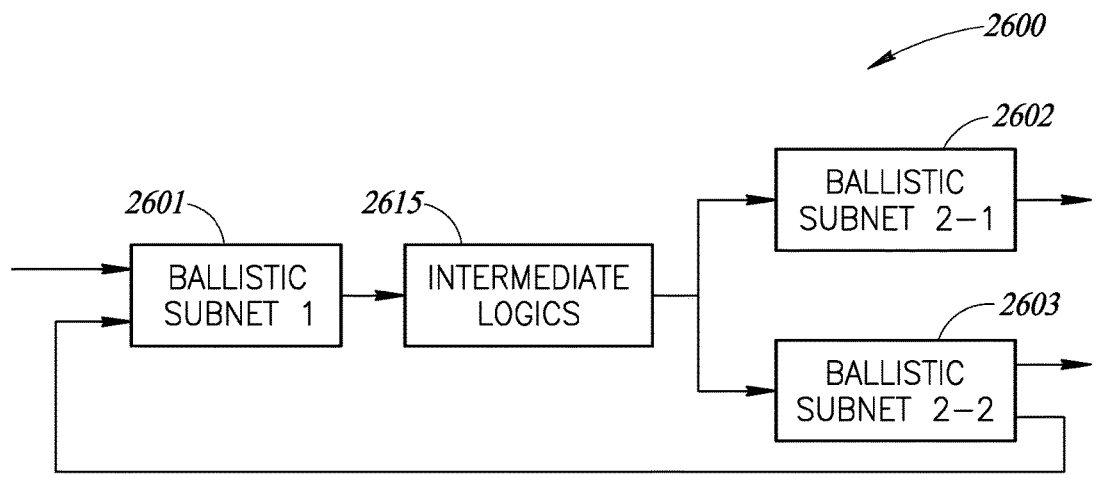
FIG. 26 is a block diagram illustrating a network of ballistic devices, in accordance with one or more embodiments of the present disclosure.

FIG. 26 is a block diagram illustrating an embodiment of a network 2600 of ballistic devices, in accordance with one or more embodiments of the present disclosure. The network 2600 may be a self-programming network that is capable of programming itself, for example, to implement ballistic devices or ballistic circuits of any particular shape, geometry, type, or the like.

The network 2600 may include a first ballistic subnet 2601 which provides an output to intermediate logics 2615. The intermediate logics 2615 may selectively provide output data to any of a plurality of second subnets, such as a second subnet 2-1 2602 or a second subnet 2-2 2603. The intermediate logics 2615 may be for example a digital circuit, or a neural network, or a fuzzy logic.

Each of the ballistic subnets 2601, 2602, 2603 may be implemented in a ballistic chip, for example, with a plurality of confinement electrodes which may be included in an electrode layer of the ballistic chip to define ballistic boundaries in a 2 DEG layer which may be included in the substrate of the ballistic chip. Additionally, in some embodiments, the intermediate logics 2615 may be included in the ballistic chip or it may be included in a semiconductor chip (such as in semiconductor electronics of a semiconductor chip) that is connected to the ballistic chip. The intermediate logics 2615 may include any semiconductor or ballistic devices which may implement one or more logical functions, for example, based on an input signal.

The first ballistic subnet 2601 may include a plurality of ballistic devices or circuits having any configuration and which may perform various operations, for example, on input signals. The first ballistic subnet 2601 may output one or more signals, which may be, for example, Boolean or analog signals. The intermediate logics 2615 may receive as input the output of the first ballistic subnet 2601. Based on the output of the first ballistic subnet 2601, the intermediate logics may determine how a subsequent subnet will or should be configured, whether it will exist, or it may select a next subnet from among a plurality of potential subnets that may be selected. That is, the intermediate logics 2615 may evaluate the output of the first ballistic subnet 2601 and decide which of a plurality of next subnets (e.g., the second subnet (2-1) 2601 or the second subnet (2-2) 2603) to provide an output signal to. The output signal of the intermediate logics 2615, in some embodiments, may be the signal that is output from the first ballistic subnet 2601.

Once the intermediate logics 2615 has determined which of a plurality of next subnets to provide the output signal to, the intermediate logics 2615 may cause that particular subnet to be formed, for example, by accessing information stored in the memory of the IC. For example, the intermediate logics 2615 may determine that the output signal should be provided to a particular ballistic subnet configuration, and the intermediate logics 2615 may therefore access the particular ballistic subnet configuration information that may be stored in memory. Accordingly, based on the configuration information stored in the memory, the particular ballistic subnet configuration (e.g., one of the second subnet (2-1) 2601 or the second subnet (2-2) 2602) may be formed, for example, in the ballistic chip of the IC. The particular ballistic subnet configuration may be formed by application of suitable confinement and control voltages to electrodes of the array of electrodes which may be present, for example, in the electrode layer of the ballistic chip.

While two second subnets are described in this example (e.g., the second subnet (2-1) 2601 and the second subnet (2-2) 2602), embodiments of the present disclosure are not limited thereto. In various embodiments, any number of ballistic subnet configurations may be created or partly reconfigured according to one of several variants based on, for example, an output of a first ballistic subnet 2601 and the evaluation of that output, for example, by the intermediate logics 2615. Moreover, in some embodiments, the intermediate logics 2615 may modify the configuration parameters or information stored in the memory, such that the intermediate logics 2615 may cause new ballistic subnet configurations to be stored in the memory. The ballistic subnets created based on, for example, an output of a first ballistic subnet 2601 and the evaluation of that output, for example, by the intermediate logics 2615, may alternatively occupy partly or entirely overlapping areas on the chip.

At least part of network 2600 may have a closed loop configuration and at least part of network 2600 may be modified dynamically, for example in agreement with an optimal criteria or fitness function. Considering that is possible to modify any elementary component, network 2600 may be used to create for example a self-learning system or an adaptive system. The topology and the number of blocks of network 2600 is not limitative, and can be modified in agreement with expected results.

Figure 27:
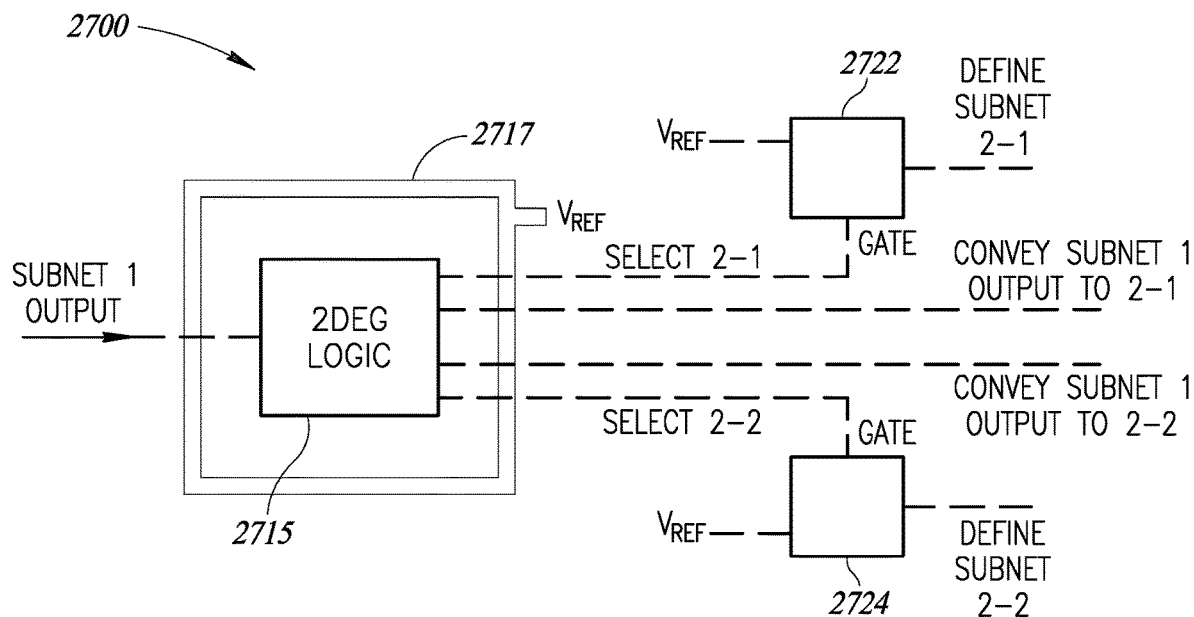
FIG. 27 is a block diagram illustrating a network of ballistic devices, in accordance with one or more embodiments of the present disclosure.

FIG. 27 is a block diagram illustrating a network 2700, in accordance with one or more embodiments. The network 2700 may be substantially similar to the network 2600 shown in FIG. 26. In the network 2700, at least part of the functionality, and in particular the intermediate logics, may be implemented by 2 DEG logic 2715 which includes one or more 2 DEG devices, like a high electron mobility transistor (HEMT). The 2 DEG logic 2715 may include a plurality of HEMTs arranged in one or more circuits to implement one or more logical functions based on one or more input signals, such as the input signals provided to the 2 DEG logic 2715 as output by the first subnet (Subnet 1output). The 2 DEG logic 2715 may be implemented in a same ballistic chip as any of a plurality of ballistic subnets, such as the ballistic subnets 2601, 2602, 2603 shown in FIG. 26.

Based on the Subnet 1 output, the 2 DEG logic 2715 may create or otherwise or partly reconfigure according to one of several variants a next ballistic subnet (e.g., Subnet 2-1 or Subnet 2-2). For example, the 2 DEG logic 2715 may output a selection signal (Select 2-1 or Select 2-2) to one or more control devices 2722, 2724, which may then output a respective control signal (Define subnet 2-1 or Define subnet 2-2) to cause the selected ballistic subnet to be created or to receive the output of the first subnet (Convey subnet 1 output to 2-1 or Convey subnet 1 output to 2-2). The selected ballistic subnet may be created, for example, by providing a confinement voltage ($V_{REF}$) to the confinement electrodes (e.g., in an array of confinement electrodes) which correspond to the selected ballistic subnet, thereby forming the ballistic boundaries of the ballistic devices of the selected ballistic subnet.

In some embodiments, the 2 DEG logic 2715 may be surrounded by an insulating ring 2717, which may insulate the 2 DEG logic 2715 from the ballistic devices, which may be formed in the same ballistic chip as the 2 DEG logic 2715. The insulating ring 2717 may thus reduce or prevent interference (e.g., crosstalk through the 2 DEG layer 16) between the 2 DEG logic 2715 and the various ballistic devices on the same ballistic chip. In some embodiments, the insulating ring 2717 may be electrically activated, as will be described with respect to FIG. 28A.

Figure 28A:
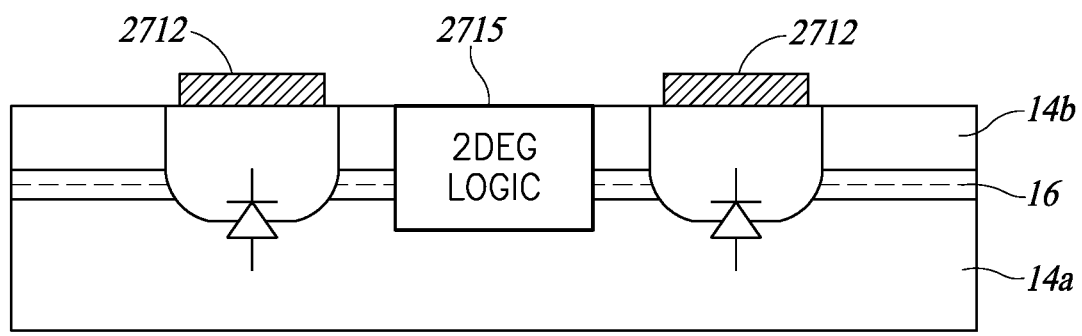
FIG. 28A is a cross-sectional view illustrating an electrically activated insulating ring, which may be included in the network shown in FIG. 27.

FIG. 28A is a cross-sectional view illustrating an electrically activated insulating ring, which may be implemented as the insulating ring 2717 of the network 2700 shown in FIG. 27. The electrically activated insulating ring includes an isolation electrode 2712 which laterally surrounds the 2 DEG logic 2715. For example, the isolation electrode 2712 may be formed on the second layer 14b of the heterostructure 14. The 2 DEG logic 2715 may be similarly formed on or in the heterostructure 14.

The isolation electrode 2712 is operable to selectively electrically isolate the 2 DEG logic 2715 from neighboring ballistic devices or ballistic subnets. For example, upon application of a suitable voltage (e.g., the confinement voltage $V_{REF}$) to the isolation electrode 2712, the 2 DEG layer 16 may be interrupted by space charge regions generated beneath the isolation electrode 2712, which electrically isolates the HEMT logic 2715 from the neighboring ballistic devices or subnets.

Figure 28B:
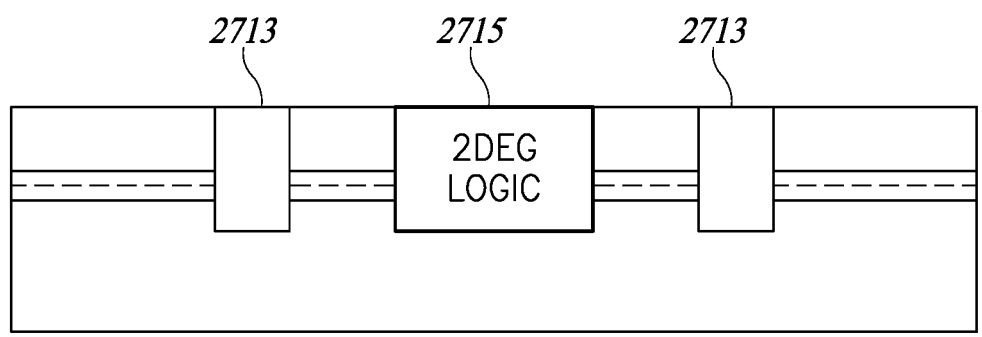
FIG. 28B is a cross-sectional view illustrating an insulating ring, which may be included in the network shown in FIG. 27.

FIG. 28B is a cross-sectional view illustrating an insulating ring 2713, which may be implemented as the insulating ring 2717 of the network 2700 shown in FIG. 27. The insulating ring 2713 may be a ring that is etched to a depth which interrupts the 2 DEG layer 16 surrounding the 2 DEG logic 2715, and the trench formed by etching may be filled with an insulating material, such as a dielectric material. Accordingly, the insulating ring 2713 may isolate the 2 DEG logic 2715 from neighboring ballistic devices or ballistic subnets.

Figure 29A:
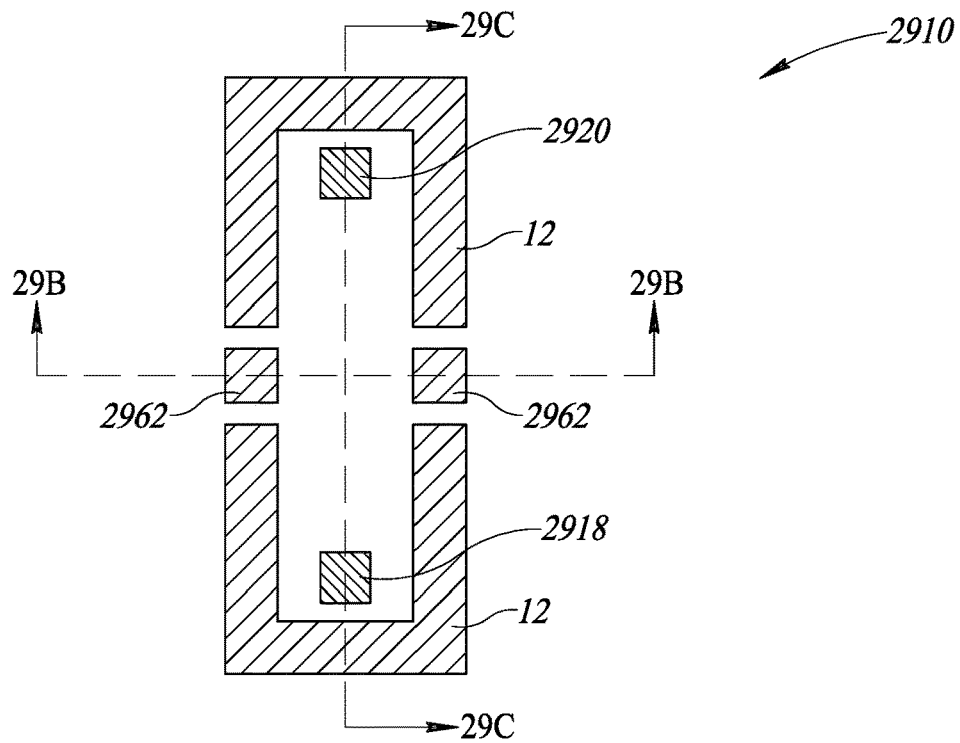
FIG. 29A is a top plan view illustrating a ballistic device which has V-shaped control electrodes and which may operate as a ballistic transistor, in accordance with one or more embodiments of the present disclosure.
Figure 29B:
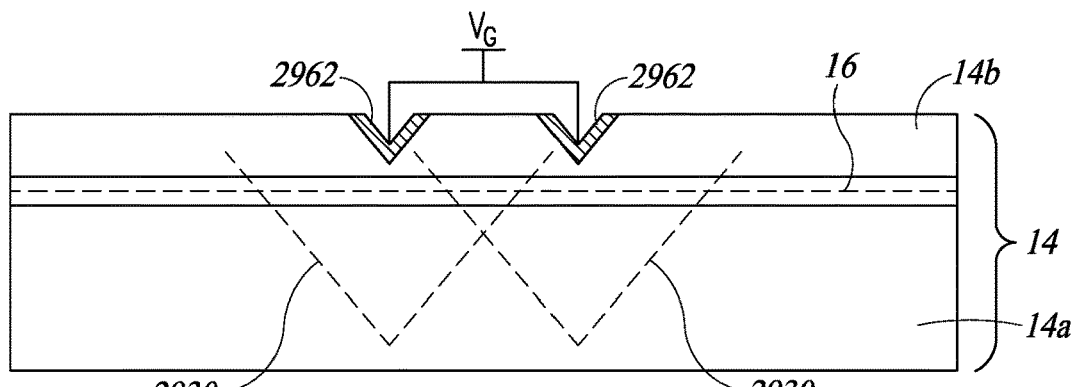
FIG. 29B is a cross-sectional view taken along a cut-line 29B-29B of the ballistic device shown in FIG. 29A, in accordance with one or more embodiments of the present disclosure.
Figure 29C:
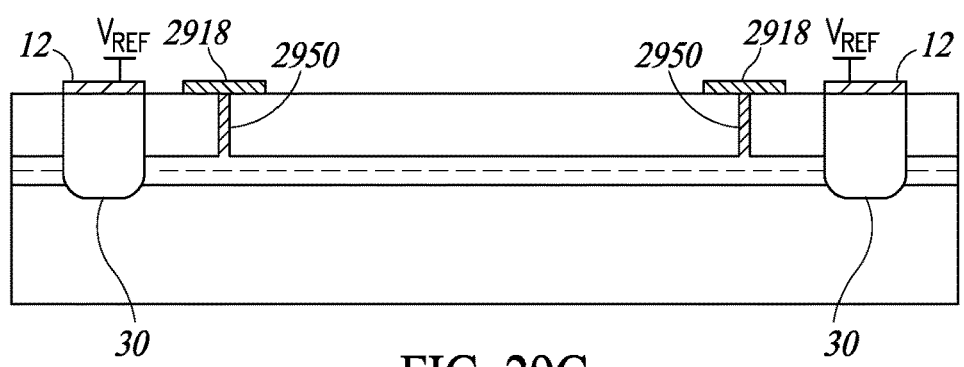
FIG. 29C is a cross-sectional view of the ballistic device along a cut-line 29C-29C of the ballistic device shown in FIG. 29A, in accordance with one or more embodiments of the present disclosure.

FIG. 29A is a top plan view illustrating a ballistic device 2910, FIG. 29B is a cross-sectional view of the ballistic device 2910 along a cut-line 29B-29B, and FIG. 29C is a cross-sectional view of the ballistic device 2910 along a cut-line 29C-29C, in accordance with one or more embodiments of the present disclosure.

The ballistic device 2910 may be a ballistic transistor, with an input terminal 2918 (e.g., a source terminal), an output terminal 2920 (e.g., a drain terminal), and one or more control terminals 2962 (e.g., gate terminals). The input and output terminals 2918, 2920 are spaced apart from one another along a first direction (e.g., along the vertical direction in the illustration of FIG. 29A), and the control terminals 2962 are spaced apart from one another along a second direction (e.g., along the horizontal direction in the illustration of FIG. 29A) that is transverse to the first direction.

The ballistic device 2910 may be substantially similar in some respects to other ballistic devices previously described herein. For example, the ballistic device 2910 includes the heterostructure 14, which may be the same as previously described herein, including, for example, a first layer 14a, a second layer 14b, and a 2 DEG layer 16 at the heterojunction between the first and second layers 14a, 14b.

Additionally, the ballistic device 2910 may include confinement electrodes 12 which may be substantially the same as or similar to any of the confinement electrodes previously described herein. In particular, the confinement electrodes 12 may be utilized to selectively define boundaries of the ballistic device 2910. For example, as shown in FIG. 29C, in response to an applied confinement voltage $V_{REF}$, the confinement electrodes 12 generate space charge regions 30 which define the boundaries of the ballistic device 2910 within the 2 DEG layer 16.

During use, the ballistic device 2910 permits a signal or current to pass through the 2 DEG layer 16 from the input electrode 2918 to the output electrode 2920. The input and output electrodes 2918, 2920 may be electrically coupled to the 2 DEG layer 16, for example, by electrical connections 2950, which may be vias, or the like. The flow of electrons within the ballistic device 2910 is confined by the boundaries set up by application of the confinement voltage $V_{REF}$ to the confinement electrodes 12. The control electrodes 2962 are operable to modulate the channel of the ballistic device 2910 (e.g., the region of the 2 DEG layer 16 that is confined within the boundaries provided by the confinement electrodes 12), and thus modulate the signal or current between the input electrode 2918 and the output electrode 2920.

The control electrodes 2962 are positioned on a non-planar or inclined surface, such as a non-planar or inclined surface of the second layer 14b of the heterostructure 14. In some embodiments, the control electrodes 2962 may be disposed in recesses that are formed in the second layer 14b, such that the control electrodes 2962 may have a non-planar or inclined shape with respect to an upper surface of the second layer 14b of the heterostructure 14. As shown in FIG. 29B, the control electrodes 2962 may have a substantially "V" shape in a cross-sectional view. The V-shape of the control electrodes 2962 may correspond to V-shaped recesses formed in the second layer 14b of the heterostructure 14.

The control electrodes 2962 are thus similar in function to the confinement electrode 1612 described previously herein with respect to FIGS. 16A to 16D. More particularly, due to the non-planar orientation of the control electrodes 2962 with respect to the 2 DEG layer 16, the control electrodes 2962 generate space charge regions 2930 which extend at varying depths into the heterostructure 14. That is, the space charge regions 2930 generated by the control electrodes 2962 have a shape corresponding to the non-planar shape of the control electrodes 2962 (e.g., generally V-shaped, or U-shaped, or simply planar).

As shown in FIG. 29B, when a suitable control voltage $V_G$ is applied to the control electrodes 2962, the control electrodes 2962 generate space charge regions 2930 which extend into and interrupt the underlying 2 DEG layer 16. The width of the space charge regions 2930, and thus the extent at which the space charge regions 2930 interrupt the 2 DEG layer 16 or modulate the conduction channel, may be controlled based on a magnitude of the applied control voltage $V_G$. For example, by increasing the magnitude of the control voltage $V_G$, the space charge regions 2930 may be widened. FIG. 29B illustrates application of the control voltage $V_G$ at a magnitude sufficient to generate the space charge regions 2930 to completely interrupt or pinch-off the channel (e.g., the underlying 2 DEG layer 16) in a lateral direction between the control electrodes 2962. Thus, in this state, the signal or current cannot travel between the input and output electrodes 2918, 2920, and the ballistic device 2910 is in an off state. This is similar to a FinFET working principle, but implemented in 2 DEG physics and using standard production equipment in semiconductor manufacturing.

Similarly, through application of a suitable control voltage $V_G$ (e.g., 0V, or any other voltage, which may depend upon a particular design, materials, dimensions, etc. of the ballistic device 2910), the ballistic device 2910 may similarly be placed into an on state in which a signal or current may be transmitted between the input and output electrodes 2918, 2920 through the conduction channel of the underlying 2 DEG layer 16.

Moreover, in some embodiments, the control electrodes 2962 may be operated to laterally modulate the conduction channel (e.g., the underlying 2 DEG layer 16) at various levels between complete interruption of the channel and no interruption. For example, based on a level of the applied control voltage $V_G$, the space charge regions 2930 generated by the control electrodes may only partially interrupt the channel between the input and output electrodes 2918, 2920 in the 2 DEG layer 16.

In various embodiments, the control electrodes 2962 may have various different angles of inclination, e.g., with respect to the upper surface of the second layer 14b of the heterostructure 14 and/or with respect to a plane of the underlying 2 DEG layer 16. By having various different angles of inclination of the control electrodes 2962, the control electrodes 2962 in various embodiments may generate space charge regions 2930 having various different shapes. Moreover, while the control electrodes 2962 of the ballistic device 2910 are shown in FIGS. 29A to 29C as having a V-shape, in various embodiments, the control electrodes 2962 may have any other non-planar shapes. For example, in some embodiments, the control electrodes 2962 may have a rounded, semi-circular or semi-hemispherical shape. In some embodiments, each of the control electrodes 2962 may include only a single non-planar segment (e.g., one half of the V-shape) which faces inward toward the conduction channel of the 2 DEG layer 16 between the control electrodes 2962.

Moreover, while the ballistic device 2910 is shown in FIGS. 29A to 29C as including two control electrodes 2962, embodiments provided herein are not limited thereto. In various embodiments, the ballistic device 2910 may include fewer or more than two control electrodes 2962. For example, in one or more embodiments, a single control electrode 2962 having a V-shape may be aligned between the input and output electrodes 2918, 2920 (e.g., along the cutline 29C-29C). By application of a suitable control voltage $V_G$, such a control electrode 2962 may generate a space charge region 2930 which completely interrupts the conduction channel of the 2 DEG layer 16 between the input and output electrodes 2918, 2920.

In various embodiments, the ballistic device 2910 may have one or more confinement electrodes 12 having any shape for defining desired boundaries of the conduction channel in the 2 DEG layer 16 between the input and output electrodes 2918, 2920.

In another embodiment, the ballistic device 2910 may be alone and the confinement electrodes 12 may be absent.

The various embodiments provided herein facilitate selective creation and/or configuration of ballistic devices. The ballistic devices may be selectively configured, for example, by application of a suitable voltage to one or more confinement electrodes which may form ballistic boundaries in an underlying 2 DEG layer. A variety of types of ballistic devices are provided in various embodiments, including ballistic diodes, ballistic transistors, reversible diodes, resistors, multiplexers, and so on. Additionally, in various embodiments, ballistic circuits are provided which may be composed of any of a plurality of ballistic devices.

Embodiments of the present disclosure provide ballistic devices which may be operated to have different characteristics depending on a magnitude of an applied confinement voltage.

The various embodiments provided herein may facilitate formation of reconfigurable ballistic devices and ballistic circuits, for example, in a ballistic chip, which may be included in an integrated circuit. This permits circuits to be selected, created, and modified based on any instructions, which may be stored for example in memory of the integrated circuit. In some embodiments, self-programming networks are provided which may select, create, and modify ballistic circuits.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electrically confined ballistic device, comprising:
   a heterostructure including:
      a first semiconductor layer,
      a second semiconductor layer on the first semiconductor layer, and
      a two-dimensional electrode gas (2DEG) layer between the first and second semiconductor layers;
   an input electrode electrically coupled to the 2DEG layer;
   an output electrode electrically coupled to the 2DEG layer; and
   a first confinement electrode on the heterostructure, the first confinement electrode, in use, generates first space charge regions, which at least partially define a boundary of the ballistic device within the 2DEG layer between the input electrode and the output electrode, in response to a first voltage, the boundary defining an input opening adjacent the input electrode and an output opening adjacent the output electrode, wherein the input electrode and the output electrode are aligned with one another along a first axis that extends directly between the input opening and the output opening.

2. The device of claim 1, further comprising a voltage source electrically coupled to the first confinement electrode, the voltage source, in use, supplies the first voltage to the first confinement electrode.

3. The device of claim 2, further comprising a reference electrode on the heterostructure, the voltage source having a first terminal electrically coupled to the first confinement electrode and a second terminal electrically coupled to the reference electrode.

4. The device of claim 3 wherein the first confinement electrode is disposed on a first side of the heterostructure, and the reference electrode is disposed on a second side of the heterostructure that is opposite the first side.

5. The device of claim 1 wherein the input and output electrodes are electrically coupled to the 2DEG layer through respective conductive vias which directly contact the 2DEG layer.

6. The device of claim 1, further comprising a control electrode on the heterostructure and adjacent to the first confinement electrode, the control electrode, in use, generates an electric field which deflects electrons in the 2DEG layer laterally toward the control electrode and away from the output electrode in response to an applied control voltage.

7. The device of claim 6, further comprising a second confinement electrode on the heterostructure and spaced apart from the first confinement electrode, wherein the control electrode is positioned between the first confinement electrode and the second confinement electrode.

8. The device of claim 6, further comprising a second and a third confinement electrode on the heterostructure and spaced apart from the first confinement electrode, the second and the third confinement electrodes having respective portions that are aligned with one another along a first direction, wherein the control electrode is positioned between and aligned with the second confinement electrode and the third confinement electrode along the first direction.

9. The device of claim 1, further comprising:
   a second confinement electrode on the heterostructure, the second confinement electrode being spaced apart from and substantially parallel to the first confinement electrode, the second confinement electrode, in use, generates second space charge regions which at least partially define the boundary of the ballistic device within the 2DEG layer; and
   a first control electrode on the heterostructure and extending in a direction transverse to the first and second confinement electrodes.

10. The device of claim 9, further comprising a second control electrode on the heterostructure and aligned with the first control electrode along the direction transverse to the first and second confinement electrodes,
   wherein the first and the second control electrodes are controllable by application of a control voltage to impede a current in the 2DEG layer between the input electrode and the output electrode.

11. The device of claim 1, further comprising:
a second confinement electrode on the heterostructure, the second confinement electrode being spaced apart from and substantially parallel to the first confinement electrode, the second confinement electrode, in use, generates second space charge regions which at least partially define the boundary of the ballistic device within the 2DEG layer; and
first and second control electrodes that are spaced apart from one another and symmetric with respect to one another,
wherein the first and second control electrodes, in use, impede a current flow in the 2DEG layer along a first direction between the input electrode and the output electrode and permit a current flow in the 2DEG layer along a second direction that is opposite the first direction in response to an applied control voltage.

12. The device of claim 1 wherein the ballistic device is selectively operable as at last one of: a ballistic resistor, a ballistic diode, a variable characteristic diode, a reversible diode, a multiplexer/demultiplexer, a deviator, a switch, a transistor, a half-wave bridge rectifier, or a full-wave bridge rectifier.

13. The device of claim 1 wherein a surface of the second semiconductor layer of the heterostructure is inclined with respect to the 2DEG layer, and the first confinement electrode is positioned on the inclined surface of the second semiconductor layer.

14. A device, comprising:
a heterostructure including a first semiconductor layer, a second semiconductor layer on the first semiconductor layer, and a two-dimensional electrode gas (2DEG) layer between the first and second semiconductor layers;
a ballistic device on the heterostructure, the ballistic device including:
an input electrode electrically coupled to the 2DEG layer;
an output electrode electrically coupled to the 2DEG layer; and
a confinement electrode on the heterostructure, the confinement electrode, in use, generates space charge regions which at least partially define a boundary of the ballistic device within the 2DEG layer between the input electrode and the output electrode in response to a confinement voltage; and
a confinement voltage supply circuit electrically coupled to the confinement electrode, the confinement voltage supply circuit, in use, generates the confinement voltage, the confinement voltage supply circuit including:
a test ballistic device, the test ballistic device including:
first and second electrodes on the heterostructure; and
a reference electrode on the heterostructure and positioned between the first and second electrodes;
a current mirror including a current sensor and a current generator, the current sensor electrically coupled to the second electrode of the test ballistic device;
an integrator having a first input coupled to the current generator, a second input coupled to an electrical ground, and an output;
a gain stage electrically coupled between the output of the integrator and the confinement electrode of the test ballistic device; and a reset switch electrically coupled between the first input and the output of the integrator,
wherein the confinement voltage supply circuit generates the confinement voltage based on a current between the first and second electrodes of the test ballistic device in response to a fixed voltage applied to the first electrode.

15. An integrated circuit, comprising:
a ballistic chip, including:
a heterostructure having a first semiconductor layer, a second semiconductor layer on the first semiconductor layer, and a two-dimensional electrode gas (2DEG) layer between the first and second semiconductor layers; and
an electrode layer on the heterostructure, the electrode layer including a plurality of confinement electrodes configured to define ballistic boundaries within the 2DEG layer for a plurality of ballistic devices in response to application of a confinement voltage; and
a semiconductor chip separate from the ballistic chip and physically and electrically coupled to the ballistic chip, the semiconductor chip configured to control a configuration of the plurality of ballistic devices in the ballistic chip.

16. The integrated circuit of claim 15,
wherein the semiconductor chip includes:
a semiconductor substrate; and
a plurality of semiconductor devices formed on or in the semiconductor substrate,
wherein the semiconductor devices, in use, control the configuration of the plurality of ballistic devices in the ballistic chip.

17. The integrated circuit of claim 16, further comprising:
a non-volatile memory communicatively coupled to the plurality of semiconductor devices, the non-volatile memory storing configuration parameters for the plurality of ballistic devices, wherein the semiconductor devices, in use, control the configuration of the plurality of ballistic devices in the ballistic chip based on the configuration parameters stored in the non-volatile memory.

18. The integrated circuit of claim 17 wherein the non-volatile memory comprises phase change memory.

19. The integrated circuit of claim 15 wherein the plurality of confinement electrodes in the electrode layer have a substantially same shape, and the plurality of confinement electrodes are arranged in an array having a plurality of rows and a plurality of columns of the confinement electrodes, each of the confinement electrodes being independently controllable by selective application of the confinement voltage.

20. An electrically confined ballistic device, comprising:
a heterostructure including:
a first semiconductor layer,
a second semiconductor layer on the first semiconductor layer, and
a two-dimensional electrode gas (2DEG) layer between the first and second semiconductor layers;
an input electrode electrically coupled to the 2DEG layer;
an output electrode electrically coupled to the 2DEG layer, the output electrode being spaced apart from the input electrode along a first direction;
at least one confinement electrode on the heterostructure, the at least one confinement electrode, in use, generates first space charge regions, which at least partially define a boundary of the ballistic device in a conduction channel within the 2DEG layer between the input electrode and the output electrode, in response to a first voltage; and first and second control electrodes, separate and different from the at least one confinement electrode, extending into the heterostructure from a surface of the heterostructure, the first and second control electrodes having upper surfaces that are inclined with respect to the surface of the heterostructure, the first and second control electrodes being spaced apart from one another along a second direction that is transverse to the first direction.

21. The electrically confined ballistic device of claim 20 wherein the first and second control electrodes are V-shaped or U-shaped electrodes.

* * * * *